United States Patent [19]
Ito et al.

[11] Patent Number: 6,069,579
[45] Date of Patent: May 30, 2000

[54] FOLDING TYPE A/D CONVERTER AND FOLDING TYPE A/D CONVERTER CIRCUIT

[75] Inventors: Masao Ito; Takeshi Shigenobu; Toshio Kumamoto; Takahiro Miki; Hiroshi Komurasaki, all of Tokyo, Japan

[73] Assignee: Mitsubishi Denki Kabushiki Kaisha, Tokyo, Japan

[21] Appl. No.: 09/131,238

[22] Filed: Aug. 7, 1998

[30] Foreign Application Priority Data

Feb. 27, 1998 [JP] Japan .................................. 10-047644

[51] Int. Cl.[7] ..................................................... H03M 1/12
[52] U.S. Cl. ............................................ 341/156; 341/155
[58] Field of Search ................................... 341/159, 156, 341/161, 155, 144

[56] References Cited

U.S. PATENT DOCUMENTS

| | | | |
|---|---|---|---|
| 5,392,045 | 2/1995 | Yee ......................................... | 341/156 |
| 5,489,904 | 2/1996 | Hadidi ..................................... | 341/156 |
| 5,539,406 | 7/1996 | Kouno et al. ............................ | 341/155 |
| 5,629,700 | 5/1997 | Kumamoto et al. .................... | 341/161 |
| 5,682,163 | 10/1997 | Hsu ........................................ | 341/156 |
| 5,841,389 | 11/1998 | Kinugasa et al. ....................... | 341/159 |

OTHER PUBLICATIONS

Shiro Hosotani, et al., "An 8–BIT 20–MS/s CMOS A/D Converter with 50–mW Power Consumption", IEEE Journal of Solid–State Circuits, vol. 25, No. 1, Feb. 1990, pp. 167–172.

Rudy J. Van De Plassche, "AN 8–BIT 100–MHZ Full–Nyquist Analog–to–Digital Converter", IEEE Journal of Solid–State Circuits, vol. 23, No. 6, Dec. 1988, pp. 1334–1344.

Primary Examiner—Michael Tokar
Assistant Examiner—Peguy JeanPierre
Attorney, Agent, or Firm—Oblon, Spivak, McClelland, Maier & Neustadt, P.C.

[57] ABSTRACT

An A/D converter simplifies its circuit configuration without deteriorating accuracy in A/D conversion. A circuit is formed of a folding and interpolation type. A gain-variable pre-amplifier group 11 amplifies each of reference voltages Vref1 to VrefN and an analog input voltage Vin, to output the result to a folding amplifier group 12, while a gain-variable pre-amplifier group 21 amplifies each of reference voltages Vrr1 to VrrJ and the analog input voltage Vin, to output the result to a comparator group 24. Each of pre-amplifiers constituting the gain-variable pre-amplifier groups 11 and 21 has an amplification factor that varies in upper and lower comparison periods according to a clock control signal Φcnt.

18 Claims, 34 Drawing Sheets

F I G. 1 3
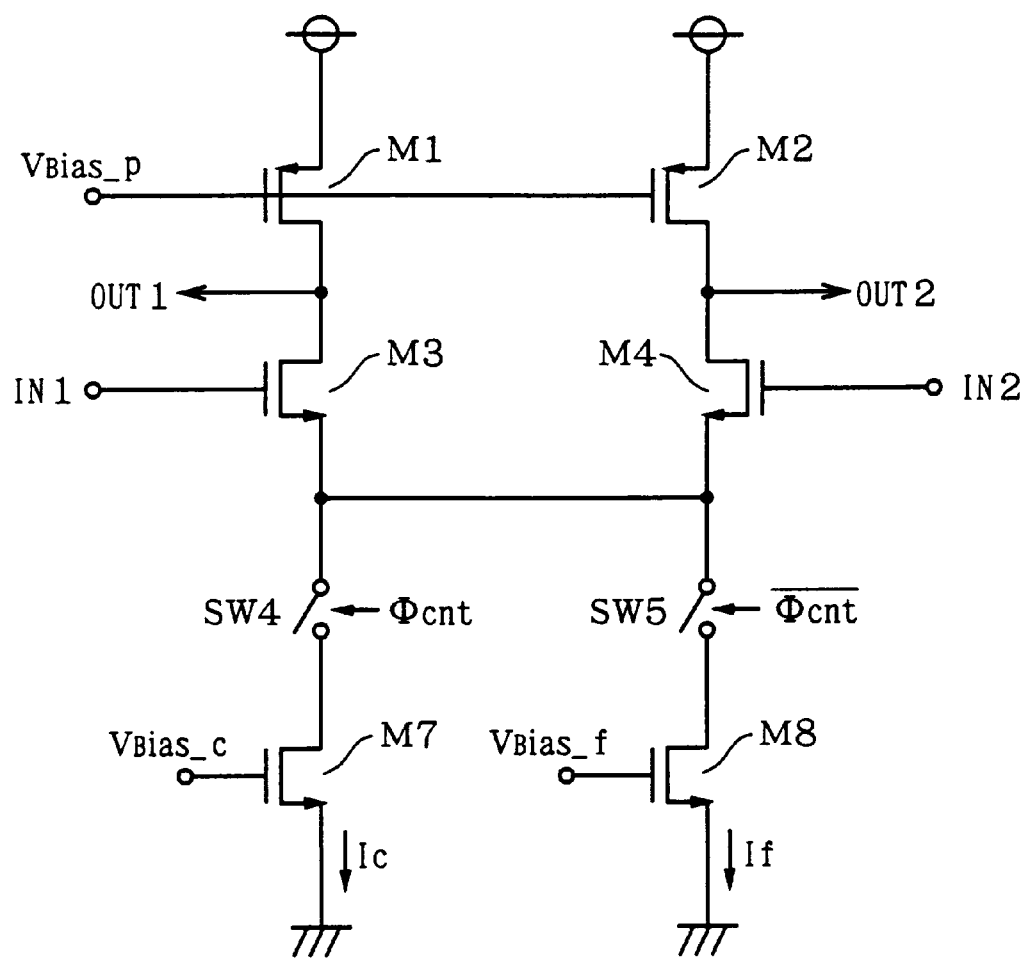

PRIOR ART  FIG. 20
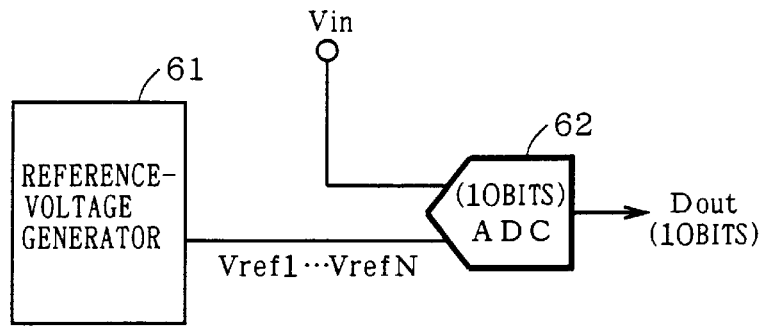
PRIOR ART  FIG. 21
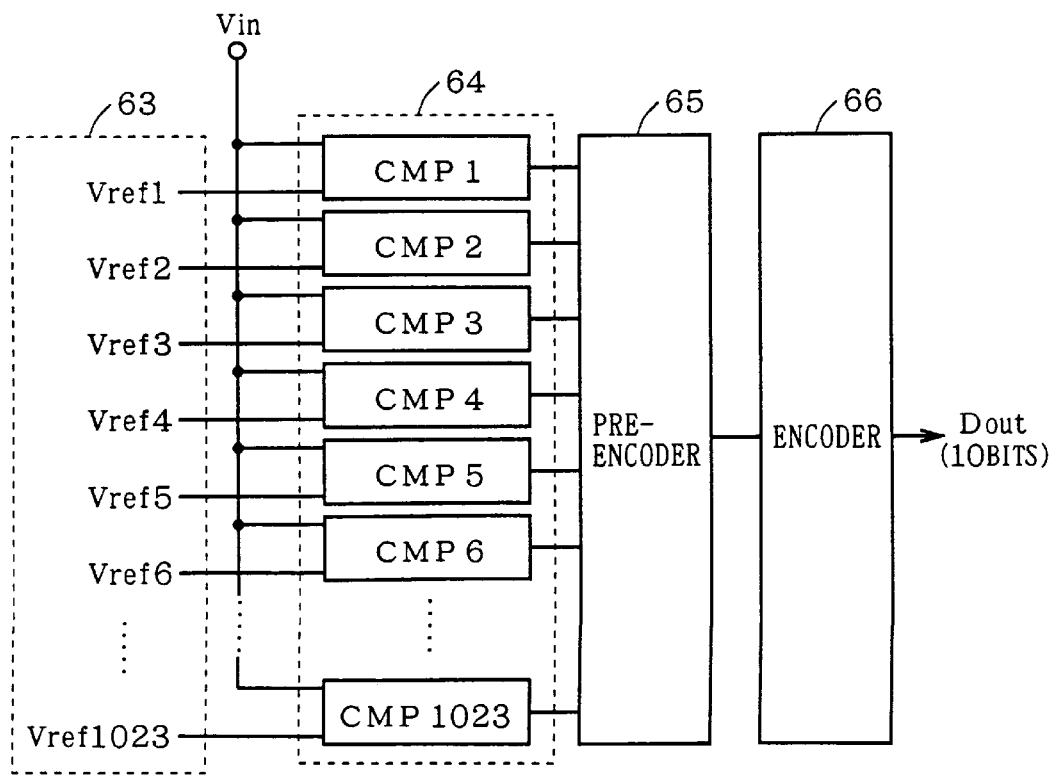

FOLDING TYPE A/D CONVERTER AND FOLDING TYPE A/D CONVERTER CIRCUIT

BACKGROUND OF THE INVENTION

1. Field of the Invention

The present invention relates to an A/D converter for converting a signal from analog to digital (hereinafter referred to as an "A/D conversion"), and an A/D-conversion circuit using the A/D converter as a sub-A/D converter.

2. Description of the Background Art

Of converters for converting an analog signal into a digital signal (hereinafter referred to as "A/D converters"), a sub-ranging type A/D converter makes an A/D conversion in two stages, upper and lower. The following description gives first an A/D converter of other architectures, next a difference between the other architectures and the sub-ranging type architecture, and then the advantages and the disadvantages of the sub-ranging type architecture.

First, a flash type A/D converter is mentioned as a basic A/D converter. FIG. 20 gives a rough illustration of the flash type A/D converter. As shown in FIG. 20, receiving reference voltages Vref1 to VrefN supplied from a reference-voltage generator 61 and an analog input voltage Vin, an A/D converter (ADC) 62 with 10-bit resolution outputs a digital output voltage Dout on the basis of comparison results between the analog input voltage Vin and the reference voltages Vref1 to VrefN.

FIG. 21 is a block diagram of an internal structure of the A/D converter 62 with 10-bit resolution. As shown in FIG. 21, the A/D converter 62 consists of a comparator group 64, a pre-encoder 65, and an encoder 66. For illustrating the operation of the A/D converter 62, the A/D converter 62 with 3-bit resolution is shown in FIG. 22.

A reference-voltage group 63 consisting of reference voltages Vref1 to Vref1023, is generated by the reference-voltage generator (not shown in FIG. 21). In the A/D converter with 3-bit resolution, as shown in FIG. 22, a reference-voltage generator 59 generates reference voltages Vref1 to Vref7 by resistance divisions of eight resistances R59 provided in series between an upper voltage VRT and a lower voltage VRB.

The comparator group 64 consists of 1023 comparators CMP1 to CMP1023, and receives the analog input voltage Vin and the reference voltage group 63 consisting of the reference voltages Vref1 to Vref1023. At this time, the comparator CMPi (i=1 to 1023) receives the analog input voltage Vin and the reference voltage Vrefi, and outputs the comparison result between those voltages to the pre-encoder 65. In the A/D converter with 3-bit resolution shown in FIG. 22, the comparison results of the comparators CMP1 to CMP7 on the basis of the analog input voltage Vin are as shown in Table 1.

TABLE 1

| Condition of Vin | Comparison Result of Comparator | | | | | | | Pre-Encode Signal | | | | | | | | Dout | | |
|---|---|---|---|---|---|---|---|---|---|---|---|---|---|---|---|---|---|---|
| | CMP 1 | CMP 2 | CMP 3 | CMP 4 | CMP 5 | CMP 6 | CMP 7 | PE 0 | PE 1 | PE 2 | PE 3 | PE 4 | PE 5 | PE 6 | PE 7 | | | |
| Vref1 ≦ Vin | H | H | H | H | H | H | H | H | L | L | L | L | L | L | L | 1 | 1 | 1 |
| Vref2 ≦ Vin < Vref1 | L | H | H | H | H | H | H | L | H | L | L | L | L | L | L | 1 | 1 | 0 |
| Vref3 ≦ Vin < Vref2 | L | L | H | H | H | H | H | L | L | H | L | L | L | L | L | 1 | 0 | 1 |
| Vref4 ≦ Vin < Vref3 | L | L | L | H | H | H | H | L | L | L | H | L | L | L | L | 1 | 0 | 0 |
| Vref5 ≦ Vin < Vref4 | L | L | L | L | H | H | H | L | L | L | L | H | L | L | L | 0 | 1 | 1 |
| Vref6 ≦ Vin < Vref5 | L | L | L | L | L | H | H | L | L | L | L | L | H | L | L | 0 | 1 | 0 |
| Vref7 ≦ Vin < Vref5 | L | L | L | L | L | L | H | L | L | L | L | L | L | H | L | 0 | 0 | 1 |
| Vin < Vref7 | L | L | L | L | L | L | L | L | L | L | L | L | L | L | H | 0 | 0 | 0 |

The pre-encoder 65 pre-encodes the comparison results of the comparator group 64, and outputs pre-encode signals to the encoder 66. In the A/D converter with 3-bit resolution, as shown in FIG. 22, eight bits of pre-encode signals PE0 to PE7 are outputted. At this time, the pre-encode signals PE0 to PE7 on the basis of the comparison results of the comparators CMP1 to CMP7 are as shown in Table 1.

FIG. 23 is a circuit diagram of an internal structure of the pre-encoder 65 in the A/D converter with 3-bit resolution. As shown in FIG. 23, inverters G21 to G27 receive the comparison results RCMP1 to RCMP7 of the comparators CMP1 to CMP7, respectively.

An AND gate G10 is connected at its one input to a power source VDD, and at its other input receives the comparison result RCMP1. AND gates G11 to G16 receive output signals of the inverters G21 to G26 at one of their inputs, and receives the comparison results RCMP2 to RCMP7 at their other inputs, respectively. An AND gate G17 receives an output signal of the inverter G27 at its one input, and is connected at its other input to a power source VDD. The outputs of the AND gates G10 to G17 result in the pre-encode signals PE0 to PE7, respectively.

Returning to FIG. 21, the encoder 66 encodes the pre-encode signals to output a 10-bit digital output voltage Dout. In the A/D converter with 3-bit resolution, as shown in FIG. 22, a 3-bit digital output voltage Dout is outputted. At this time, the digital output voltage Dout on the basis of the pre-encode signals PE0 to PE7 is as shown in Table 1.

In this fashion, using ($2^i-1$) reference voltages where i is a bit count of resolution (1023 reference voltages for 10-bit resolution in the case of FIGS. 20 and 21), the flash type A/D converter detects a voltage level of the analog output voltage and outputs a digital code that depends on the voltage level.

The flash type A/D converter with 10-bit resolution as shown in FIG. 21 requires 1023 comparators for making a voltage-level comparison between the analog input voltage Vin and each of the reference voltages Vrefi (i=1 to 1023), which offers drawbacks of increasing layout area and power consumption. Since the number of comparators is increased at the ratio of ($2^i-1$) with increasing resolution as shown in Table 2, the flash type architecture is not suitable for a high-resolution A/D converter.

TABLE 2

| Resolution [Bit] of Flash Type A/D Converter | Minimum Number of Comparators |
|---|---|
| 4 | 15 |
| 5 | 31 |
| 6 | 63 |
| 7 | 127 |
| 8 | 255 |
| 9 | 511 |
| 10 | 1023 |
| 11 | 2047 |
| 12 | 4095 |

Next, a folding type A/D converter is mentioned as another example of the other architectures.

FIG. 24 is a block diagram of a basic structure of the folding type A/D converter with 4-bit resolution. In FIG. 24, a reference-voltage generator 210 generates fifteen voltages by resistance divisions of sixteen resistances R210 provided between the upper voltage VRT and the lower voltage VRB, and outputs the eight least significant bits out of the fifteen voltages as reference voltages Vref0 to Vref7, to a comparator group 174.

A folding circuit 82 performs analog processing of output characteristics as represented by a solid line L1 in FIG. 25 for the analog input voltage Vin on the basis of the reference voltage Vref0, and outputs a conversion voltage EVin to the comparator group 174.

Each comparator CMPDi (i=0 to 7) in the comparator group 174 compares the reference voltage Vrefi and the conversion voltage Evin to output its comparison result. An pre-encoder 175 performs the same processing as the pre-encoder 65 in FIG. 22 on the basis of the comparison results of the comparator group 174, and outputs pre-encode signals PE0 to PE7.

An encoder 176 encodes the pre-encode signals PE0 to PE7 to output the three least significant bits of the digital output voltage Dout.

A comparator CMPD1 in the comparator group 184 compares the analog input voltage Vin and a reference voltage Vrr1 (=Vref0) to output its comparison result. An pre-encoder 185 performs the same processing as the pre-encoder 65 in FIG. 22 on the basis of the comparison result of the comparator group 184, and outputs a pre-encode signal.

An error correcting circuit 187 corrects an error of the pre-encode signal on the basis of a control signal from the encoder 176, and outputs a corrected pre-encode signal. An encoder 186 encodes the corrected pre-encode signal to output the most significant bit of the digital output voltage Dout.

In the flash type A/D converter, the comparator group needs to compare the whole range (including ranges A and B in FIG. 25) of the analog input voltage Vin using the plurality of reference voltages Vref. Thus, to achieve 4-bit resolution, $2^4-1=15$ comparators are required in the comparator group as previously described.

On the other hand, in the folding type A/D converter, whichever range A or B the analog input voltage Vin lies in, the conversion voltage EVin varies only within a range C (=range A=range B) as shown in FIG. 25.

This allows the comparator group 174 to have comparators only for the range C, that is, only 8 comparators as shown in FIG. 24.

However, in order to determine which range A or B the analog input voltage Vin lies in, the folding type A/D converter requires a second comparator group 184 which requires another comparator CMPD1. As a result, the folding type A/D converter requires 9 comparators in total.

When VrefY≦Vin<VrefX, for example, where Vin is the analog input voltage, and VrefX and VrefY are voltages at nodes X and Y of the reference-voltage generator 210 respectively, the output of the comparator CMPD1 in the comparator group 184 becomes "H", and thus the most significant bit of the digital output voltage Dout from the encoder 186 becomes "1".

At the same time, through the analog processing, the folding circuit 82 outputs the conversion voltage Evin within a range D shown in FIG. 25, that is, in the range of Vref2≦Evin<Vref1. Thus, in the comparator group 174, the outputs of the comparators CMP0 and CMP1 become "L", and the outputs of the comparators CMP2 to CMP7 becomes "H".

Then, on the basis of the comparison results of the comparator group 174, the pre-encoder 175 outputs an "H" pre-encode signal PE2 and "L" pre-encode signals PE0, PE1 and PE3 to PE7. Accordingly, the 3 least significant bits of the digital output voltage from the encoder 176 becomes "110", which results in the digital output voltage Dout of "1110" associated with the most significant bit previously described.

The comparison result of the comparator CMPD0 in the comparator 174 is used for error correction. Namely, the error correcting circuit 187 compares the comparison result of the comparator CMPD0 from the encoder 176 with the pre-encode signal (the comparison result of the comparator CMPD1 in the comparator group 184) from the pre-encoder 185. When the results do not agree with each other, the correcting circuit outputs the comparison result of the comparator CMPD0, as a corrected pre-encode signal, in preference to the comparison result of the comparator CMPD1, by which an error of the pre-encode signal from the pre-encoder 185 is corrected.

In this fashion, as compared with the flash type A/D converter, the folding type A/D converter has the advantage of reducing the circuit scale (the number of comparators) without reducing operating speed.

The aforementioned basic folding type A/D converter, however, has drawbacks of deteriorating accuracy and performance in high-speed operation. Namely, increased operating speed deteriorates accuracy of input and output characteristics of the folding circuit 82 shown in FIG. 28, in which case variations of the conversion circuit Evin for the analog input voltage Vin become as represented by a broken line L2 in FIG. 25, deviating off the line L1 as closer to the top and the bottom ends of the range C.

The cause of this deterioration of the input and output characteristics of the folding circuit 82 lies in that a parasitic element of the folding circuit 82 itself, such as parasitic capacitance and parasitic resistance, functions as a filter impervious to a high-frequency signal so that a sharp change of the analog input voltage Vin is smoothed.

One of recently used measures for this is to modify the structure of the folding circuit 82 to provide a voltage VRTd higher than the upper voltage VTR and a voltage VRBd lower than the lower voltage VRB to a reference-voltage generator 211 as shown in FIG. 26. In this case, the reference-voltage generator 211 outputs 15 voltages generated by resistance divisions of 16 resistances R210 provided between the upper voltage VRT and the lower voltage VRB, as reference voltages Vref0 to Vref14.

The reference-voltage generator 211 further outputs the upper voltage VRT as a reference voltage VrefA1, three voltages generated by resistance divisions of four resistances R210 provided between the voltage VRTd and the upper voltage as reference voltages VrefA2 to VrefA4, and the voltage VRTd as a reference voltage VrefA5.

Furthermore, the reference-voltage generator 211 outputs the lower voltage VRB as a reference voltage Vref15, two voltages generated by resistance divisions of three resistances R210 provided between the lower voltage VRB and the voltage VRBd as reference voltages VrefB1 and VrefB2, and the voltage VRBd as a reference voltage VrefB3.

A folding amplifier group 172 performs analog processing of input and output characteristics for the analog input voltage Vin as shown in FIG. 27 on the basis of the 24 reference voltages B1 to B3, Vref0 to Vref15, and VrefA1 to VrefA5, and outputs eight conversion voltages FVin0 to FVin 7.

In generation of the conversion voltage FVin7, for example, the folding amplifier group 172 comprises, as shown in FIG. 28, a first folding amplifier FA11 for differentially amplifying the reference voltage Vref15 (=VRB) and the analog input voltage Vin as its first and second inputs respectively, a second folding amplifier FA12 for differentially amplifying the analog input voltage Vin and the reference voltage Vref7 as its first and second inputs respectively, and a third folding amplifier FA13 for differentially amplifying the reference voltage VrefA1 and the analog input voltage Vin as its first and second inputs respectively. Then, a composite output of the first to third folding amplifiers FA11 to FA13 results in the conversion voltage FVin 7. The other conversion voltages FVin 0 to FVin 6 can be obtained in the same way from the composite outputs of the respective three folding amplifiers.

Comparators CMPD0 to CMPD7 in a comparator group 174 compares each of the conversion voltages FVin0 to FVin7 with 0 V, and outputs its comparison results to a pre-encoder 175. The other components are the same as those in the basic structure of the folding type A/D converter shown in FIG. 24.

In the structure shown in FIG. 26, the comparators CMPD0 to CMPD7 in the comparator group 174 obtain comparison results between the conversion voltages FVin0 to FVin7 and 0 V. This avoids deterioration in accuracy at the top and the bottom edges of the conversion voltages FVin0 to FVin7, thereby preventing deterioration in performance in high-speed operation.

The structure shown in FIG. 26, however, increases the number of folding amplifiers in the folding amplifier group 172 because, as previously described, three folding amplifiers are required for each comparator (conversion voltage FVin) in ranges A and B and in redundancy ranges E and F for error correction shown in FIG. 27.

Thus, the total number N of folding amplifiers is obtained by adding two to "the number J of comparators CMPD in the comparator group 184 for the most significant bits" and multiplying the answer by "the number M of comparators CMPD in the comparator group 74 for the least significant bits". Namely, N=(J+2)×M. In the case of FIG. 26, for example, since J=1 and M=8, (1+2)×8=24 folding amplifiers are required.

One folding amplifier is basically constituted of a differential amplifier and thus smaller in circuit scale than one comparator in the flash type A/D converter. Thus, the converter in FIG. 26 with 24 folding amplifiers and 9 comparators may be formed on the same circuit scale or smaller as or than the flash type A/D converter with 15 comparators. However, a sharp reduction in circuit scale cannot be expected.

To resolve the aforementioned drawbacks, constituted by using an interpolation method is a folding and interpolation type A/D converter.

FIG. 29 is a block diagram of a basic structure of the folding and interpolation type A/D converter. As shown in FIG. 29, a voltage VRTD higher than the upper voltage VRT and a voltage VRBd lower than the lower voltage VRB are further provided in a reference-voltage generator 211. The reference-voltage generator 211 outputs six reference voltages VrefA5 (=VRTd), VrefA1(=VRT), Verf3, Vref7, Vref11, and Vref15 (=VRB) at intervals of four voltages, out of 20 voltages generated by resistance divisions of 20 resistances R210 provided between the voltage VRTd and the lower voltage VRB.

A folding amplifier group 72 performs analog processing of input and output characteristics, as shown in FIG. 30, for the analog input voltage Vin on the basis of the six reference voltages VrefA5, VrefA1, Verf3, Vref7, Vref11 and Vref15, and outputs conversion voltages GVin3 and GVin7 and a reverse conversion voltage $\overline{GVin7}$ which are to be reference conversion voltages.

In generation of the conversion voltage GVin7, for example, as shown in FIG. 31, the folding amplifier group 72 comprises a first folding amplifier FA21 for differentially amplifying the reference voltage Vref15 (=VRB) and the analog input voltage Vin as its first and second inputs respectively, a second folding amplifier FA22 for differentially amplifying the analog input voltage Vin and the reference voltage Vref7 as its first and second inputs respectively, and a third folding amplifier FA23 for differentially amplifying the reference voltage VrefA1 (=VRT) and the analog input voltage Vin as its first and second inputs respectively. A composite output of the first to third folding amplifiers FA21 to FA23 results in the conversion voltage GVin 7.

The conversion voltage GVin7 is complementary to the reverse conversion voltage GVin7. Since the folding amplifiers have a circuit configuration of differential amplifiers, the reverse conversion voltage $\overline{GVin7}$ can be obtained from a composite signal of the second outputs of the first to third folding amplifiers FA21 to FA23, as shown in FIG. 31, at the same time the conversion voltage Gvin7 is obtained from the composite signal of the first outputs thereof.

An interpolation circuit 73 performs interpolation processing on the basis of the conversion voltages GVin3, GVin7 and the reverse conversion voltage $\overline{GVin7}$ which are to be reference conversion voltages, to output interpolation conversion voltages HVin0 to HVin7 to a comparator group 74.

FIG. 32 is a circuit diagram of an internal structure of the interpolation circuit 73. As shown in FIG. 32, the interpolation circuit 73 consists of eight resistances R70 to R77 connected in series. The interpolation circuit 73 receives the reference conversion voltage $\overline{GVin7}$ at a first end of the resistance R70 (respective top ends of the resistances R70 to R77 in FIG. 32 is referred to as first ends and respective bottom ends thereof as second ends), the conversion voltage GVin3 between the resistances R73 and R74, and the conversion voltage GVin7 at a second end of the resistance R77.

Then, voltages obtained from respective second ends of the resistances R70 to R77 result in the interpolation conversion voltages HVin0 to HVin7. FIG. 33 is a graph of waveforms of the interpolation conversion voltages HVin0 to HVin7. In FIG. 33, the interpolation conversion voltages HVin0, HVin1, HVin2, HVin4, HVin5, and HVin6, indicated by broken lines, are signals generated by interpolation by the interpolation circuit 73.

In this fashion, the interpolation circuit 73 has a function of a four times interpolation to additionally generate intermediate signals by dividing respective potential differences between the reverse conversion voltage $\overline{GVin7}$ and the conversion voltage GVin3 and between the conversion voltages GVin3 and GVin7, into four voltages.

Comparators CMPD0 to CMPD7 in the comparator group 74 compares each of the interpolation conversion voltages HVin0 to HVin7 with 0 V, to output its comparison results to a pre-encoder 75.

The pre-encoder 75 performs the same processing as the pre-encoder 65 in FIG. 22 on the basis of the comparison results of the comparator group 74, and outputs pre-encode signals PE0 to PE7.

An encoder 76 encodes the pre-encode signals PE0 to PE7 to output the three least significant bits of a digital output voltage Dout.

A comparator CMPD1 in a comparator 84 compares the analog input voltage Vin and the reference voltage Vrr1 (=Vref7) to output its comparison result. A pre-encoder 85 performs the same processing as the pre-encoder 65 in FIG. 22 on the basis of the comparison result of the comparator group 84, and outputs a pre-encode signal.

An error correcting circuit 87 corrects an error of the pre-encode signal on the basis of a control signal from the encoder 76, and outputs a corrected pre-encode signal. An encoder 86 encodes the corrected pre-encode signal to output the most significant bit of the digital output voltage Dout.

Thus, the total number N of folding amplifiers is obtained by adding two to "the number J of comparators CMPD in the comparator group 84 for the most significant bit", multiplying the answer by "the number M of comparators CMPD in the comparator group 74 for the least significant bits", and dividing the answer by "multiples P of interpolation". Namely, N=(J+2)×M/P. In the case of FIG. 29, for example, since J=1, M=8, and P=4, (1+2)×8/4=6 folding amplifiers are required.

One folding amplifier is smaller in circuit scale than one comparator in the flash type A/D converter. Thus, the converter in FIG. 29 with 6 folding amplifiers and 9 comparators can sharply reduce the circuit scale as compared with the flash type A/D converter with 15 comparators.

FIG. 34 is a block diagram of a generalization of the folding and interpolation type A/D converter shown in FIG. 29.

As shown in FIG. 34, a reference voltage group 111 generated by a reference-voltage generator 110 consists of N (≧2) reference voltages Vref1 to VrefN. Those reference voltages Vref1 to VrefN are outputted to a folding amplifier group 72, and J (<N) voltages out of the reference voltages Vref1 to VrefN are outputted to a comparator group 84 as reference voltages Vrr1 to VrrJ.

In a block B1, the folding amplifier group 72, an interpolation circuit 73, a comparator group 74, a pre-encoder 75, and an encoder 76 perform the same processing as those indicated by the same reference numerals in FIG. 29.

In a block B2, the comparator group 84, a pre-encoder 85, an encoder 86, and an error correcting circuit 87 also perform the same processing as those indicated by the same reference numerals in FIG. 29.

FIG. 35 is a block diagram of another structure of the folding and interpolation type A/D converter. As shown in FIG. 35, after amplified in a pre-amplifier group 71, reference voltages Vref1 to VrefN in a reference voltage group 111 and the analog input voltage Vin are outputted to a folding amplifier group 72. Further, after amplified in a pre-amplifier group 81, J (<N) voltages Vrr1 to VrrJ extracted from the reference voltages Vref1 to VrefN, and the analog input voltage Vin, are outputted to a comparator group 84.

In a block B3, the folding amplifier 72, an interpolation circuit 73, a comparator group 74, a pre-encoder 75, and an encoder 76 perform the same processing as those indicated by the same reference numerals in FIG. 29.

In a block B4, the comparator group 84, a pre-encoder 85, an encoder 86, and an error correcting circuit 87 also perform the same processing as those indicated by the same reference numerals in FIG. 29.

In this fashion, the folding and interpolation type A/D converter divides its circuits into two blocks B1 and B2 (or B3 and B4) to make an A/D conversion. The converter makes a coarse A/D conversion by the circuits in the block B2 (or B4) to determine the most significant bit of the digital code, and makes a fine A/D conversion by the circuits in the block B1 (or B3) to determine the least significant bits of the digital code.

Although requiring an increase of folding amplifiers or pre-amplifiers as previously described, the folding and interpolation type architecture can sharply reduce the number of comparators as compared with the flash type A/D converter. However, the digital output code may be allotted in various ways to the most and the least significant bits, so that the numbers J and M of comparators in the respective circuits in the blocks B1 and B2 vary according to the allocation as shown in Table 3. Table 3 shows the numbers J, M and N for the converter with 10-bit resolution.

TABLE 3

| | | N | | |
| --- | --- | --- | --- | --- |
| J | M | Four Times Interpolation | Eight Times Interpolation | Sixteen times Interpolation |
| 0 | 1024 | 256 | 128 | 64 |
| 1 | 512 | 384 | 192 | 96 |
| 3 | 256 | 320 | 160 | 80 |
| 7 | 128 | 288 | 144 | 72 |
| 15 | 64 | 272 | 136 | 68 |
| 31 | 32 | 264 | 132 | 66 |
| 63 | 16 | 260 | 130 | 129 |
| 127 | 8 | 258 | 130 | 129 |

The number N of folding amplifiers (or pre-amplifiers) varies, as shown in Table 3, according to the structure of the interpolation circuits 73 shown in FIGS. 34 and 35. When J≧1, N=(J+2)×M/P.

When the interpolation circuit 73 generates fourfold output signals Vi0 to Vi3 (i=0, 1, 2, 3, . . . ) of an input signal Vi supplied from the folding amplifier group 72, by resistances Ri0 to Ri3 as shown in FIG. 36, the total number of comparators declines to its minimum, 63, when J=31 and M=32.

Further, in that case, the number N of amplifiers in the folding amplifier group equals 264, so that the total number of pre-amplifiers in the pre-amplifier groups 71 and 81 shown in FIG. 35 equals J+N=295. Accordingly, calculating by addition of the number of comparators and the number of folding amplifiers and pre-amplifiers, the number of element circuits corresponding to the amplifiers (which hereinafter may be referred to only as the number of element circuits) in the A/D converter equals 327 in the case of FIG. 34 and 622 in the case of FIG. 35. Sharply reducing the number of comparators as compared with the flash type A/D converter, the folding and interpolation type architecture can cut the number of element circuits to one third to one half. Further, since the folding amplifiers and the pre-amplifiers require smaller layout areas and lower power consumption than the comparators, the folding and interpolation type A/D converter actually requires only one fourth to one fifth of the area and power consumption of the flash type A/D converter.

Next, we will describe a sub-ranging type A/D converter. FIG. 37 is a block diagram of an overall structure of the sub-ranging type A/D converter with 10-bit resolution. A reference-voltage generator 91 outputs a reference voltage group consisting of 1023 reference voltages.

A sub-A/D converter 92 outputs its comparison results (5 bits) between the analog input voltage Vin and upper reference voltages Vrc1 to Vrc31 extracted at predetermined intervals from the 1023 reference voltages, to a selector 93 and to a delay circuit 95.

On the basis of the comparison result of the sub-A/D converter 92, the selector 93 outputs $2^{(5+a)}$ reference voltages in the range of comparison out of the 1023 reference voltages, as lower reference voltages Vrf1 to Vrf$\{2^{(5+a)}-1\}$.

A sub-A/D converter 94 outputs its (5+a)-bit comparison result between the lower reference voltages Vrf1 to Vrf$\{2^{(5+a)}-1\}$ and the analog input voltage Vin, to an error correcting circuit 96.

On the basis of the comparison results of the sub-A/D converter 92 obtained via the delay circuit 95 and the comparison results of the sub-A/D converter 94, the error correcting circuit 96 corrects an error of "a" bits to output a 10-bit digital output voltage Dout.

FIG. 38 is a block diagram of an internal structure of the sub-A/D converter 92. As shown in FIG. 38, the sub-A/D converter 92 consists of a comparator group 98, a pre-encoder 99, and an encoder 100.

Consisting of comparators CMP1 to CMP31, the comparator group 98 compares the analog input voltage Vin and each of the upper reference voltages Vrc1 to Vrc31 in the reference voltage group 97, and outputs its comparison results to the pre-encoder 99. At this time, the comparator CMPi (i=1 to 31) compares the upper reference voltage Vrci and the analog input voltage Vin, and outputs its comparison result.

On the basis of the 31-bit comparison result of the comparator 98, the pre-encoder 99 outputs pre-encode signals to an encoder 100. The encoder 100 then outputs a partial digital output voltage dout of the five most significant bits on the basis of the pre-encode signals.

The sub-A/D converter 94 has the same structure as the sub-A/D converter 92 but differs only in that its reference group 97 consists of the lower reference voltages Vrf1 to Vrf$\{2^{(5+a)}-1\}$, and its comparator group 98 consists of comparators CMP1 to CMP$\{2^{(5+a)}-1\}$.

Thus, the sub-A/D converter 94 outputs redundancy bits consisting of the five least significant bits and "a" bits for error correction. The redundancy bits are used to correct an error caused by a difference in conversion characteristics between the two sub-A/D converters 92 and 94.

The sub-ranging type A/D converter with such a structure makes one A/D conversion by execution of the following three operations in this order: sampling in a sampling period, upper comparison in an upper comparison period, and lower comparison in a lower comparison period.

During the sampling period, the sub-ranging A/D converter receives the analog input voltage Vin, and retains the most recent value of the analog signal Vin obtained in that period.

Next, in the upper comparison period, the sub-A/D converter 92 compares the retained analog input voltage Vin and each of the upper reference voltages Vrci (i=1 to 31) in voltage level, and outputs its comparison result. The comparison result results in a digital code of the five most significant bits of the analog input voltage Vin, that is outputted to the delay circuit 95.

Then, in the lower comparison period, the sub-A/D converter 94 compares the retained analog input voltage and each of the lower reference voltages Vrfj (j=1 to $\{2^{(5+a)}-1\}$) in voltage level, and outputs its comparison result. This comparison result includes the five least significant bits of the analog input voltage Vin and "a" redundancy bits for error correction.

The error correcting circuit 96 corrects an error of the digital code for the five most significant bits obtained from the delay circuit 95, using a signal of the "a" redundancy bits which is the comparison result of the sub-A/D converter 94, and then outputs its result with the digital code for the five least significant bits. This output results in the digital output voltage Dout (10-bit digital code).

Each of the sub-A/D converters 92 and 94 may be, as shown in FIG. 38, composed of the equivalent circuits to those in the flash type A/D converter. The number of comparators is, however, 32 in the sub-A/D type converter 92 with 5-bit resolution, and when a=1, 63 in the sub-A/D converter 94 with (5+a)-bit resolution, as shown in Table 2, which results in 94 comparators in total. Thus, the sub-ranging type A/D converter can sharply reduce its layout area and power consumption as compared with the flash type A/D converter.

Alternatively, each of the sub-A/D converters 92 and 94 in the A/D converter shown in FIG. 37 may have the same circuit configuration as the folding and interpolation type A/D converter shown in FIGS. 39 and 40. In FIG. 39, components 112 to 116 and 124 to 127 are the same as the components 72 to 76 and 84 to 87 shown in FIG. 34, respectively; and in FIG. 40, components 112 to 116, 121, and 124 to 127 are the same as the components 71 to 76, 81, and 84 to 87 shown in FIG. 35, respectively.

When the interpolation circuit 113 in the structure shown in FIG. 39 carries out a four times interpolation, the minimum number of comparators (J+M) and the number of folding amplifiers (N) in the sub-A/D converter 92 with 5-bit resolution equal 11 and 10, respectively, as shown in Table 4. On the other hand, when a=1, the minimum number of comparators and the number of folding amplifiers in the sub-A/D converter 94 with (5+a)-bit resolution equal 15 and 18, respectively, as shown in Table 4.

TABLE 4

| 5-bit Resolution | | | 6-bit Resolution | | |
|---|---|---|---|---|---|
| J | M | N in Four Times Interpolation | J | M | N in Four Times Interpolation |
| 0 | 32 | 8 | 0 | 64 | 16 |
| 1 | 16 | 12 | 1 | 32 | 24 |
| 3 | 8 | 10 | 3 | 16 | 20 |
|   |   |   | 7 | 8 | 18 |

Further, for the sub-A/D converters 92 and 94 of the folding and interpolation type in the sub-ranging type A/D converter, the minimum number of comparators (j+M) and the number of folding amplifiers (N) according to resolution are as shown in Table 5.

TABLE 5

| | Minimum Combination of Element Circuits | |
|---|---|---|
| Resolution [bits] of Sub-A/D Converter | Number of Folding Amplifiers | Number of Comparators |
| 4 | 6 | 9 |
| 5 | 10 | 11 |
| 6 | 18 | 15 |
| 7 | 34 | 23 |
| 8 | 68 | 31 |
| 9 | 132 | 47 |
| 10 | 264 | 63 |
| 11 | 520 | 95 |
| 12 | 1040 | 127 |

Further, with the circuit configuration shown in FIG. 40, the sub-A/D converters 92 and 94 have 13 and 25 pre-amplifiers, respectively. Thus, the application of the sub-A/D converters 92 and 94 with the circuit configuration shown in FIG. 39 to the sub-ranging type A/D converter with a=1 redundancy bit in FIG. 37 results in the total number of element circuits (the minimum number of comparators and folding amplifiers) of 54, while the application of the sub-A/D converters 92 and 94 with the circuit configuration shown in FIG. 40 results in the total number of 92.

In this fashion, the combination of the sub-ranging and the folding and interpolation architectures brings about a sharp reduction in the number of comparators, thereby achieving small layout area for A/D converters and low power consumption.

The use of this combination of architectures, however, requires that a gain of folding amplifiers or a multiplied value of gains of the folding amplifiers and the pre-amplifiers (hereinafter referred to as a "preliminary-treatment gain") be adjusted to obtain optimum voltage amplitude in analog signal processing at the folding amplifier group and the interpolation circuit in each of the sub-A/D converters 92 and 94.

Namely, too large preliminary-treatment gain may cause the output of the folding amplifier to overshoot its maximum or minimum value. This makes it difficult to obtain an analog value of intermediate level (interpolation conversion voltage HVin) through interpolation by the interpolation circuit 73 (113) which is a post-stage circuit of the folding amplifier group 72 (112). Since the interpolation conversion voltage HVin is significant as information, a problem has arisen that proper analog signal processing cannot be expected in the circuits after the interpolation circuit.

On the other hand, too small preliminary-treatment gain also causes insufficient amplification of the analog signal. This produces problems of deteriorating accuracy and preventing a proper A/D conversion in the following pre-encoder and comparator group that perform signal processing with a small analog value.

Since the range of the upper reference voltages Vrci (i=1, 2, . . . , f) used in the sub-A/D converter 92 for the five most significant bits is $2^{(5-a)}$ times the range of the lower reference voltages Vrfj (j=1, 2, . . . , $\{2^{(5+a)}-1\}$) used in the sub-A/D converter 94 for the (5+a) least significant bits, the value of the preliminary-treatment gain of the sub-A/D converter 94 has to be $2^{(5+a)}$ times that of the sub-A/D converter 92. Thus, in FIG. 37, when the preliminary-treatment gain of the sub-A/D converter 92 is A, the preliminary-treatment gain B of the sub-A/D converter 94 is written by: $B=A\times 2^{(5-a)}$.

Next, we will mention an unified sub-ranging type A/D converter that is similar to the A/D converter with a combination of the sub-ranging and the flash architectures in FIG. 37 but further reduces its layout area and power consumption.

FIG. 41 is a block diagram of an overall structure of an unified sub-ranging type A/D converter with 10-bit resolution. A reference-voltage generator 101 outputs 1023 reference voltages.

In the upper comparison period, a sub-A/D converter 102 compares the analog input voltage Vin and each of upper reference voltages Vrc1 to Vrc$\{2^{(5+a)}-1\}$ extracted at predetermined intervals from the 1023 reference voltages, and outputs its (5+a)-bit upper comparison result to a selector 103 and to a bus change-over switch 104.

On the basis of the upper comparison result of the sub-A/D converter 102 obtained in the upper comparison period, the selector 103 outputs lower reference voltages Vrf1 to Vrf$\{2^{(5+a)}-1\}$, out of the 1023 reference voltages, to the sub-A/D converter 102.

In the lower comparison period, the sub-A/D converter 102 compares the analog input voltage Vin and each of the lower reference voltages Vrf1 to Vrf$\{2^{(5+a)}-1\}$, and outputs its (5+a)-bit lower comparison result to the bus change-over switch 104.

The bus change-over switch 104, in the upper comparison period, outputs the upper comparison result of the sub-A/D converter 102 to a delay circuit 5, and in the lower comparison period, outputs the lower comparison result of the sub-A/D converter 102 to an error correcting circuit 6.

On the basis of the upper comparison result of the sub-A/D converter 102 obtained via the bus change-over switch 104 and the delay circuit 105, and the lower comparison result of the sub-A/D converter obtained via the bus change-over switch 104, the error correcting circuit 106 corrects an error of "a" bits to output a 10-bit digital output voltage Dout.

The unified sub-ranging type A/D converter makes a repetitive use of the sub-A/D converter with (5+a)-bit resolution to make an A/D conversion of the five most significant bits and the five least significant bits, where "a" is a redundancy bit for error correction.

We will now describe the operation of the unified sub-ranging type A/D converter shown in FIG. 41. Its basic operation is the same as that of the sub-ranging type A/D converter shown in FIG. 37. The unified sub-ranging type A/D converter makes one A/D conversion by execution of three operations in this order: sampling in the sampling period, upper comparison in the upper comparison period, and lower comparison in the lower comparison period.

During the sampling period, the A/D converter receives the analog input voltage Vin, and retains the most recent value obtained in that period.

Next, in the upper comparison period, the sub-A/D converter 102 compares the retained analog input voltage Vin and each of the upper reference voltage Vrci (i=1 to 31) in voltage level, and outputs its comparison result. At this time, the bus change-over switch 104 connects the output of the sub-A/D converter 102 to the delay circuit 105. The comparison result is a digital code including the five most significant bits and "a" redundancy bits. The redundancy bits are, however, ignored and only the five most significant bits are transmitted to the delay circuit 105 as the digital code.

Then, in the lower comparison period, the sub-A/D converter 102 compares the retained analog input voltage Vin and each of the lower reference voltages Vrfj (j=1 to $\{2^{(5+a)}-1\}$) in voltage level, and outputs its comparison result. At this time, the bus change-over switch 104 connects the output of the sub-A/D converter 102 directly to the error correcting circuit 106. This comparison result becomes the lower comparison results including the five least significant bits and "a" redundancy bits for error correction.

The error correcting circuit 106 corrects an error of the 5-bit upper comparison result obtained via the delay circuit 105, using a signal of the "a" redundancy bits of the lower comparison result obtained directly from the bus change-over switch 104. Then, the circuit outputs the corrected five most significant bits together with the five least significant bits of the lower comparison result, as the digital output voltage Dout. This digital output voltage Dout results in a 10-bit digital code.

Although the achievement of the aforementioned operation requires such an idea of comparator configurations as shown in FIG. 2 of a thesis "An 8-bit 20-MS/s CMOS A/D converter with 50-m W Power Consumption" by Shiro Hosotani et al which introduces a 3-input chopper type sub-A/D converter, the use of the unified sub-ranging type architecture reduces the number of element circuits to 63, that is, almost by half as compared with the sub-ranging type A/D converter in FIG. 37 which uses the sub-A/D converter in FIG. 38.

Further, with the number of redundancy bits "a" of not more than 1, the unified sub-ranging type A/D converter has an advantage of reducing the number of element circuits as compared with the sub-ranging type A/D converter in FIG. 37 which uses the sub-A/D converter shown in FIG. 39 or 40 with the combination of the sub-ranging and the folding and interpolation architectures.

So far, the structures of the conventional sub-ranging type A/D converter and the other types of A/D converters have been described.

Next, we will describe problems of the conventional A/D type converter. Many of the conventional A/D converters are individually used, and even in a system LSI, only one A/D converter is formed on a chip.

However, a recent system LSI, for example, used for TV signal processing requires an A/D converter for each of three signals R, G, and B. In that case, as shown in FIG. 42, at least three A/D converters 77 to 79 need to be provided on a chip 70 in the system LSI. In FIG. 42, the A/D converters 77 to 79 receives the signals R, G, and B via input terminals 67 to 69, respectively, and convert those signals from analog to digital to output them to a digital processing circuit 80 that performs predetermined digital processing.

Such a case where a plurality of A/D converters are mixed on one chip in the system LSI is recently increasing. Thus, an A/D converter having small area and achieving low power consumption has been required.

On the other hand, the A/D converter with the conventional architecture achieves its small area and low power consumption, only when individually used, by reducing the number of element circuits as previously described. Thus, where a plurality of A/D converters are formed on one chip in the system LSI, the problems of large occupied area and high power consumption have been unsolved.

To resolve the problems, further reduction in the number of element circuits is required in the A/D converter. For this, it will be effective to apply the folding and interpolation architecture as shown in FIGS. 39 and 40 to the sub-A/D converter in the unified sub-ranging type A/D converter in FIG. 41.

In the unified sub-ranging architecture, however, an A/D conversion is made in two stages (upper and lower) as previously described, using the same sub-A/D converter, so that the range of reference voltages differs in each A/D conversion. Application of the conventional folding and interpolation architecture to such a sub-A/D converter would make it difficult to obtain an optimum voltage amplitude in the analog signal processing which is performed at the folding amplifier group and at the interpolation circuit in each of the upper and the lower A/D conversions. Thus, this is not practical.

Namely, if the preliminary-treatment gain which is the gain of the folding amplifier or the multiplied value of gains of the pre-amplifier and the folding amplifier, is set at an optimum value for the range of reference voltages in the upper A/D conversion, a shortage of gains is caused in the lower A/D conversion, and the signal processing performed with a small analog value attains deterioration in accuracy. This prevents a proper A/D conversion. On the contrary, if the preliminary-treatment gain is set at an optimum value for the range of reference voltages in the lower A/D conversion, an excess of gains in the upper A/D conversion causes the amplitude of the analog signal to overshoot its maximum or minimum value. This makes it difficult to obtain an analog value of an intermediate level, thereby preventing a proper A/D conversion.

SUMMARY OF THE INVENTION

A first aspect of the present invention is directed to an A/D converter for converting an analog input voltage into digital form to output a digital output voltage, The A/D converter comprises: a first amplifier portion receiving and amplifying the analog input voltage and a plurality of reference voltages; an input-voltage conversion portion receiving the analog input voltage and the plurality of reference voltages which are amplified in the first amplifier portion, and converting the analog input voltage on the basis of the plurality of reference voltages to output a plurality of conversion voltages; a least-significant-bit data output portion outputting a first partial digital output voltage having a first bit count on the basis of a comparison result between each of the plurality of conversion voltages and a fixed value; a second amplifier portion receiving and amplifying the analog input voltage and a predetermined number of reference voltages extracted from the plurality of reference voltages; and a most-significant-bit data output portion outputting a second partial digital output voltage having a second bit count on the basis of a comparison result between each of the predetermined number of reference voltages and the analog input voltage which are amplified in the second amplifier portion. The digital output voltage consists of the second partial digital output voltage as an most-significant-bit group, and the first partial digital output voltage as a least-significant-bit group. Further, each of the first and the second amplifier portions has an amplification factor that varies according to a control signal.

Preferably, according to a second aspect of the present invention, in the A/D converter of the first aspect, the input-voltage conversion portion comprises: a reference-conversion-voltage output portion converting the analog input voltage on the basis of the plurality of reference voltages to output a predetermined number of reference conversion voltages; and an intermediate-voltage generating portion interpolating voltages between the predetermined number of reference conversion voltages, and generating intermediate voltages in predetermined multiples for each of the reference conversion voltages to output the plurality of conversion voltages.

Preferably, according to a third aspect of the present invention, in the A/D converter of the second aspect, the first amplifier portion includes a plurality of first differential amplifiers each receiving at its first input end a target voltage out of the analog input voltage and the plurality of reference voltages as a first differential input voltage, receiving at its second input end a fixed voltage, and outputting a voltage obtained by amplifying the first differential input voltage, from its first or second output end. Further, the second amplifier portion includes a plurality of second differential amplifiers each receiving at its first input end a target voltage out of the analog input voltage and the predetermined number of reference voltages as a second differential input voltage, receiving at its second input end a fixed voltage, and outputting a voltage obtained by amplifying the second differential input voltage, from its first or second output end. Each of the plurality of first and second differential amplifiers comprises: a first resistance component with its one end connected to a first power supply and its other end being the first output end, for supplying a first load current from the first power supply to the first output end; a second resistance component with its one end connected to the first power supply and its other end being the second output end, for supplying a second load current from the first power supply to the second output end, a first output control transistor with its first electrode connected to the first output end, and its control electrode being the first input end; a second output control transistor with its first electrode connected to the second output end, and its control electrode being the second input end; a constant-current supply portion connected at its one end to second electrodes of the first and the second output control transistors and at its other end to the second power supply, for supplying a constant current to the second power supply; and a switch portion whose conducting state varies according to the control signal, by which various kinds of circuit configurations each having a different amplification factor are achieved.

Preferably, according to a fourth aspect of the present invention, in the A/D converter of the third aspect, the switch portion includes a resistance-value selecting switch whose conducting state is controlled by the control signal, the switch portion differently setting respective resistance values of the first and the second resistance components according to its conducting state.

Preferably, according to a fifth aspect of the present invention, in the A/D converter of the fourth aspect, the first resistance component includes first and second partial resistance components provided in series between the first power supply and the first output end; the second resistance component includes third and fourth partial resistance components provided in series between the first power supply and the second output end; and the resistance-value selecting switch includes a switch inserted between a node between the first and the second partial resistance components, and a node between the third and the fourth partial resistance components. The switch is turned on or off according to the control signal.

Preferably, according to a sixth aspect of the present invention, in the A/D converter of the fourth aspect, the first resistance component includes first and second partial resistance components provided in series between the first power supply and the first output end; the second resistance component includes third and fourth partial resistance components provided in series between the first power supply and the second output end; and the resistance-value selecting switch includes a first partial switch provided corresponding to the second partial resistance component, and a second partial switch provided corresponding to the fourth partial resistance component. The first and second partial switch are turned on or off at the same time according to the control signal, and set the second and the fourth partial resistance components at different resistance values, respectively, according to their ON-OFF state.

Preferably, according to a seventh aspect of the present invention, in the A/D converter of the fourth aspect, the first resistance component includes first and second partial resistance components provided in series between the first power supply and the first output end; the second resistance component includes third and fourth partial resistance components provided in series between the first power supply and the second output end; and the resistance-value selecting switch includes first and second partial switches provided commonly for the first and the third partial resistance components. Either one of the first and the second partial switches are turned on and the other is turned off on the basis of the control signal. Further, the first and the second partial switches set the first and the third partial resistance components at different resistance values, respectively, according to their ON-OFF state.

Preferably, according to an eighth aspect of the present invention, the A/D converter of the third aspect further comprises: a transistor-connection resistance component inserted between the second electrodes of the first and the second output control transistors. The switch portion whose conducting state is controlled by the control signal, includes a switch differently setting the transistor-connection resistance component according to its conducting state.

Preferably, according to a ninth aspect of the present invention, in the A/D converter of the eighth aspect, the transistor-connection resistance component and the switch portion are integrally formed. The transistor-connection resistance component and the switch portion inlude a transistor for transistor-connection resistance connected at its first electrode to the second electrode of the first output control transistor and at its second electrode to the second electrode of the second output control transistor and receiving the control signal at its control electrode. Further, the on-state resistance value of the transistor varies according to the control signal.

Preferably, according to a tenth aspect of the present invention, in the A/D converter of the eighth aspect, the transistor-connection resistance component includes first and second partial transistor-connection resistance components each having a different resistance value; and the switch portion includes first and second partial switches each indicating validity or invalidity of the first and the second partial transistor-connection resistance components according to its ON-OFF state. Either one of the first and the second partial switches is turned on and the other is turned off on the basis of the control signal.

Preferably, according to an eleventh aspect of the present invention, in the A/D converter of the third aspect, the switch portion includes a constant-current selecting switch whose conducting state is controlled by a control signal, the constant-current selecting switch differently setting the amount of the constant current to be supplied from the constant-current supply portion according to its conducting state.

Preferably, according to a twelfth aspect of the present invention, in the A/D converter of the eleventh aspect, the constant-current supply portion includes a first partial constant-current supply portion supplying the constant current in a first current amount when selected, and a second partial constant-current supply Portion supplying the constant current in a second current amount different from the first current amount when selected; and the switch portion includes first and second partial switches each determining selection or non-selection of the first and the second partial constant-current supply portions according to its ON-OFF state. Either one of the first and the second partial switches is turned on and the other is turned off on the basis of the control signal.

Preferably, according to a thirteenth aspect of the present invention, in the A/D converter of the eleventh aspect, the first resistance component includes a common partial resistance component and a first partial resistance component provided in series, between the first power supply and the first output end; the second resistance component includes the common resistance component and a second partial resistance component provide in series between the first power supply and the second output end, the common partial resistance component having a larger resistance value than those of the first and the second partial resistance components; the constant-current supply portion includes a first partial constant-current supply portion supplying a current to the second power supply in a first current amount, and a second partial constant-current supply portion supplying a current to the second power supply in a second current amount, the first partial constant-current supply portion being directly connected at its one end to the second electrodes of the first and the second output control transistors; and the switch portion includes a first partial switch provided between the second electrodes of the first and second output control transistors and one end of the second partial constant-current supply portion, and a second partial switch provided between a node between the common partial resistance component and the first and the second partial resistance components, and one end of the second partial constant-current supply portion. Either one of the first and the second switches is turned on and the other is turned off on the basis of the control signal.

Preferably, according to a fourteenth aspect of the present invention, in the A/D converter of the eleventh aspect, the switch portion includes first and second partial switches provided corresponding to the constant-current supply portion. The first partial switch determines in its ON state that the amount of the constant current from the constant-current supply portion be a first current amount, while the second partial switch determining in its ON state that the amount of the constant current from the constant-current supply portion be a second current amount. Either one of the first and the second partial switches is turned on and the other is turned off on the basis of the control signal.

Preferably, according to a fifteenth aspect of the present invention, the A/D converter of the third aspect further comprises: a first auxiliary transistor connected in parallel with the first output control transistor; and a second auxiliary transistor connected in parallel with the second output control transistor. The switch portion includes a first partial switch controlling connections or non-connections between a control electrode of the first auxiliary transistor and the first input end and between a control electrode of the second auxiliary transistor and the second input end according to its ON-OFF state, while a second partial switch controlling connections or non-connections between each control electrode of the first and the second auxiliary transistors and a fixed control voltage according to its ON-OFF state. The fixed control voltage includes a voltage to turn off the first and the second auxiliary transistors with its application. Further, either one of the first and the second partial switches is turned on and the other is turned off on the basis of the control signal.

Preferably, according to a sixteenth aspect of the present invention, the A/D converter of the third aspect further comprises: a first auxiliary transistor connected at its first electrode to the first output end and at its control electrode to the first input end; a second auxiliary transistor connected at its first electrode to the second output end and at its control electrode to the second input end; a first parallel-connection resistance component connected at its one end to a second electrode of the first auxiliary transistor and at its other end to the second electrode of the first output control transistor; and a second parallel-connection resistance component connected at its one end to a second electrode of the second auxiliary transistor and at its other end to the second electrode of the second output control transistor. The switch portion includes first and second partial switches provided commonly for the first and the second parallel-connection resistance components. The first partial switch determines in its ON state that each resistance value of the first and the second parallel-connection resistance components be a first resistance value, while the second partial switch determines in its ON state that each resistance value of the first and the second parallel-connection resistance components be a second resistance value. Further, either one of the first and the second partial switches is turned on and the other is turned off on the basis of the control signal.

A seventeenth aspect of the present invention is directed to an A/D conversion circuit for converting an external analog input signal inputted from the outside into digital form to output an external digital output voltage to the outside. The A/D conversion circuit comprises: a reference-voltage supply portion outputting a first number of reference voltages selected at first voltage intervals in a first period, and in a second period, supplying a second number of reference voltages selected at second voltage intervals shorter than the first voltage intervals, on the basis of an A/D-conversion control signal; a sub-A/D converter converting the first number of reference voltages from analog to digital in the first period to output an upper partial digital output voltage as well as to output the A/D-conversion control signal related to a A/D-conversion result, and converting the second number of reference voltages from analog to digital in the second period to output a lower partial digital output voltage; and a digital-output-voltage output portion combining the upper and the lower partial digital output voltages to output the external digital output voltage. The sub-A/D converter comprises: a first amplifier portion receiving and amplifying the analog input voltage and a plurality of reference voltages; an input-voltage conversion portion receiving the analog input voltage and the plurality of reference voltages which are amplified in the first amplifier portion, and converting the analog input signal on the basis of the plurality of reference voltages to output a plurality of conversion voltages; a least-significant-bit data output portion outputting a first partial digital output voltage having a first bit count on the basis of a comparison result between each of the plurality of conversion voltages and a fixed value; a second amplifier portion receiving and amplifying the analog input voltage and a predetermined number of reference voltages extracted from the plurality of reference voltages; and a most-significant-bit data output portion outputting a second partial digital output voltage having a second bit count on the basis of a comparison result between the analog input voltage and each of the predetermined number of reference voltages which are amplified in the second amplifier portion. The digital output voltage consists of the second partial digital output voltage as a most-significant-bit group and the first partial digital output voltage as a least-significant-bit group. Each of the first and the second amplifier portions has an amplification factor that varies according to a control signal. In the first period, the sub-A/D converter receives the external analog input voltage and the first number of reference voltages as the analog input voltage and the plurality of reference voltages, respectively, while setting each amplification factor of the first and the second amplifier portions to be a first amplification factor according to the control signal, and outputs the digital output voltage as the upper partial digital output voltage. In the second period, the sub-A/D converter receives the external analog input voltage and the second number of reference voltages as the analog input voltage and the plurality of reference voltages, respectively, while setting each amplification factor of the first and the second amplifier portions to be a second amplification factor larger than the first amplification factor according to the control signal, and outputs the digital output voltage as the lower partial digital output voltage.

In the A/D converter according to the first aspect, each of the first and the second amplifier portions amplifying the analog input voltage and the plurality of reference voltages (including a predetermined number of reference voltages) has an amplification factor that varies according to the control signal. Thus, an optimum amplification factor is available for each voltage range to be converted from analog to digital, which results in an A/D conversion with high accuracy.

Further, the use of the first amplifier portion, the input voltage conversion portion, and the least-significant-bit data output portion to convert the least-significant-bit group from analog to digital, and the use of the second amplifier portion and the most-significant-bit data output portion to convert the most-significant-bit group from analog to digital, sharply reduce the number of comparators for making a comparison between two voltages as compared with the configuration where the analog input voltage is converted into digital in a lump. This achieves simplification of the circuit configuration and low power consumption.

In the A/D converter according to the second aspect, the input-voltage conversion portion comprises the reference-conversion-voltage output portion that converts the analog input voltage on the basis of the plurality of reference voltages to output a predetermined number of reference conversion voltages, and the intermediate-voltage generating portion that interpolates voltages between the predetermined number of reference conversion voltages and generates the intermediate voltages in predetermined multiples for each of said reference conversion voltages to output the plurality of conversion voltages.

Thus, the predetermined number of reference conversion voltages to be outputted from the reference-conversion-voltage output portion is reduced by a factor of predetermined multiples as compared with the circuit configuration with no intermediate-voltage generating portion. This achieves simplification of the circuit configuration of the reference-conversion-voltage output portion, thereby achieving substantial simplification of the circuit configuration of the A/D converter as a whole.

In the A/D converter according to the third aspect, the first amplifier portion includes the plurality of first amplifiers and the second amplifier portion includes the plurality of second amplifiers. Each of the plurality of first and second amplifiers comprises the switch portion whose conducting state varies according to the control signal, by which various kinds of circuit configurations each having a different amplification factor are achieved.

Thus, the application of the control signal to the switch portion allows each amplification factor of the plurality of first and second amplifiers to be set at a desirable value.

In the A/D converter according to the fourth aspect, the resistance-value selecting switch portion differently sets both resistance values of the first and the second resistance components according to its conducting state, by which each amplification factor of the plurality of first and second differential amplifiers can be varied.

Further, since the control signal does not change the amount of constant current supplied from the constant-current supply portion, when the same voltage is applied to the first and the second input ends, the voltages at the first and the second output ends can be set at the same value.

In the A/D converter according to the fifth aspect, the resistance-value selecting switch portion that is inserted between the node between the first and the second partial resistance components and the node between the third and the fourth partial resistance components, is turned on or off according to the control signal.

Thus, when the resistance-value selecting switch portion is in its ON state, the first resistance component has the same resistance value as the second partial resistance component, and the second resistance component has the same resistance value as the fourth partial resistance component. On the other hand, when the resistance-value selecting switch portion is in its OFF state, the resistance value of the first resistance component equals the sum of the resistance values of the first and the second partial resistance components, and the resistance value of the second resistance component equals the sum of the resistance values of the third and the fourth partial resistance components. Thus, the resistance values of the first and the second resistance components can be varied according to the ON-OFF state of the resistance-value selecting switch portion.

In the A/D converter according to the sixth aspect, the first and the second partial switches set the second and the fourth partial resistance components included in the first and the second resistance components, respectively, at different resistance values, respectively, according to their ON-OFF state which is controlled by the control signal. Thus, the resistance values of the first and the second resistance components can be varied according to the ON-OFF state of the first and the second partial switches.

In the A/D converter according to the seventh aspect, the first and the second partial switches are common to the first and the third partial resistance components which are included in the first and the second resistance components respectively. According to the control signal, either one of the first and the second partial switches is turned on and the other is turned off. Since different values are set to the resistance values of the first and the third partial resistance components in the ON state of the first partial switch and in the ON state of the second partial switch, the resistance values of the first and the second resistance components can be varied in the ON state of the first partial switch and in the ON state of the second partial switch.

In the A/D converter according to the eighth aspect, the switch portion differently sets the transistor-connection resistance value inserted between the control electrodes of the first and the second output control transistors, according to its conducting state that is controlled by the control signal. Thus, each amplification factor of the plurality of first and second differential amplifiers can be varied by varying the resistance values at the second electrodes of the first and the second output control transistors according to the conducting state of the switch portion.

Further, since the control signal does not change the amount of constant current supplied from the constant-current supply portion, when the same voltage is applied to the first and the second input ends, the voltages at the first and the second output ends can be set at the same value.

In the A/D converter according to the ninth aspect, the transistor for transistor-connection resistance is connected at its first electrode to the second electrode of the first output control transistor and at its second electrode to the second electrode of the second output control transistor, and receives the control signal at its control electrode. Since its on-resistance value is differently set according to the control signal, the resistance values at the second electrodes of the first and the second output control transistors can be varied according to the control signal.

In the A/D converter according to the tenth aspect, the first and the second partial switches indicate validity or invalidity of the first and the second partial transistor-connection resistance components each having a different resistance value, according to their ON-OFF state. According to the control signal, either one of the first and the second partial switches is turned on and the other is turned off. Thus, the resistance values at the second electrodes of the first and the second output control transistors can be varied to the resistance value of the first or the second partial transistor-connection resistance component, according to the ON-OFF state of the first and the second partial switches.

In the A/D converter according to the eleventh aspect, the constant-current selecting switch differently sets the amount of the constant current to be supplied from the constant-current supply portion according to its conducting state that is controlled by the control signal. This allows variation of each amplification factor of the plurality of first and second differential amplifiers.

In the A/D converter according to the twelfth aspect, the first and the second switch portions determines selections or non-selections of the first and the second partial constant-current supply portions supplying a constant current in the first and the second amount, respectively, according to their ON-OFF state. According to the control signal, either one of the first and the second switch portions is turned on and the other is turned off.

Thus, the amount of the constant current to be supplied from the constant-current supply portion can be varied to the first or the second amount according to the ON-OFF state of the first and the second partial switches.

In the A/D converter according to the thirteenth aspect, the switch portion includes the first partial switch provided between one end of the second partial constant-current supply portion and the second electrodes of the first and the second output control transistors; and the second partial switch provided between one end of the second partial constant-current supply portion and the node between the common partial resistance component and the first and the second partial resistance components. According to the control signal, either one of the first and the second partial switches is turned on and the other is turned off.

Thus, according to the ON-OFF state of the first partial switch, the amount of constant current to be supplied from the constant-current supply portion can be varied to the first current amount or the sum of the first and the second current amounts.

Further, since either of the first and second partial switches is always in the ON state, the amount of current flowing through the common partial resistance component having a larger resistance value than those of the first and the second partial resistance components, constantly equals the sum of the first and the second current amounts, irrespective of the control signal. Thus, when the same voltage is applied to the first and the second input ends, the voltages at the first and the second output ends can be set almost at the same value.

In the A/D converter according to the fourteenth aspect, the first partial switch determines in its ON state that the amount of constant current from the constant-current supply portion be the first current amount, while the second partial switch determines in its ON state that the amount of constant current from the constant-current supply portion be the second current amount. Further, according to the control signal, either one of the first and the second partial switch is turned on and the other is turned off.

Thus, according to the ON-OFF state of the first and the second partial switches, the amount of constant current to be supplied from the constant-current supply portion can be varied to the first or the second current amount.

The A/D converter according to the fifteenth aspect further comprises the first and the second auxiliary transistors connected in parallel with the first and second output control transistors respectively. The switch portion includes the first partial switch controlling connections or non-connections between the control electrode of the first auxiliary transistor and the first input end and between the control electrode of the second auxiliary transistor and the second input end, according to its ON-OFF state; and the second partial switch controlling connections or non-connections between each of the control electrodes of the first and the second auxiliary transistors and the fixed control electrode according to its ON-OFF state. The fixed control voltage includes a voltage to turn off both of the first and the second auxiliary transistors with its application. Further, according to the control signal, either one of the first and the second partial switches is turned on and the other is turned off.

Thus, each amplification factor of the plurality of first and second differential amplifiers can be varied by changing the structure of the transistor receiving the first and the second inputs at its control electrode, into the structure with only the first and the second output control transistors or the structure with the first and the second auxiliary transistors in addition to the first and the second output control transistors.

The A/D converter according to the sixteenth aspect further comprises the first and the second auxiliary transistors each connected at its first electrode to the first and the second output ends and at its control electrode to the first and the second input ends; and the first and the second parallel-connection resistance components each connected at its one end to the second electrodes of the first and the second auxiliary transistors and at its other end to the second electrodes of the first and the second output control transistors. The switch portion includes the first and the second partial switches common to the first and the second parallel-connection resistance components. The first partial switch determines in its ON state that each resistance value of the first and the second parallel-connection resistance components be the first resistance value, while the second partial switch determines in its ON state that each resistance value of the first and the second parallel-connection resistance components be the second resistance value. Further, according to the control signal, either one of the first and the second partial switch is turned on and the other is turned off.

Thus, each amplification factor of the plurality of first and second differential amplifiers can be varied by varying the resistance values of the first and the second parallel-connection resistance components according to the ON-OFF state of the first and the second partial switches.

In the A/D conversion circuit according to the seventeenth aspect, the sub-A/D converter includes the A/D converters of the first and the second aspects. In the first period, the sub-A/D converter receives the first number of reference voltages as a plurality of reference voltages, in which case each amplification factor of the first and the second amplifier portions is set to be the first amplification factor according to the control signal, and in the second period, receives the second number of reference voltages as the plurality of reference voltages, in which case each amplification factor of the first and the second amplifier portions is set to be the second amplification factor larger than the first amplification factor, according to the control signal.

Thus, in the first period (most-significant-bit comparison period) when the first number of reference voltages selected at relatively coarse first voltage intervals are inputted, the first and the second amplifier portions conduct amplification with the relatively low first amplification factor, while in the second period (least-significant-bit comparison period) when the second number of reference voltages selected at relatively fine second voltage intervals are inputted, the first and the second amplifier portions conduct amplification with the relatively high second amplification factor. Such amplification with optimum amplification factor in each period achieves an A/D conversion with high accuracy.

Further, the use of the first amplifier portion, the input voltage conversion portion, and the least-significant-bit data output portion to convert the least-significant-bit group from analog to digital, and the use of the second amplifier portion and the most-significant-bit data output portion to convert the most-significant-bit group from analog to digital, sharply reduce the number of comparators for making a comparison between two voltages as compared with the configuration where the analog input voltage is converted into digital in a lump. This achieves simplification of the circuit configuration and low power consumption.

Besides, the use of the same sub-A/D converter in the first and the second periods in one A/D conversion achieves further simplification of the circuit configuration.

An object of the present invention is to achieve the A/D converter having smaller area and requiring lower power consumption than the conventional A/D converter, by achieving practical application of the folding and interpolation architecture to the sub-A/D converter in the unified sub-ranging type A/D converter to further reduce the number of element circuits in the A/D converter.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a circuit diagram of a structure of a pre-amplifier according to a fifth preferred embodiment.

FIG. 20 is a block diagram of a structure of a conventional flash type A/D converter.

FIG. 21 is a block diagram of an internal structure of the A/D converter in FIG. 20 with 10-bit resolution.

DESCRIPTION OF THE PREFERRED EMBODIMENTS

1. First Preferred Embodiment

1-1. Overall Structure

Figure 1:
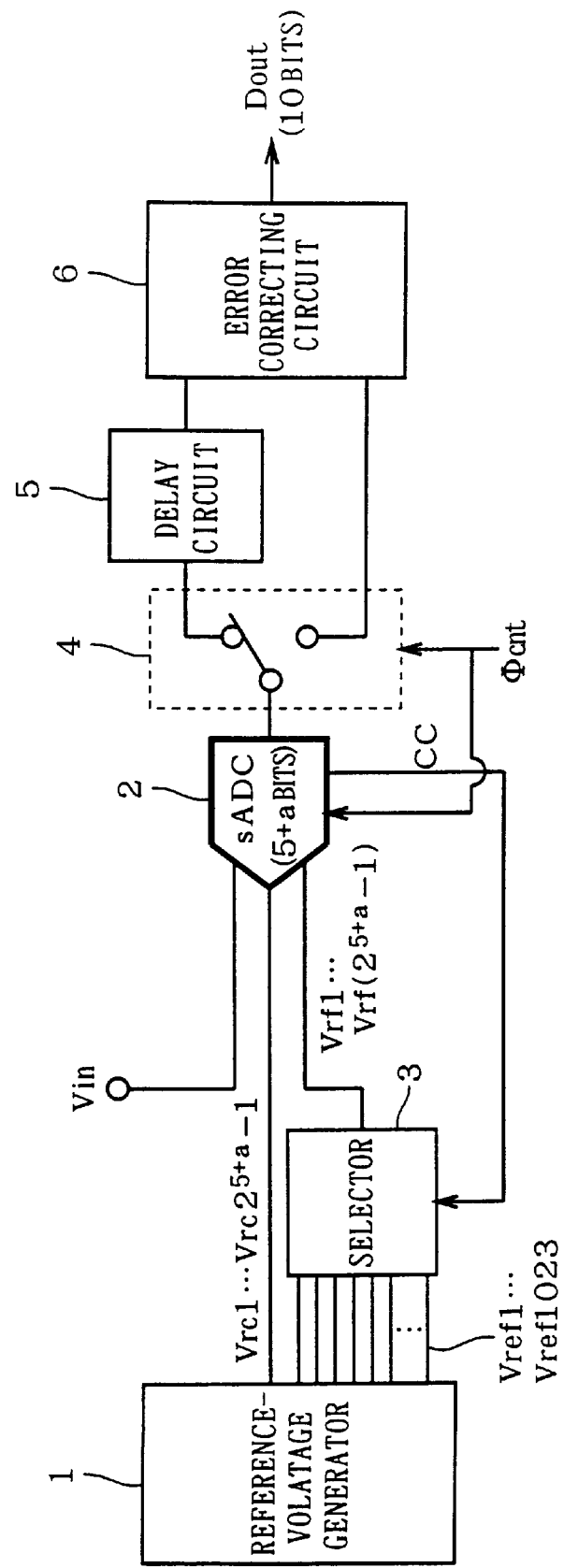
FIG. 1 is a block diagram of a structure of an A/D converter according to a first preferred embodiment of the present invention.

FIG. 1 is a block diagram of an overall structure of a unified sub-ranging type A/D conversion circuit with bit resolution according to a first preferred embodiment of the present invention. As shown in FIG. 1, a reference-voltage generator 1 outputs 1023 reference voltages Vref1 to Vref1023.

Constituted with a folding and interpolation type architecture, a sub-A/D converter 2 compares each of upper reference voltages Vrc1 to Vrc$\{2^{(5+a)}-1\}$ which are extracted from the 1023 reference voltages Vref1 to Vref1023 at predetermined intervals in an upper comparison period, with an analog input voltage Vin, and outputs its (5+a)-bit upper comparison result to a selector 3 and to a bus change-over switch 4. At this time, an amplification factor of a gain-variable pre-amplifier group in the sub-A/D converter 2 is suppressed low by a clock control signal Φcnt (reverse clock control signal $\overline{\Phi cnt}$).

The selector 3 selects consecutive $\{2^{(5+a)}-1\}$ reference voltages from the reference voltages Vref1 to Vref1023, on the basis of an A/D-conversion control signal CC in relation with the upper comparison result of the sub-A/D converter 2 in the upper comparison period, and outputs lower reference voltages Vrf1 to Vrf$\{2^{(5+a)}-1\}$ to the sub-A/D converter 2.

The sub-A/D converter 2 compares each of the lower reference voltages Vrf1 to Vrf$\{2^{(5+a)}-1\}$ with the analog input voltage Vin in a lower comparison period, and outputs its (5+a)-bit lower comparison result to the bus change-over switch 4. At this time, the amplification factor of the gain-variable pre-amplifier group in the sub-A/D converter 2 is set relatively high by the clock control signal Φcnt (reverse clock control signal $\overline{\Phi cnt}$).

On the basis of the clock control signal Φcnt, in the upper comparison period, the bus change-over switch 4 outputs the upper comparison result of the sub-A/D converter to a delay circuit 5, and in the lower comparison period, outputs the lower comparison result of the sub-A/D converter to an error correcting circuit 6.

On the basis of the upper comparison result of the sub-A/D converter 2 obtained via the bus change-over switch 4 and the delay circuit 5, and the lower comparison result of the sub-A/D converter 2 obtained only via the bus change-over switch 4, the error correcting circuit corrects an error of "a" bits to output a 10-bit digital output voltage Dout.

The unified sub-ranging type A/D conversion circuit of the first preferred embodiment uses the same sub-A/D converter 2 with (5+a)-bit resolution to make A/D conversions of the five most significant bits and the five least significant bits, where "a" is a redundancy bit for error correction.

1-2. Internal Structure of Sub-A/D Converter

Figure 2:
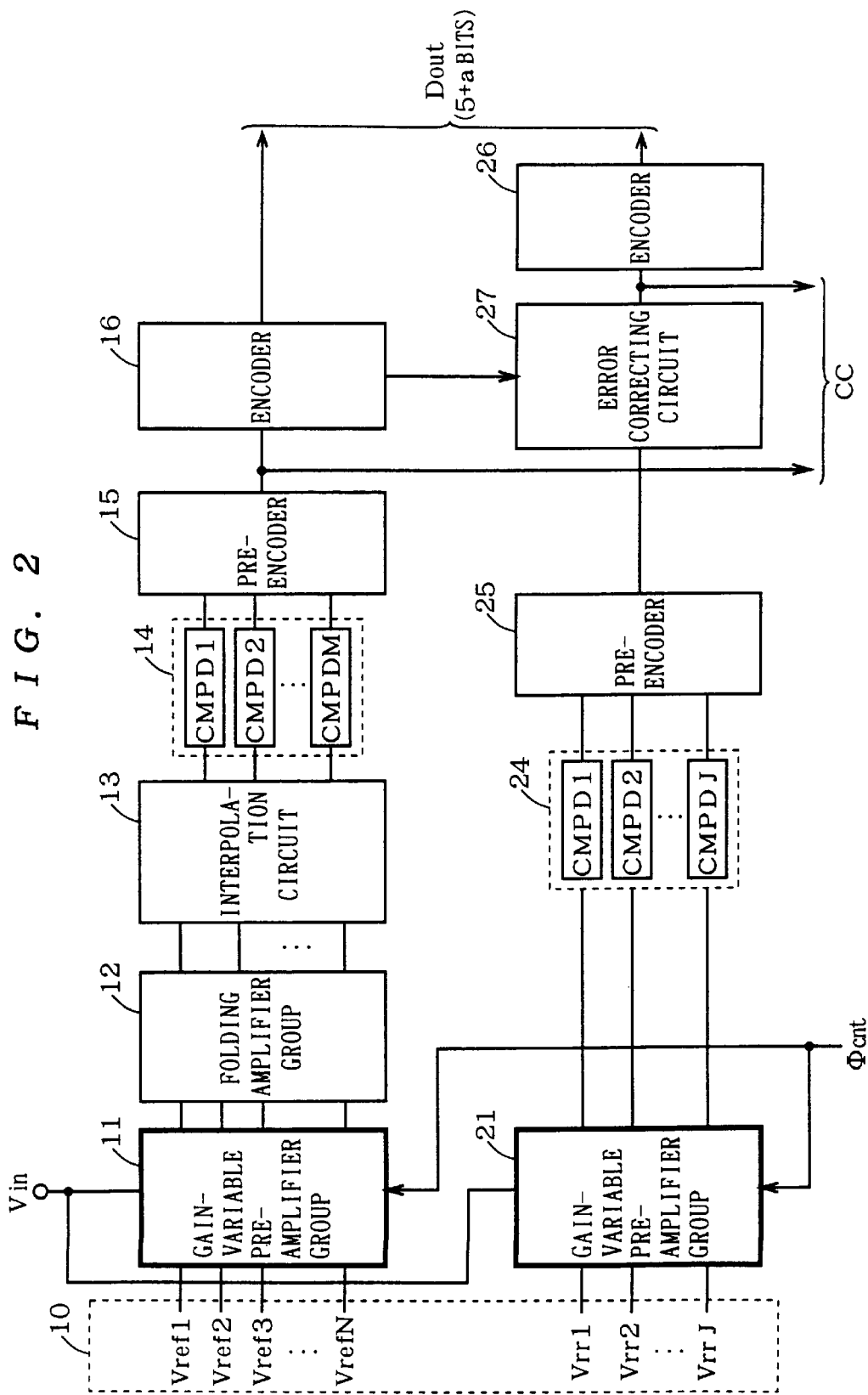
FIG. 2 is a block diagram of an internal structure of a sub-A/D converter in FIG. 1.

FIG. 2 is a block diagram of an internal structure of the sub-A/D converter 2 in FIG. 1. As shown in FIG. 2, a gain-variable pre-amplifier group 11 receives the analog input voltage Vin, and N($\geq 2$) reference voltages Vref1 to VrefN 1 from a reference voltage group 10, while a gain-variable pre-amplifier group 21 receives the analog input voltage Vin, and J(<N) reference voltages Vrr1 to VrrJ extracted from the reference voltages Vref1 to VrefN.

The gain-variable pre-amplifier group 11 amplifies the reference voltages Vref1 to VrefN and the analog input voltage Vin, and outputs its result to a folding amplifier group 12. Similarly, the gain-variable pre-amplifier group 21 amplifies the reference voltages Vrr1 to VrrJ and the analog input voltage Vin, and outputs its result to a comparator group 24.

An amplification factor of each pre-amplifier in the gain-variable pre-amplifier groups 11 and 12, which will be described later, differs between the upper and the lower comparison periods according to the clock control signal Φcnt (reverse clock control signal $\overline{\Phi cnt}$).

Figure 29:
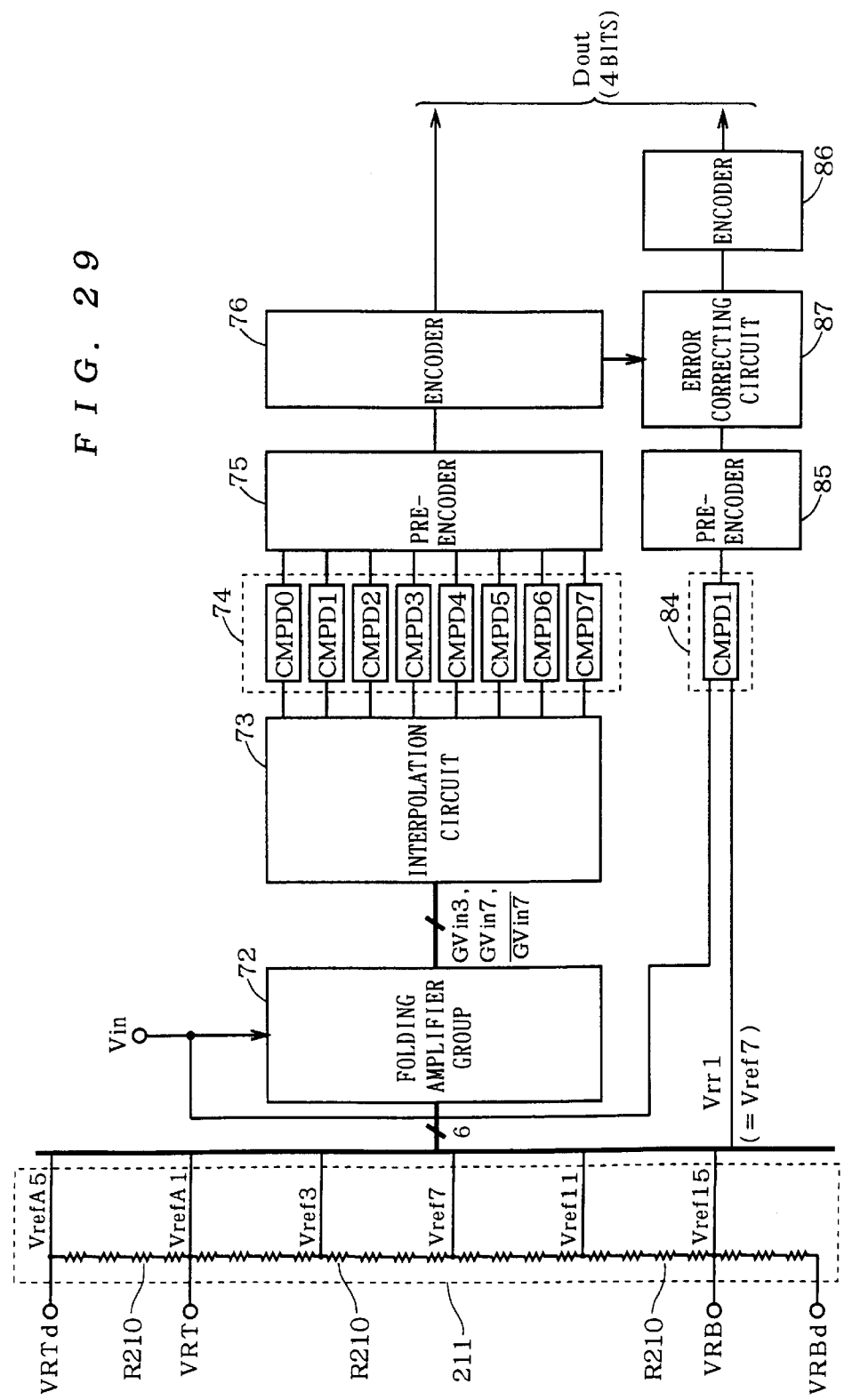
FIG. 29 is a block diagram of an internal structure of a folding and interpolation type A/D converter.
Figure 30:
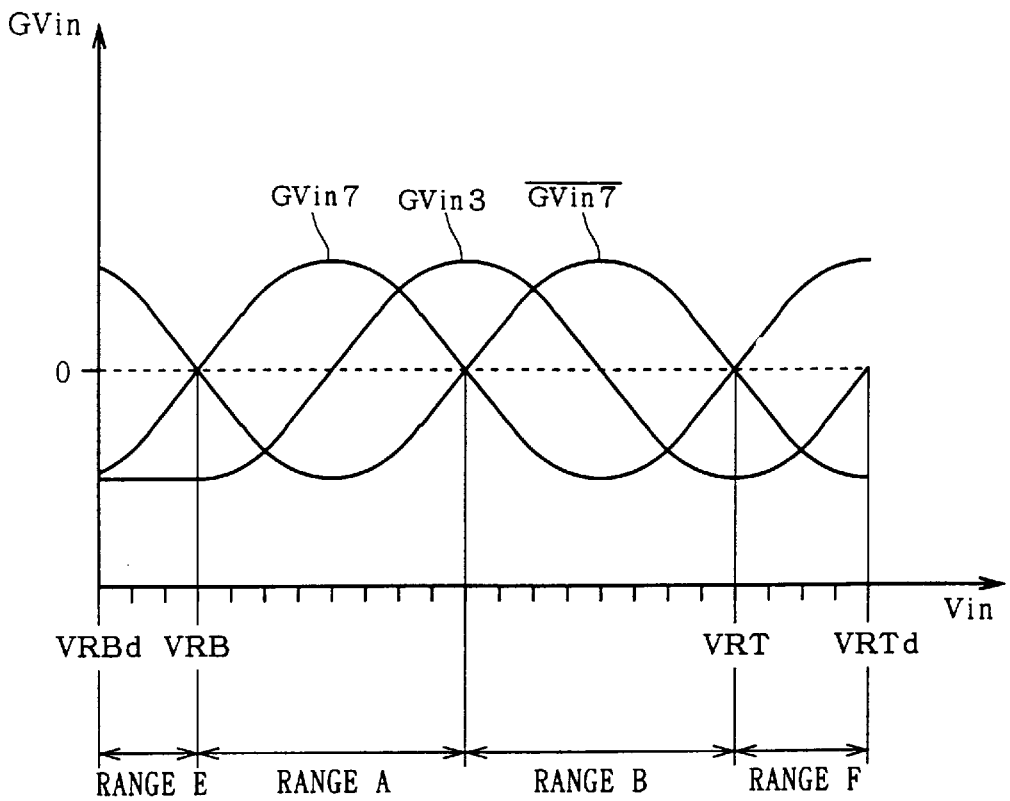
FIG. 30 is a graph of operation of a folding amplifier group in FIG. 29.
Figure 31:
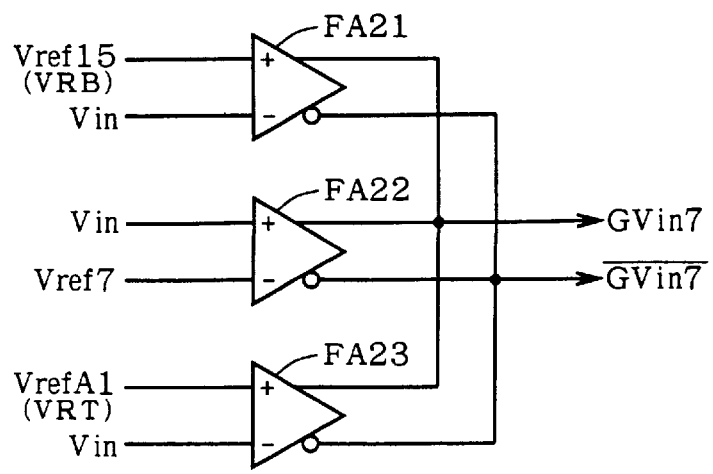
FIG. 31 is a circuit diagram of part of a structure of the folding amplifier group in FIG. 29.
Figure 32:
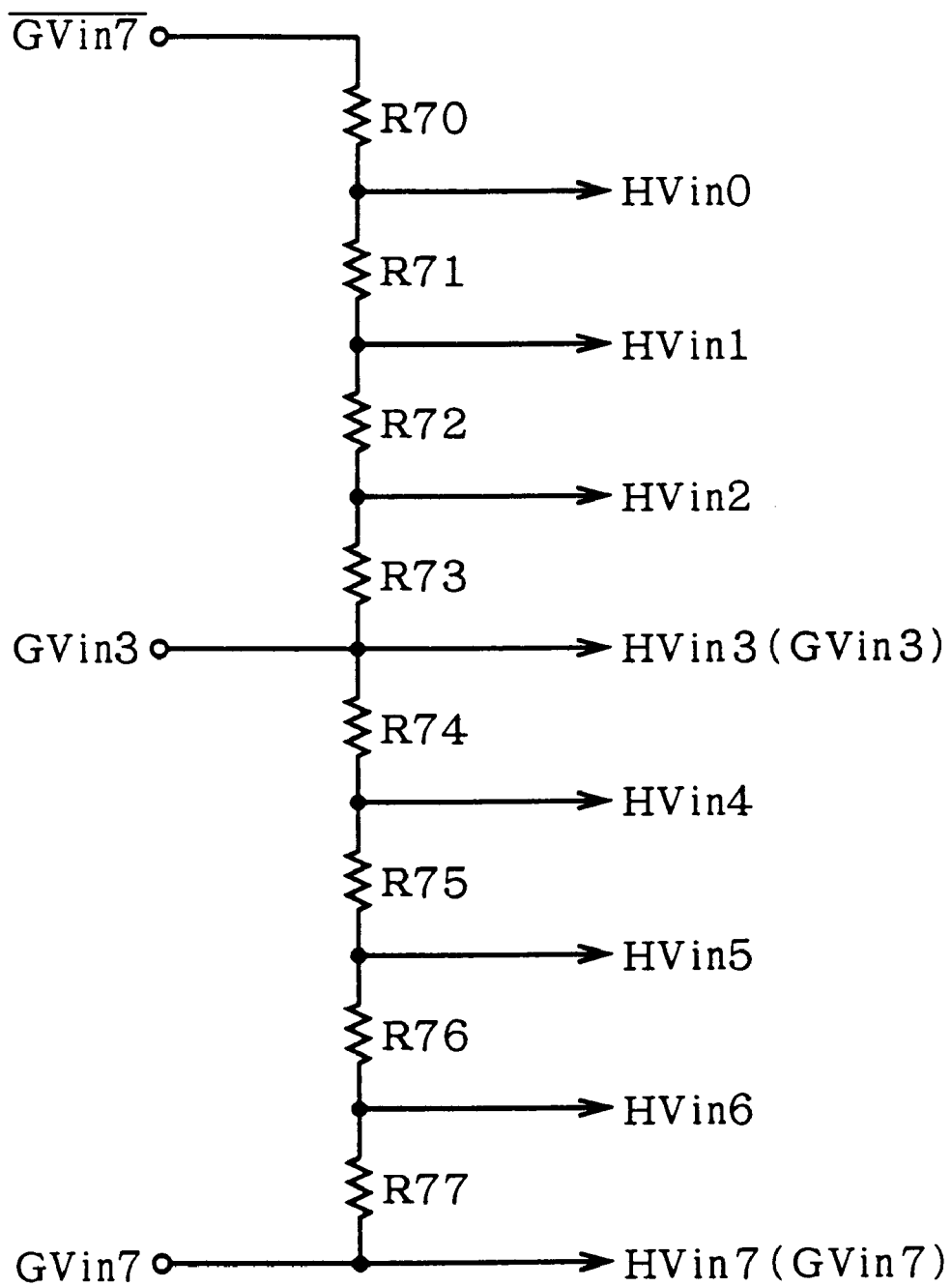
FIG. 32 is a circuit diagram of an internal structure of an interpolation circuit in FIG. 29.
Figure 33:
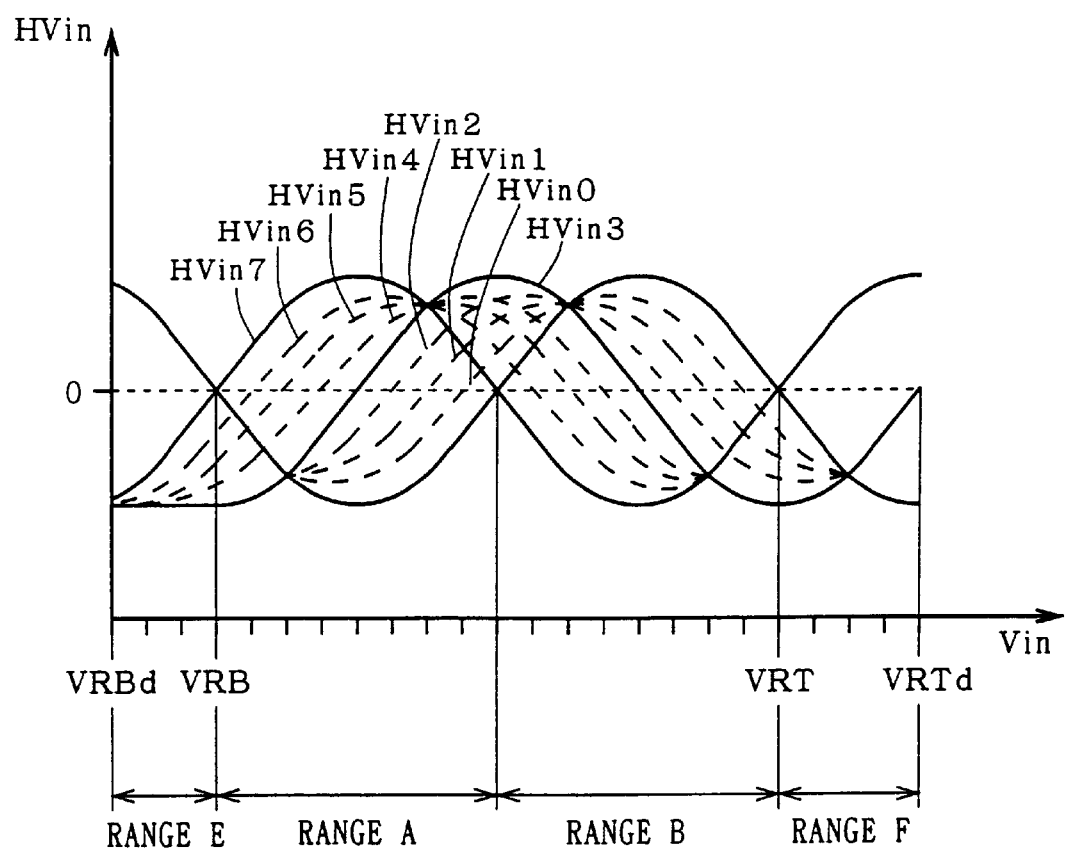
FIG. 33 is a graph of operation of the interpolation circuit in FIG. 29.
Figure 34:
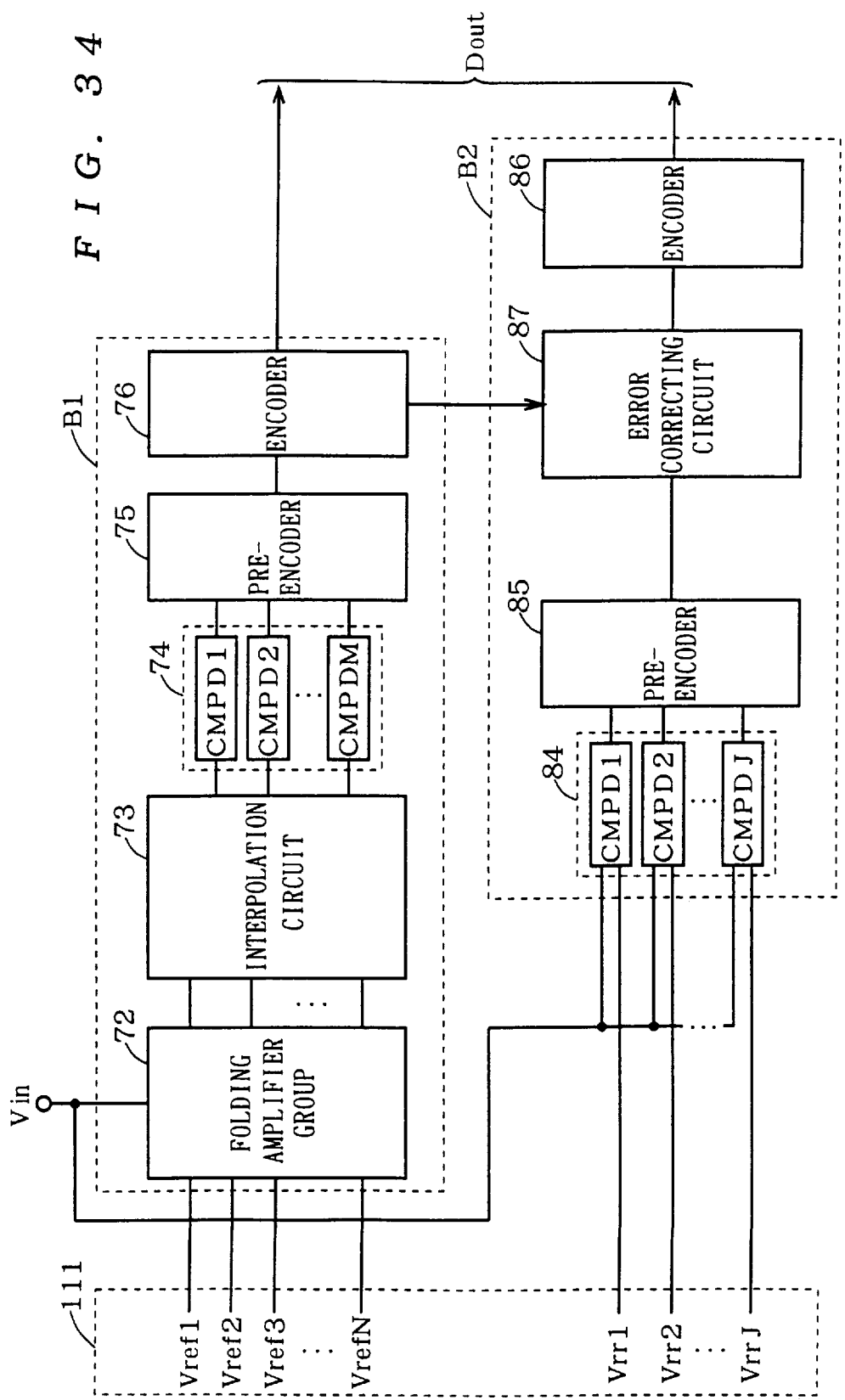
FIG. 34 is a block diagram of an internal structure of a folding and interpolation type A/D converter.
Figure 35:
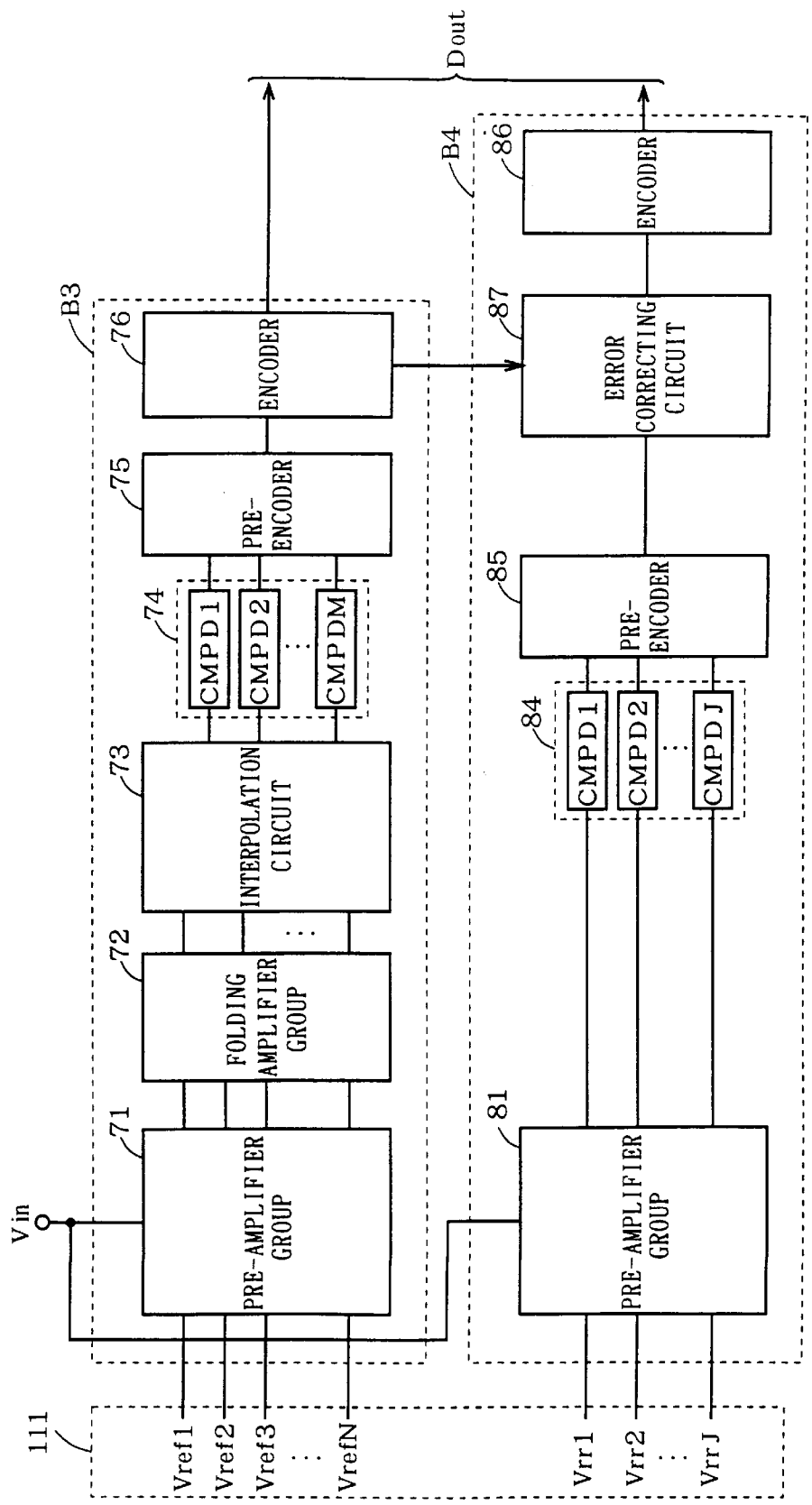
FIG. 35 is a block diagram of an internal structure of a folding and interpolation type A/D converter with pre-amplifiers.
Figure 36:
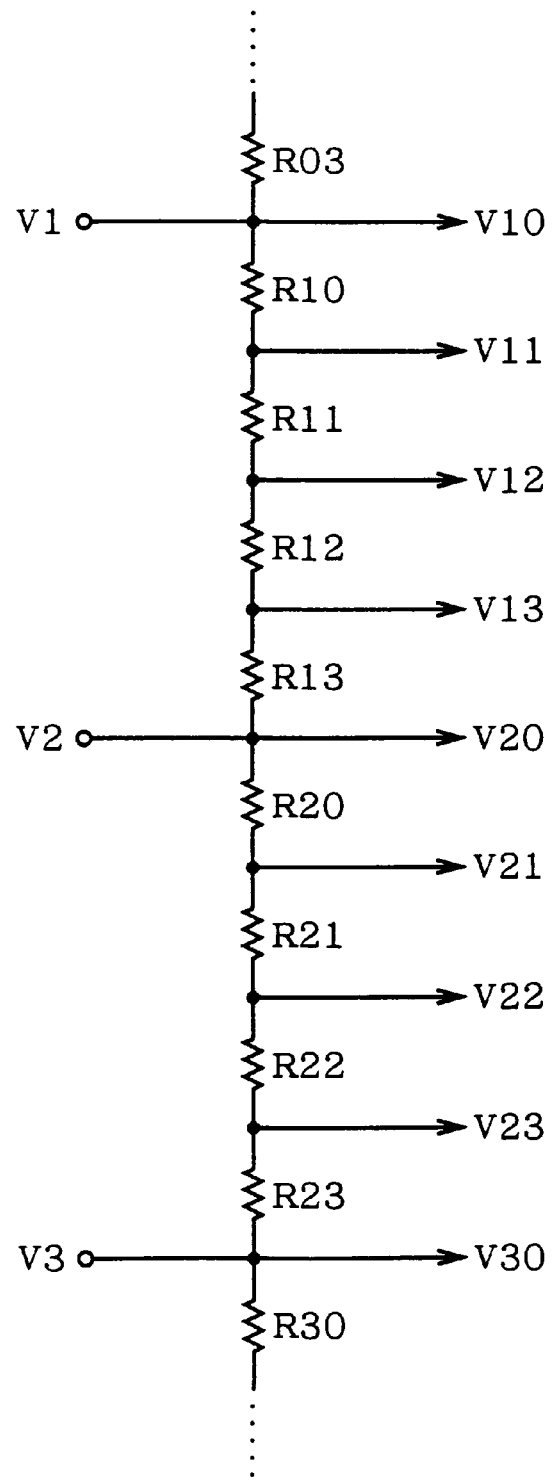
FIG. 36 is a circuit diagram of an internal structure of interpolation circuits in FIGS. 34 and 35.
Figure 37:
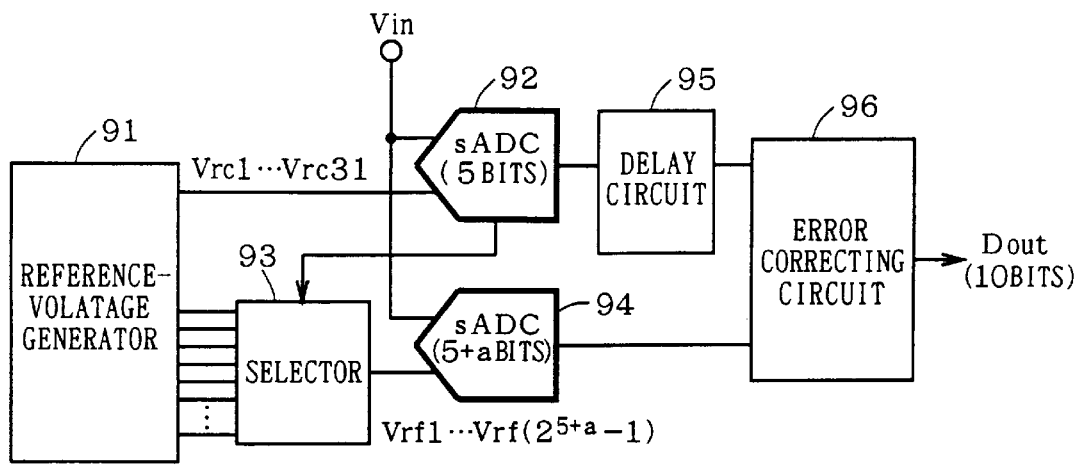
FIG. 37 is a block diagram of an overall structure of a sub-ranging type A/D converter.

The folding amplifier group 12 performs analog processing of input and output characteristics for the analog input voltage Vin on the basis of the reference voltages Vref1 to VrefN, like the folding amplifier group 72 in FIG. 29, and outputs a reference conversion voltage group obtained to an interpolation circuit 13.

The interpolation circuit 13 performs a P times interpolation on the basis of the reference conversion voltage group, like the interpolation circuit 73 in FIG. 29, and outputs a plurality of interpolation conversion voltages to a comparator group 14.

Comparators CMPD1 to CMPDM in the comparator group 14 compares the plurality of interpolation conversion voltages with a fixed value (for example, 0 V), respectively, and output their comparison results to a pre-encoder 15.

Figure 22:
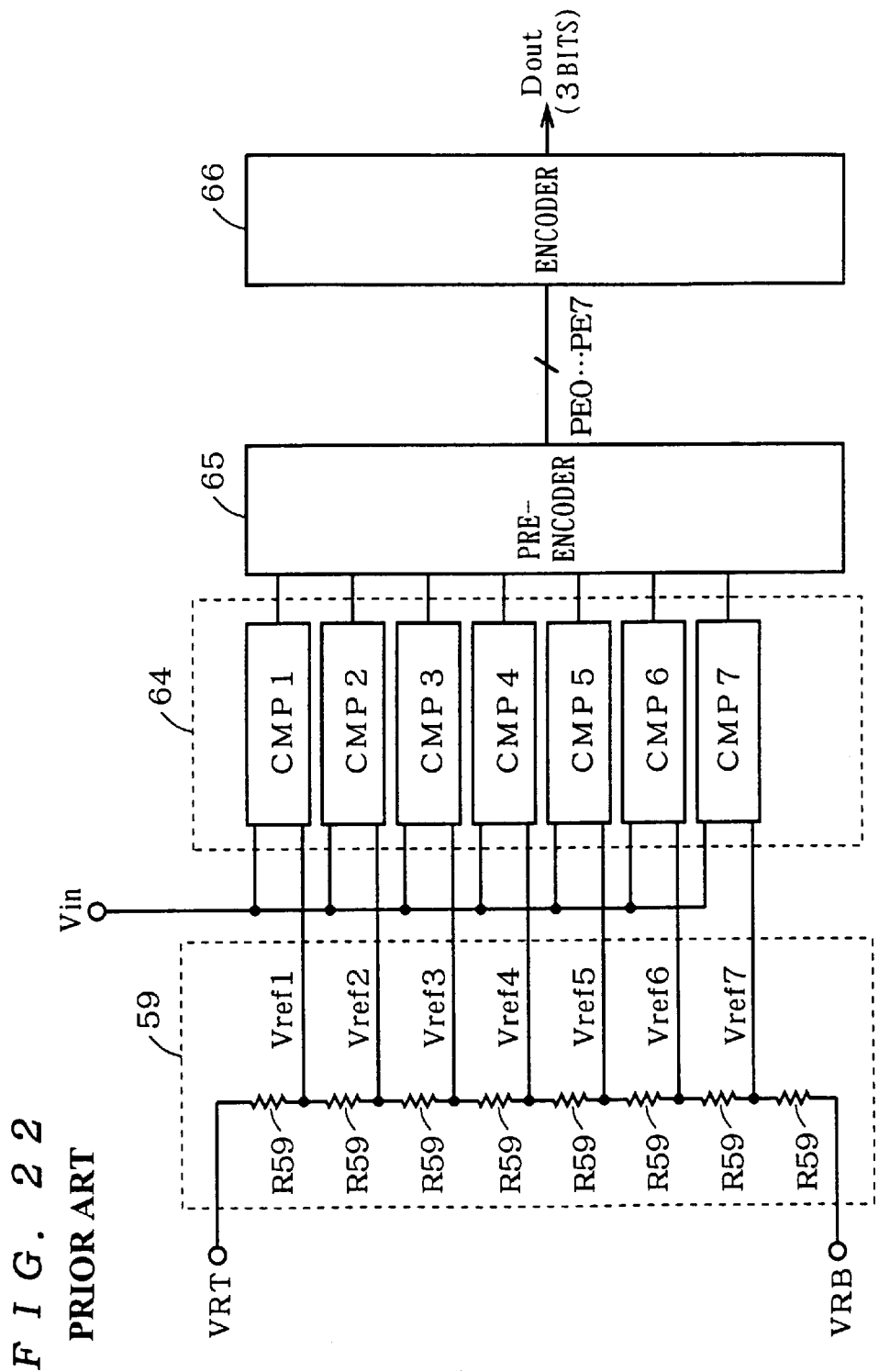
FIG. 22 is a block diagram of an internal structure of the A/D converter in FIG. 20 with 3-bit resolution.
Figure 23:
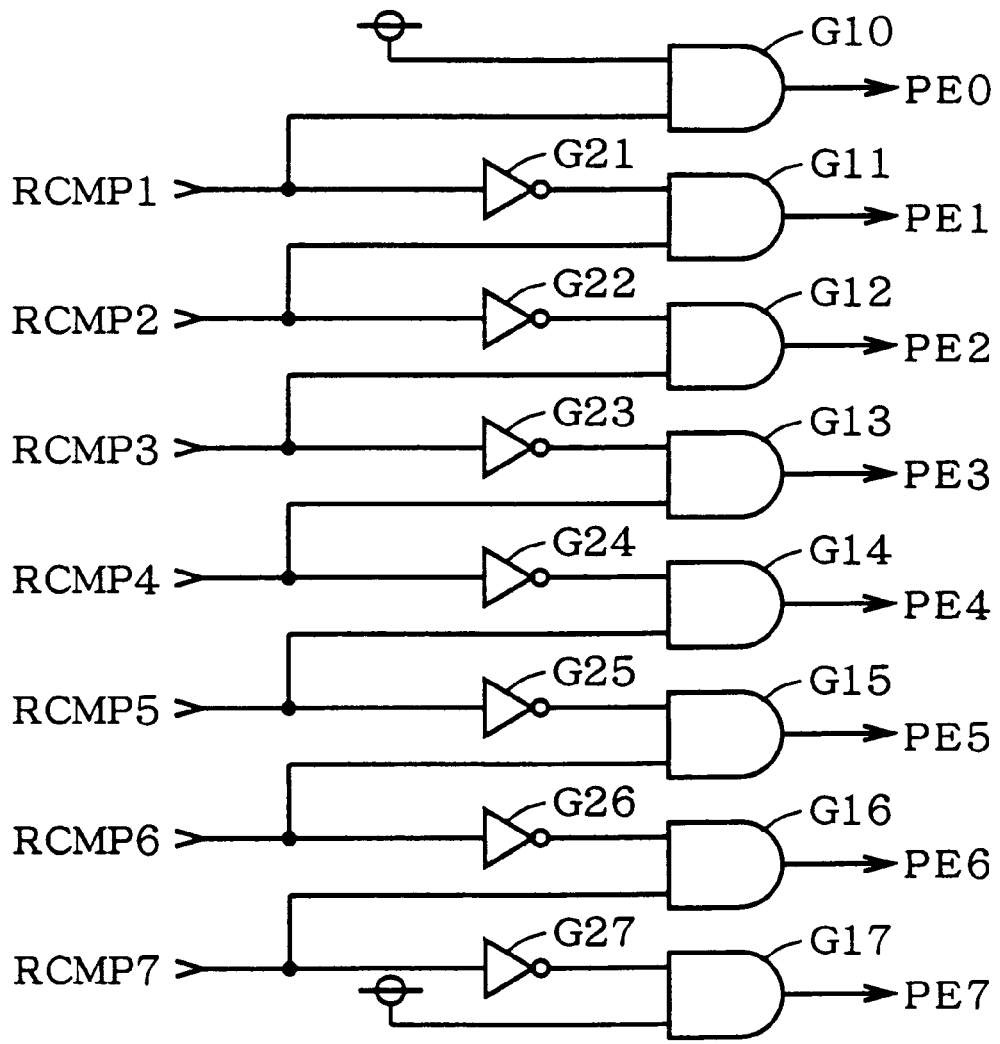
FIG. 23 is a circuit diagram of an internal structure of a pre-encoder in FIG. 22.
Figure 24:
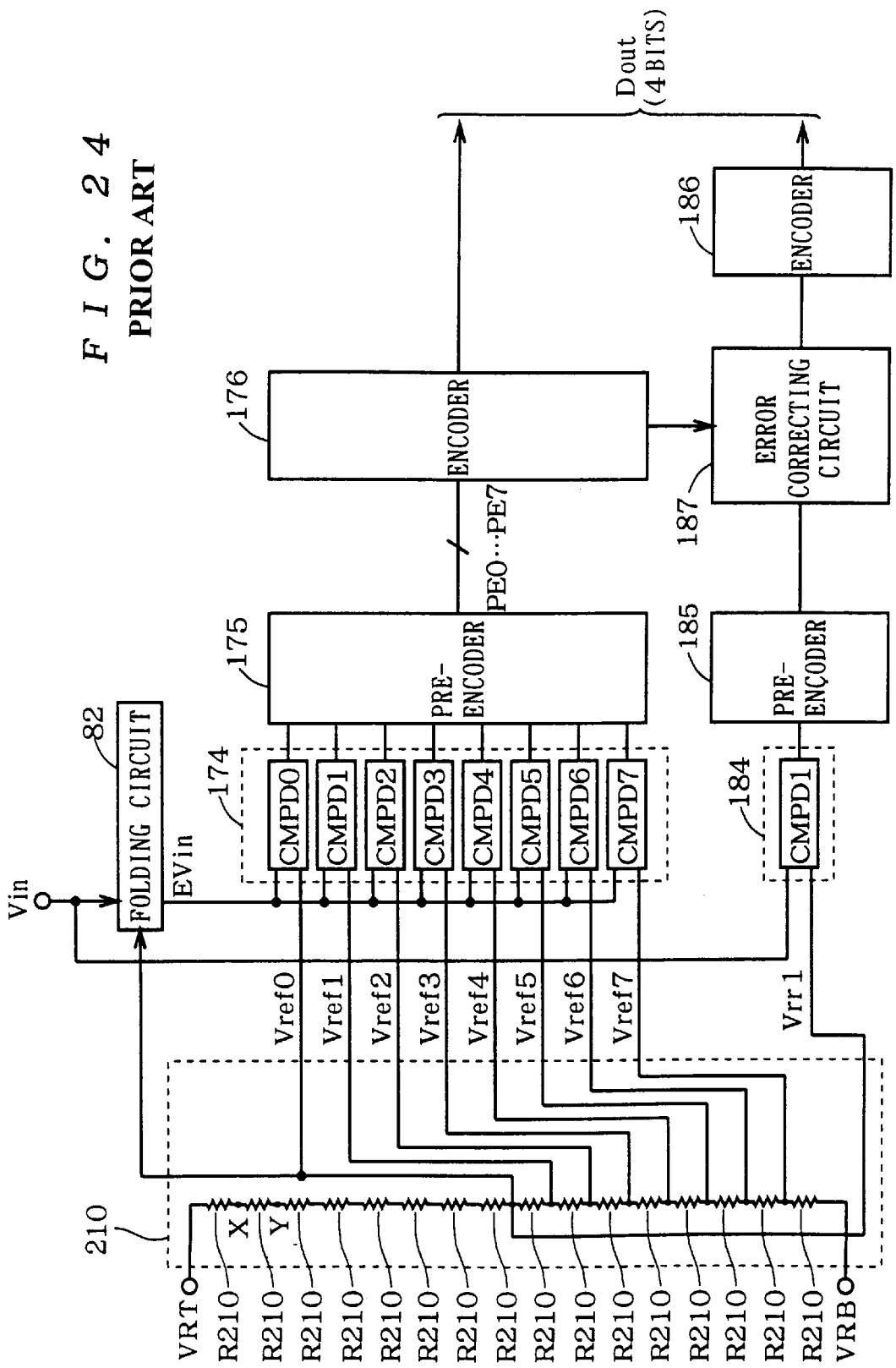
FIG. 24 is a block diagram of an internal structure of a basic folding type A/D converter.
Figure 25:
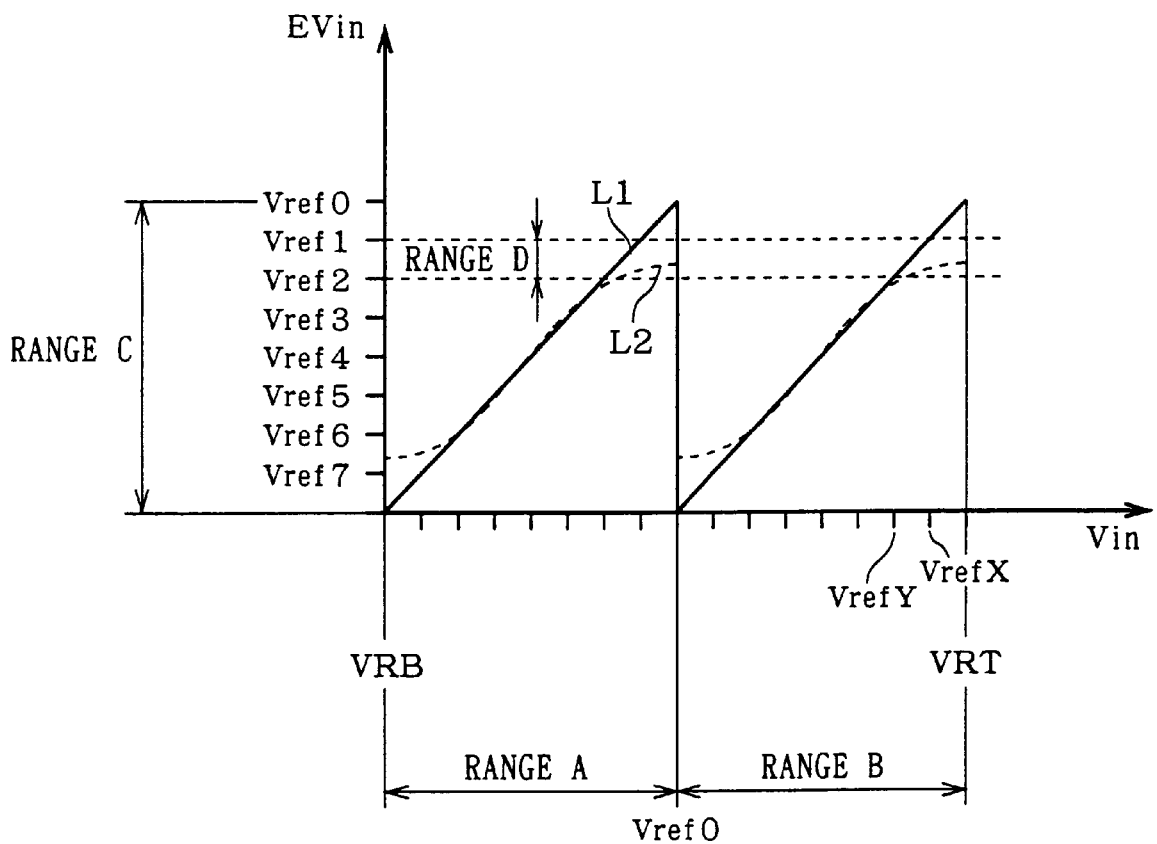
FIG. 25 is a graph of operation of a folding circuit in FIG. 24.
Figure 26:
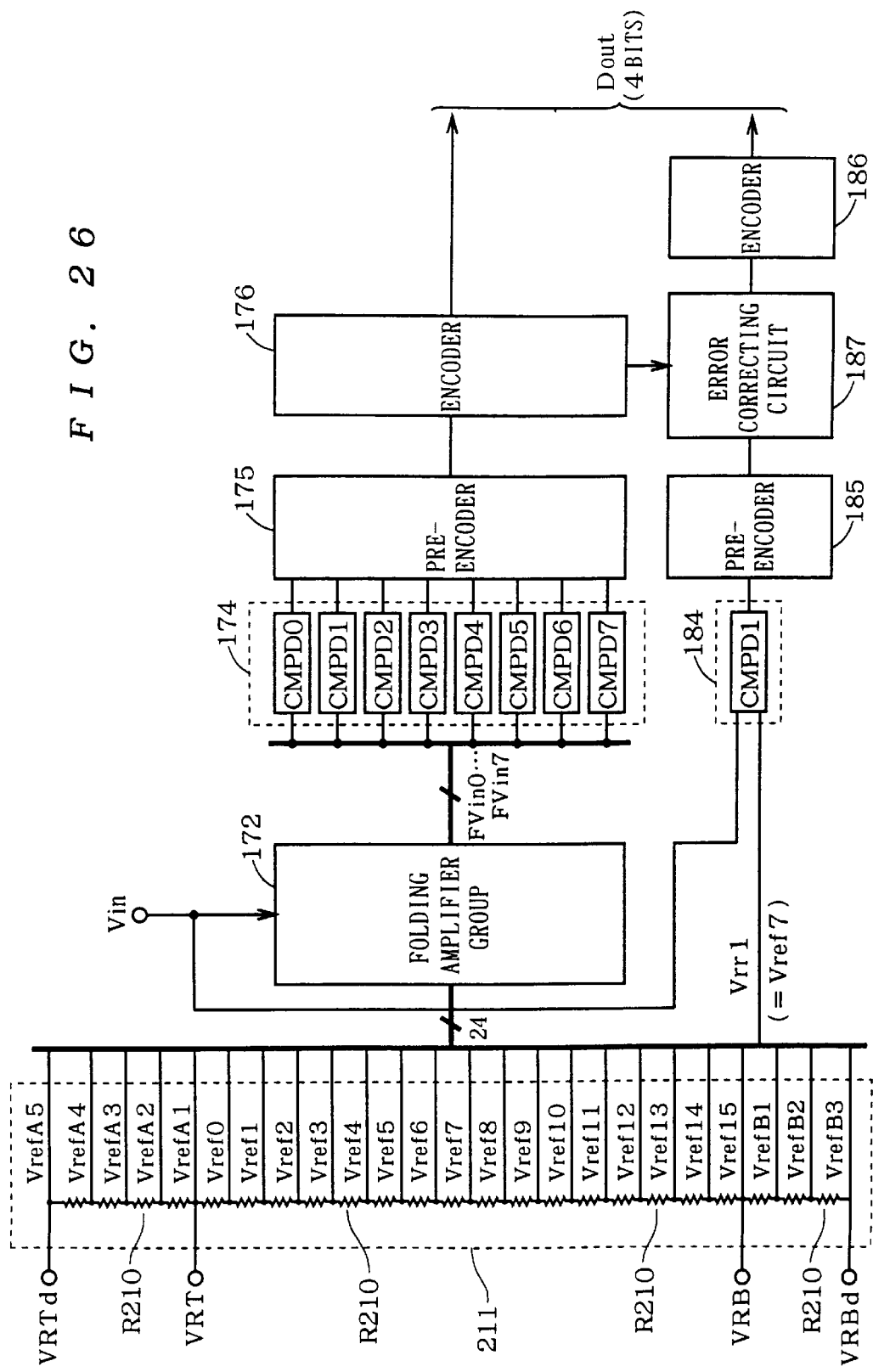
FIG. 26 is a block diagram of an internal structure of an improved folding type A/D converter.
Figure 27:
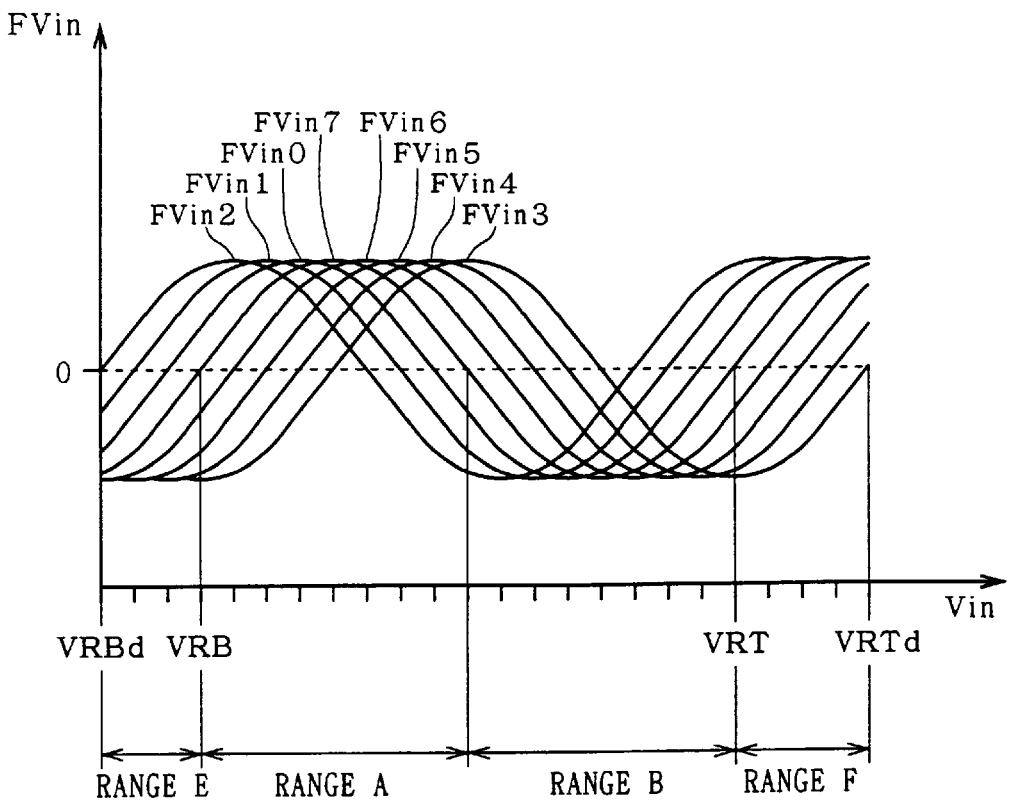
FIG. 27 is a graph of operation of a folding amplifier group in FIG. 26.
Figure 28:
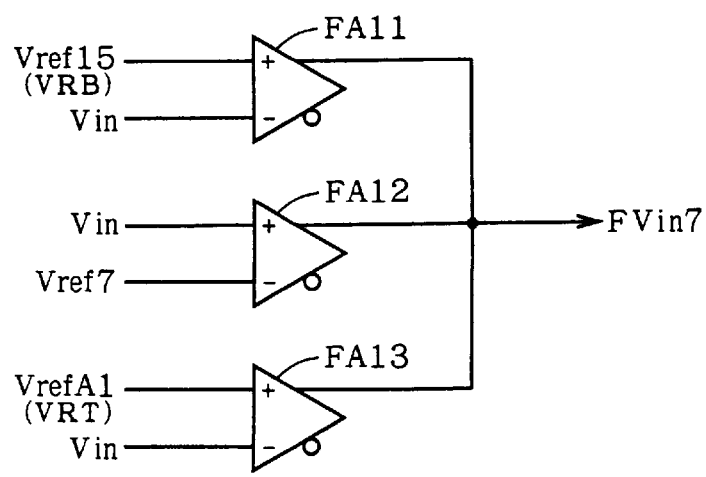
FIG. 28 is a circuit diagram of part of a structure of the folding amplifier group in FIG. 26.

On the basis of the comparison result of the comparator group 14, the pre-encoder 15 performs the same processing as the pre-encoder 65 in FIG. 22, and outputs a pre-encode signal.

An encoder 16 encodes the pre-encode signal to output a least-significant-bit group of the digital output voltage Dout.

Comparators CMPD1 to CMPDJ in the comparator group 24 compares the reference voltages Vrrr1 to VrrJ with the analog input voltage Vin, respectively, and outputs their comparison results. On the basis of the comparison result, a pre-encoder 25 performs the same processing as the pre-encoder 65 in FIG. 22, and outputs a pre-encode signal.

An error correcting circuit 27 corrects an error of the pre-encode signal on the basis of the control signal from the encoder 16, and outputs a corrected pre-encode signal. An encoder 26 encodes the corrected pre-encode signal to output a most-significant-bit group of the digital output voltage Dout.

The least-significant-bit group obtained from the encoder 16 and the most-significant-bit group obtained from the encoder 26 result in the (5+a)-bit digital output voltage Dout. The pre-encode signal from the pre-encoder 15 and the corrected pre-encode signal from the error correcting circuit 27 form a control signal CC.

1-3. Operation

Now, operation of the A/D conversion circuit of the first preferred embodiment in FIGS. 1 and 2 is described with reference to FIG. 3. In the circuit, one A/D conversion is made by execution of the following three operations in this order: sampling in a sampling period SA, upper comparison in an upper comparison period CC, and lower comparison in a lower comparison period FC.

During the sampling period SA, the A/D conversion circuit of the first preferred embodiment receives the analog input voltage Vin, and retains the most recent value of the analog signal in that period.

Next, in the upper comparison period CC, the sub-A/D converter 2 compares the retained analog input voltage Vin and each of the upper reference voltages Vrci (i=1 to $\{2^{(5+a)}-1\}$) in voltage level, and outputs its comparison result. Gains of the gain-variable pre-amplifier groups 11 and 21 in the upper comparison period CC are suppressed low, as shown in FIG. 3, by the clock control signal Φcnt (reverse clock control signal $\overline{\Phi cnt}$).

At this time, the bus change-over switch 4 connects the output of the sub-A/D converter 2 to the delay circuit 5. Although this comparison result is a digital code including the five most significant bits and "a" redundancy bits, the redundancy bit(s) is(are) ignored and only the five most significant bits are transmitted as a digital code to the delay circuit 5.

Then, in the lower comparison period FC, the sub-A/D converter 2 compares the retained analog input voltage Vin and each of the lower reference voltages Vrfj (j=1 to $\{2^{(5+a)}-1\}$) in voltage level, and outputs its comparison result. The gains of the gain-variable pre-amplifier groups 11 and 12 in the lower comparison period FC are set high, as shown fi FIG. 3, by the clock control signal Φcnt.

At this time, the bus change-over switch 4 connects the output of the sub-A/D converter 2 directly to the error correcting circuit 6. This comparison result becomes a lower comparison result including the five least significant bits and "a" redundancy bits for error correction.

The error correcting circuit 6 corrects an error of the 5-bit upper comparison result obtained from the delay circuit 5, using a signal of the "a" redundancy bits of the lower comparison result which is obtained directly from the bus change-over switch 4, and then outputs the digital codes of the five most significant bits of the upper comparison result with its error corrected and of the five least significant bits of the lower comparison result, together as the digital output voltage Dout. This digital output voltage Dout is a 10-bit digital code.

1-4. Effect

In the A/D conversion circuit of the first preferred embodiment, for example when "a"=1, the minimum number of element circuits equals 58 in total, with 15 comparators, 25 gain-variable pre-amplifiers, and 18 folding amplifiers as shown in Tables 4 and 5.

Figure 38:
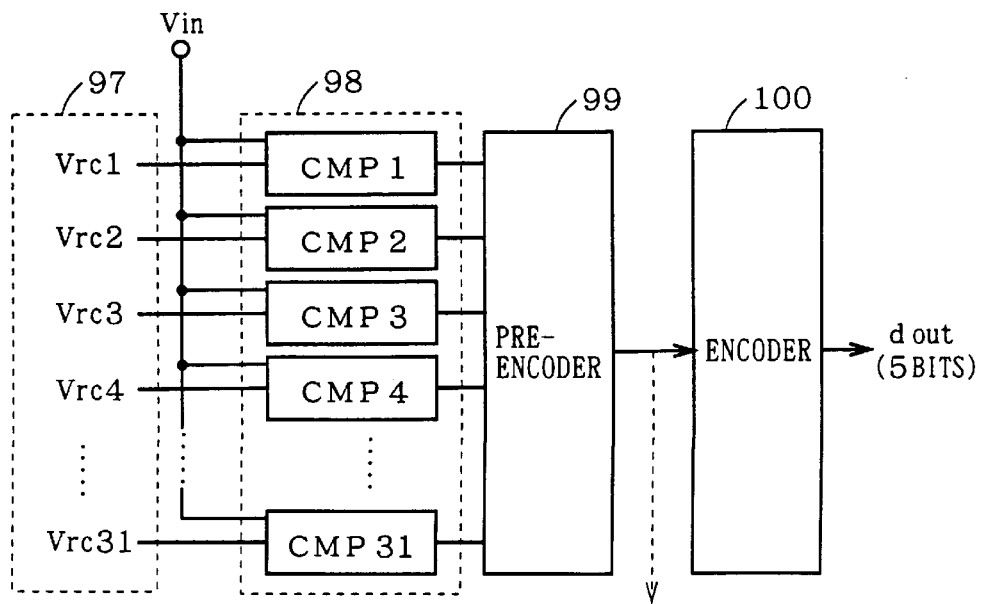
FIG. 38 is a block diagram of an internal structure of a sub-A/D converter in FIG. 37.
Figure 39:
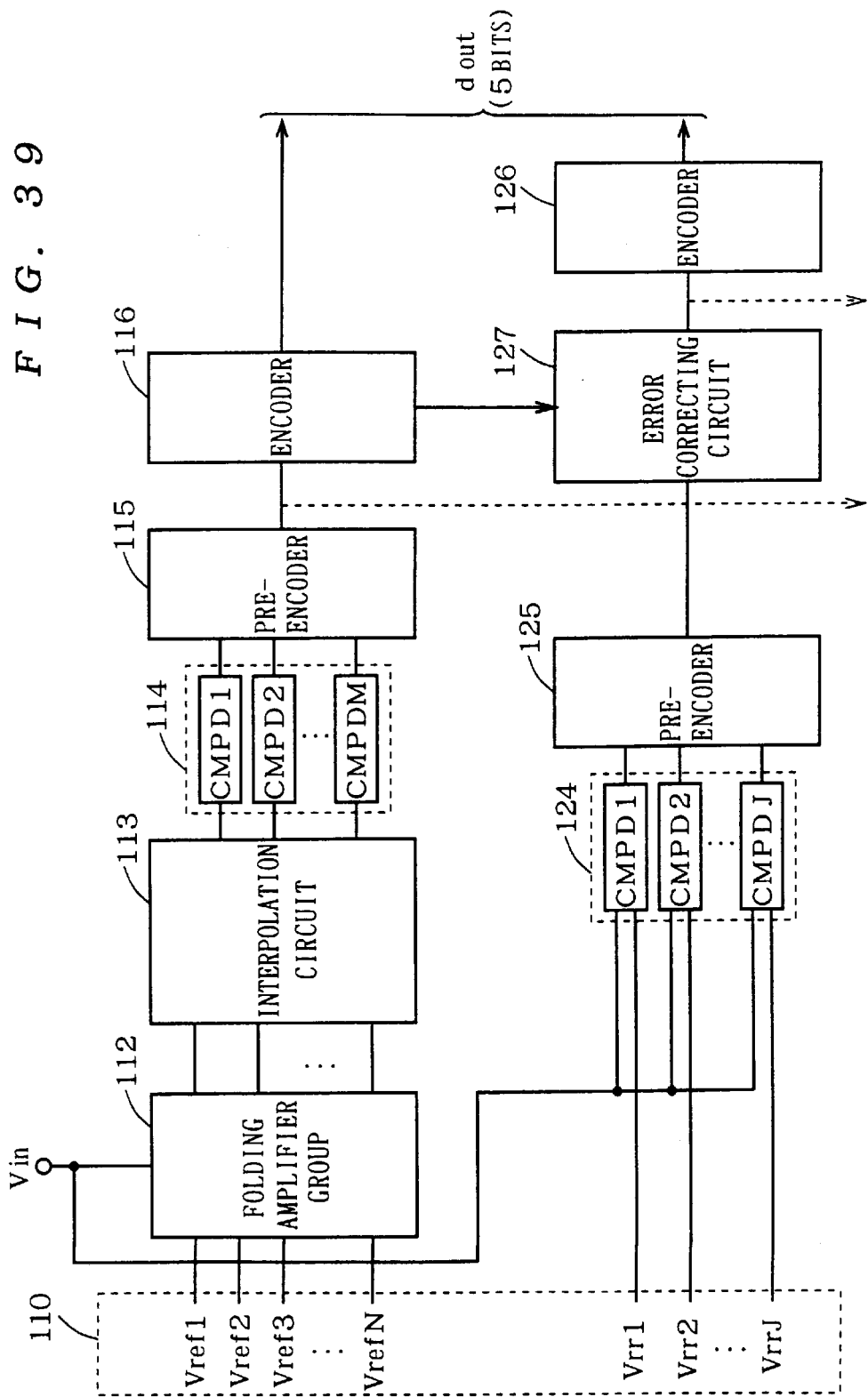
FIG. 39 is a block diagram of a structure of a folding and interpolation type A/D converter, used as the sub-A/D converter in FIG. 37.
Figure 40:
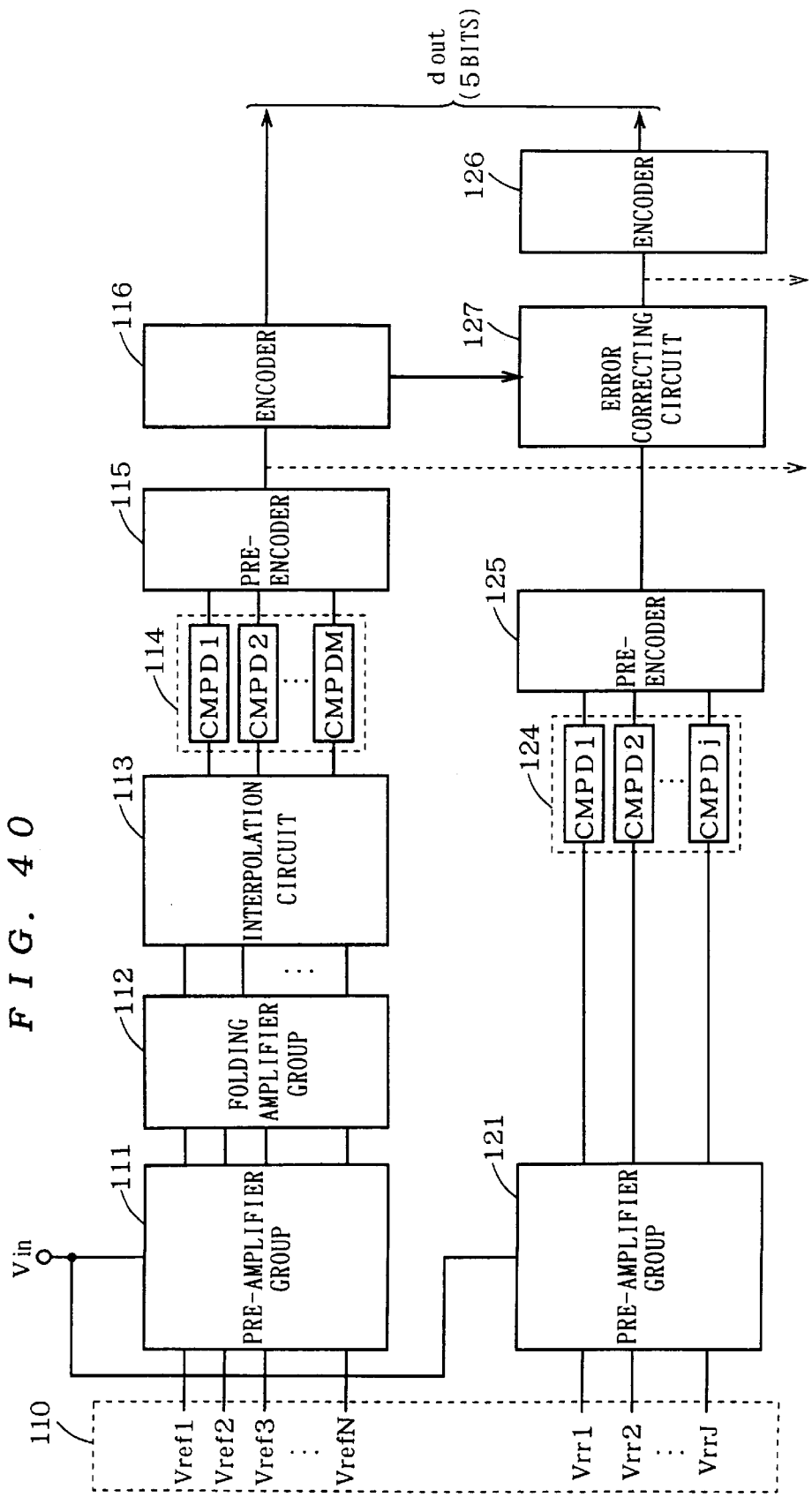
FIG. 40 is block diagram of a structure of a folding and interpolation type A/D converter with pre-amplifiers, used as the sub-A/D converter in FIG. 37.
Figure 41:
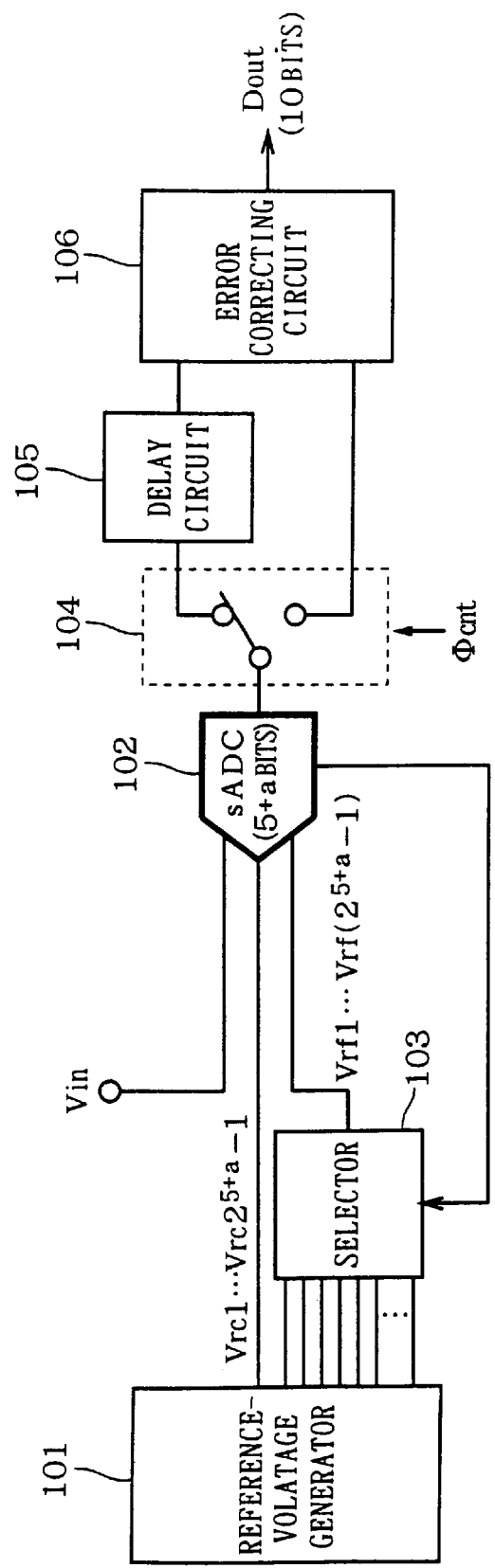
FIG. 41 is a block diagram of an overall structure of an unified type A/D converter.
Figure 42:
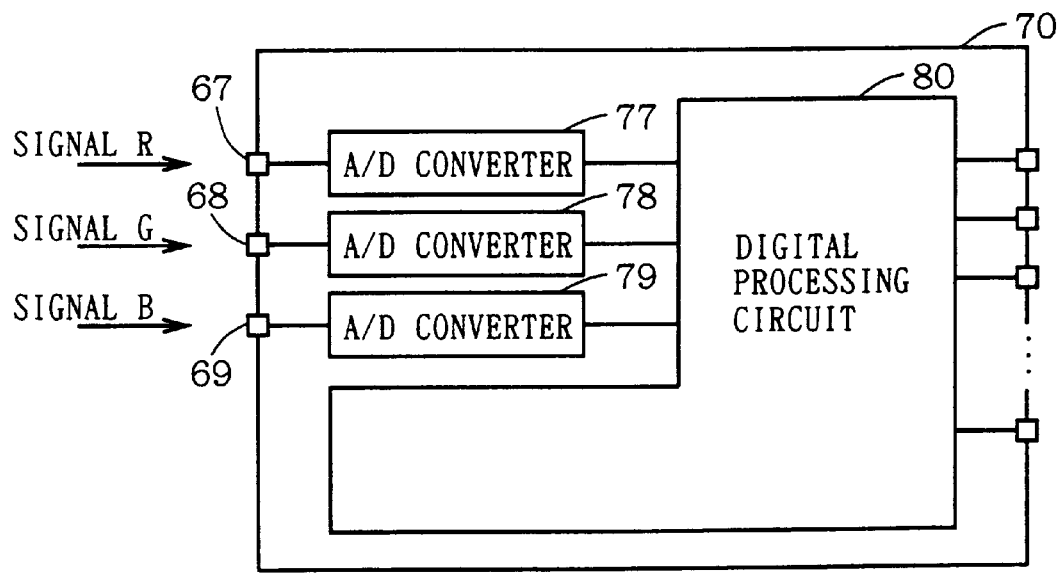
FIG. 42 is an illustration of an internal structure of a system LSI.

For the sub-A/D converter 2 in FIG. 1 constituted of an unified sub-ranging type A/D converter with the conventional circuit configuration as shown in FIG. 38, the number of comparators equals 63, or not more than 63 when "a" is not more than "1" in the same architecture. Thus, only a simple comparison of the number of element circuits finds little difference between the A/D converter of the first preferred embodiment and the conventional unified sub-ranging type A/D converter. However, there are essential differences therebetween as described below.

Figure 4:
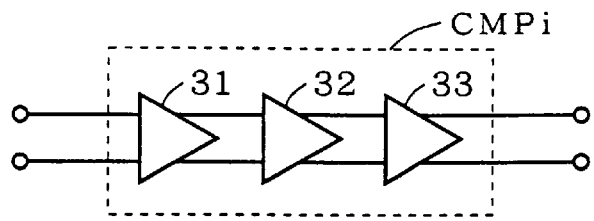
FIG. 4 is an illustration of a structure of one comparator in a flash type A/D converter.

In the conventional unified sub-ranging type A/D converter, the comparator CMPi (i=1 to 31) in the comparator group 98 in FIG. 38 consists of three differential amplifiers (amplifiers 31 and 32 and a latch 33), as shown in FIG. 4. This is because the amplifiers 31 and 32 need to be provided in two stages before the latch 33 so as to bring the latch 33 for outputting "H" and "L" on the basis of a potential difference between two inputs to a sufficient level to make an accurate comparison.

Figure 5:
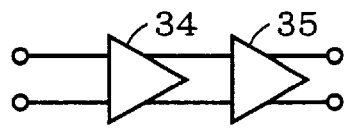
FIG. 5 is an illustration of a structure of one pre-amplifier and one folding amplifier in the A/D converter of the first preferred embodiment.

On the other hand, in the sub-A/D converter 2 with the circuit configuration shown in FIG. 2 according to the first preferred embodiment, each of gain-variable pre-amplifiers 34 in the gain-variable pre-amplifier group 11 (or 21) and folding amplifiers 35 in the folding amplifier group 12, consists of one differential amplifier as shown in FIG. 5.

Figure 6:
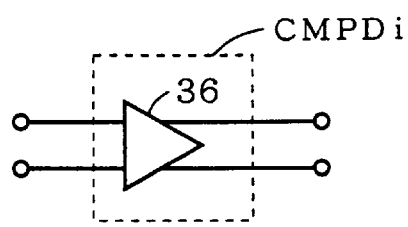
FIG. 6 is an illustration of a structure of one comparator in the A/D converter of the first preferred embodiment.
Figure 7:
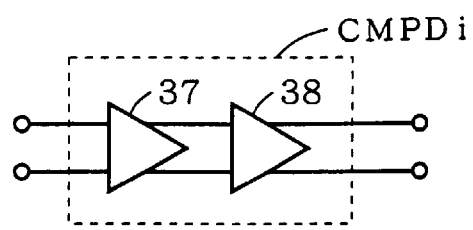
FIG. 7 is an illustration of a structure of another comparator in the A/D converter of the first preferred embodiment.

Further, one differential amplifier (latch 36) or two differential amplifiers (amplifier 37 and latch 38) is(are) sufficient to form the comparator CMPDi (i=i to M(J)) in the comparator group 14 (15) as shown in FIG. 6 or 7. This is because before the comparator group 14 or 15, the gain-variable pre-amplifier group 11 and folding amplifier group 12 or the gain-variable pre-amplifier group 21 exist(s), where the analog input voltage Vin or the reference voltage Vref is previously amplified before inputted into the comparator CMPDi.

Namely, the combination of the gain-variable pre-amplifier group 11, the folding amplifier group 12, the comparator group 14 corresponds to the circuit configuration with three or four differential amplifiers.

In this fashion, the combination of the gain-variable pre-amplifier group 11, the folding amplifier group 12, and the comparator group 14 is feasible with the same number of differential amplifiers required for one comparator group 98 or with just one more addition thereto.

Thus, on comparison of substantial layout area and power consumption, the element circuit in the A/D conversion circuit of the first preferred embodiment corresponds to approximately 15 to 20 comparators in the conventional unified sub-ranging type A/D conversion circuit in scale.

As a result, the A/D conversion circuit of the first preferred embodiment can sharply reduce the area and power consumption of the sub-A/D converter 2 as compared with the unified type A/D conversion circuit with the conventional architecture.

At this time, the gains of the gain-variable pre-amplifier groups can be properly adjusted for each comparison period by differentiating the amplification factor of each pre-amplifier in the gain-variable pre-amplifier groups 11 and 21 between the upper and the lower comparison periods CC and FC.

2. Second Preferred Embodiment

Figure 8:
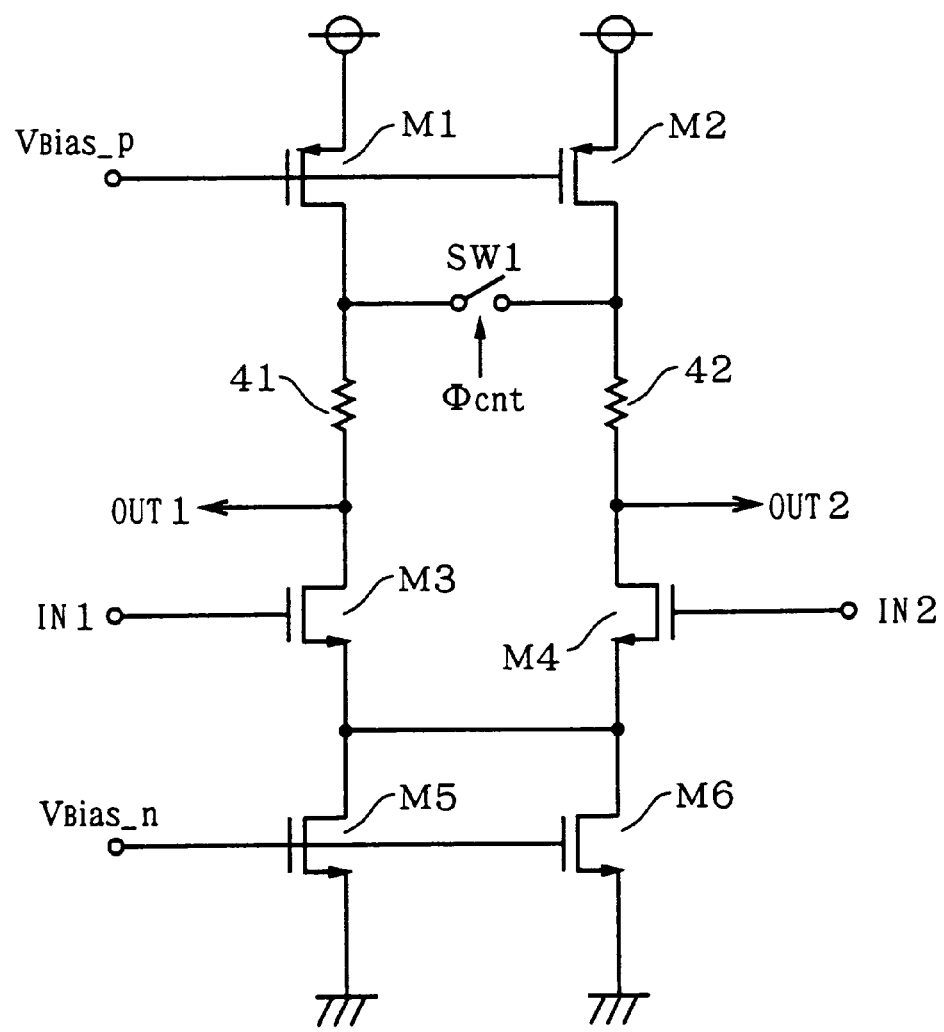
FIG. 8 is a circuit diagram of a structure of a pre-amplifier according to a second preferred embodiment.

A second preferred embodiment is directed to one gain-variable pre-amplifier in the gain-variable pre-amplifier group 11 (or 21) in the A/D converter of the first preferred embodiment. FIG. 8 is a circuit diagram of a structure of one gain-variable pre-amplifier according to the second preferred embodiment.

As shown in FIG. 8, PMOS transistors M1 and M2 to be resistance components are both connected at their sources to power supplies VDD, and receive a common bias voltage VBias_p at their gates. The bias voltage VBias_p is set so that the PMOS transistors M1 and M2 are always in their ON state.

The PMOS transistors M1 and an NMOS transistor M3 are connected at the drains via a resistance 41 (resistance value R), and the PMOS transistor M2 and an NMOS transistor M4 are connected at the drains via a resistance 42 (resistance value R).

Further, a switch SW1 is provided between the drains of the PMOS transistors M1 and M2. The switch SW1 receives a clock control signal Φcnt, and according to "L" or "H" of the clock control signal Φcnt, turns on or off.

The NMOS transistors M3 and M4 to be output control transistors constitute a differential pair. The NMOS transistor M3 receives an input voltage IN1 at its gate, and connected at its source to a drain of an NMOS transistor M5. On the other hand, the NMOS transistor M4 receives an input voltage IN2 at its gate, and connected at its source to a drain of an NMOS transistor M6. Further, the NMOS transistors M3 and M4 are short-circuited between their sources.

The NMOS transistors M5 and M6 to be constant-current supply portions receive a common bias voltage VBias_n at their gates, and are grounded at their sources. The bias voltage VBias_n is set so that the NMOS transistors M5 and M6 are always in their ON state. The PMOS transistors M1 and M2 are of the same size, and the NMOS transistors M3 and M4 are of the same size.

The gain-variable pre-amplifier with such a structure amplifies a potential difference between the input voltages IN1 and IN2, and outputs complementary output voltages OUT1 and OUT2 from the drains of the NMOS transistors M3 and M4.

When used in the gain-variable pre-amplifier group 11, for example, the gain-variable pre-amplifier of the second preferred embodiment receives a target voltage out of the analog input voltage Vin and the reference voltages Vref1 to VrefN at its first input end (gate of the NMOS transistor M3) as the input voltage IN1 and a fixed voltage at its second input end (gate of the NMOS transistor M4) as the input voltage IN2, and outputs the output voltage OUT1 or OUT2 from its first or second output end (drain of the NMOS transistor M3 or M4).

Further, when used in the gain-variable pre-amplifier group 21, the gain-variable pre-amplifier of the second preferred embodiment receives a target voltage out of the analog input voltage Vin and the reference voltages Vrr1 to VrrJ1 at its first input end (gate of the NMOS transistor M3) as the input voltage IN1 and a fixed voltage at its second end (gate of the NMOS transistor M4) as the second input IN2, and outputs the output voltage OUT1 or OUT2 from its first or second output end (drain of the NMOS transistor M3 or M4).

Figure 3:
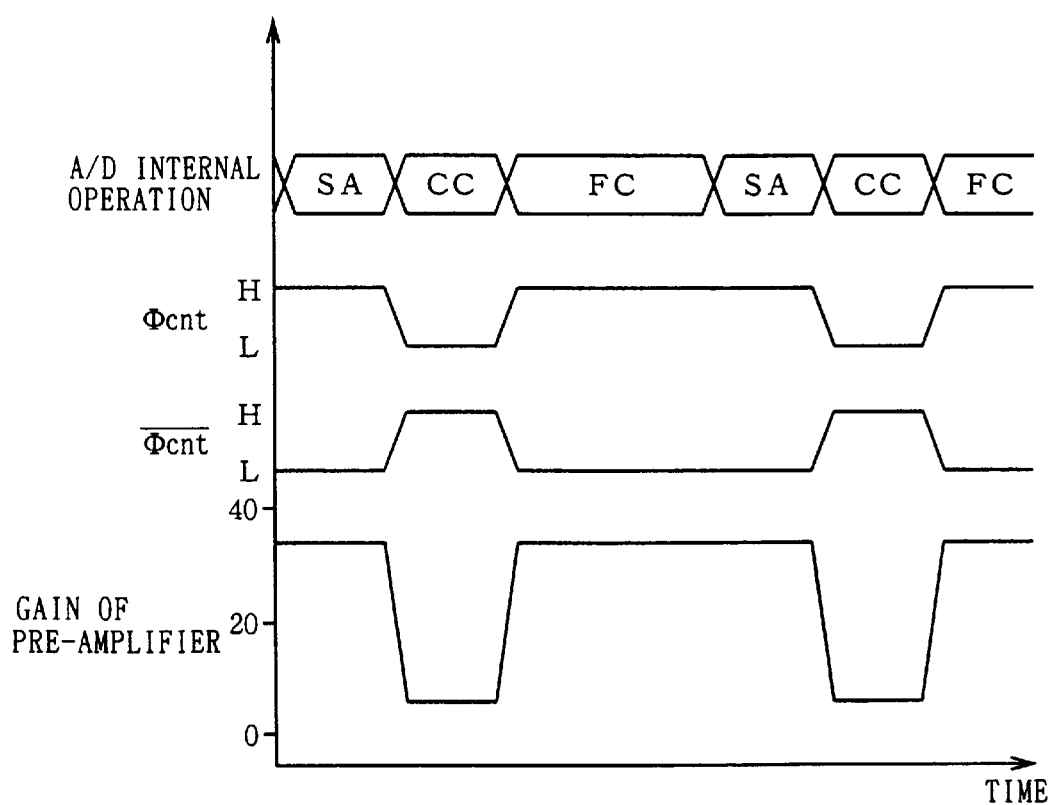
FIG. 3 is a timing chart of operation of the A/D converter of the first preferred embodiment.

In the upper comparison period CC, the clock control signal Φcnt becomes "L" as shown in the timing chart in FIG. 3, and the switch SW1 is turned on. Accordingly, the gain of the gain-variable pre-amplifier of the second preferred embodiment can be expressed by the product of mutual conductance gm of the transistor M3 or M4, and a resistance component with parallel connection of a resistance with the resistance value r between the drain and the source of the transistor M3 or M4 and the resistance 41 or 42 with the resistance value R.

Namely, the gain G1C of the gain-variable pre-amplifier in the upper comparison period CC can be determined by Equation (1) (Equation (2)):

$$G1C = gm \cdot (R // r) \tag{1}$$

$$R // r = \cfrac{1}{\cfrac{1}{R} + \cfrac{1}{r}} \tag{2}$$

On the other hand, in the lower comparison period FF, the clock control signal Φcnt becomes "H", and the switch SW1 is turned off. Accordingly, the gain of the gain-variable pre-amplifier of the second preferred embodiment can be expressed by the product of the mutual conductance gm of the transistor M3 or M4, and the resistance component by parallel connection of "the resistance between the drain and the source of the transistor M3 or M4 (resistance value r)" and "combined series resistance of the resistance 41 or 42 (resistance value R) and the resistance between the drain and the source of the transistor M1 or M2 (resistance value r')".

Namely, the gain G1F of the gain-variable pre-amplifier in the lower comparison period FC is determined by Equation (3) (Equation (4)):

$$G1F = gm \cdot [(R + r') // r] \tag{3}$$

$$(R + r') // r = \cfrac{1}{\cfrac{1}{(R+r')} + \cfrac{1}{r}} \tag{4}$$

Approximately, the gain G1C in the upper comparison period CC equals "gm·R", and the gain G1F in the lower comparison period FC equals "gm·(R+r')". Thus, the gain of the gain-variable pre-amplifier in the upper and the lower comparison periods CC and FC can be appropriately adjusted by adjusting the resistance value r' of the PMOS transistors M1 and M2.

Further, the analog signal processing is also performed in post-stage circuits, such as the folding amplifier group 12, the interpolation circuit 13, and the comparator groups 14 and 24, of the gain-variable pre-amplifier groups 11 and 21 having the gain-variable pre-amplifiers of the second preferred embodiment.

Thus, in each comparison period, when the two input voltages IN1 and IN2 to the gain-variable pre-amplifier are the same in level, the output voltages OUT1 and OUT2 are preferably of the same level (hereinafter referred to as a common-mode output voltage). According to the second preferred embodiment, the common-mode output voltage Ccmn of the gain-variable pre-amplifier can be expressed by Equation (5):

$$Ccmn = Vdd - Vdp - Vdr \tag{5}$$

where Vdd is a source voltage; Vdp is a voltage between the drain and the source of the transistor M1 or M2; and Vdr is a voltage at both ends of the resistance 41 or 42.

When the gain-variable pre-amplifier receives the same two inputs (IN1=IN2), the same current flow through the transistors M1 and M2 and the resistances 41 and 42, and the amount of constant current supplied by the NMOS transistors M5 and M6 is unchanged in the upper and the lower comparison periods. Since the values Vdp and Vdr are the same in the upper and the lower comparison periods, therefore, the common-mode output voltage of the output voltages OUT1 and OUT2 can be set at the same value.

Figure 9:
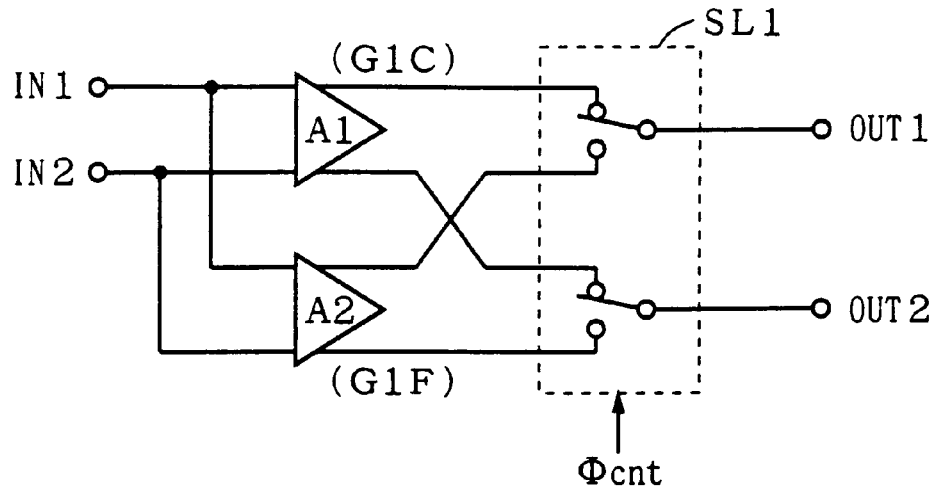
FIGS. 9 and 10 are circuit diagrams illustrating the effect of the second preferred embodiment.
Figure 10:
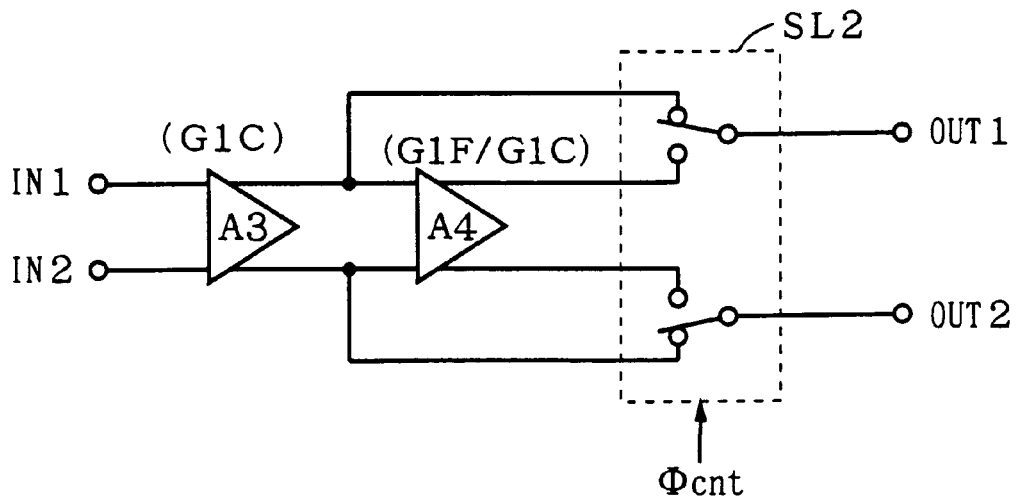

The function of the gain-variable pre-amplifier of the second preferred embodiment, that is, to have a variable gain in the upper and the lower comparison periods CC and FC, is also feasible with a combinational circuit of amplifiers as shown in FIGS. 9 and 10.

A circuit configuration shown in FIG. 9 consists of two amplifiers A1 and A2 each receiving the input voltages IN1 and IN2 as input signals. A gain of the amplifier A1 is set at the same value as the gain G1C by Equation (1), and a gain of the amplifier A2 at the same value as the gain G1F by Equation (3).

A selector SL1 outputs, in the upper comparison period CC, an output of the amplifier A1, and in the lower comparison period, an output of the amplifier A2 FC, as output voltages OUT1 and OUT2 to its post-stage circuits.

A circuit configuration shown in FIG. 10 is another alternative. As shown in FIG. 10, the circuit consists of an amplifier A3 receiving the input voltages IN1 and IN2 and an amplifier A4 receiving two outputs of the amplifier A3 at its two inputs. A gain of the amplifier A3 is set at the same value as the gain G1C by Equation (1), and a gain of the amplifier A4 at a value obtained by multiplying the gain G1F by Equation (3) by the gain G1C by Equation (1).

A selector SL2 outputs, in the upper comparison period CC, an output of the amplifier A3, and in the lower comparison period FC, an output of the amplifier A4, as the output voltages OUT1 and OUT2 to its post-stage circuits.

Requiring two differential amplifiers, however, the circuit configurations shown in FIGS. 9 and 10 present a problem of increasing the number of element circuits.

There is a further problem that as a matter of circuit design, the equalization of the common-mode output voltage reduces flexibility in optimizing the transistor size of each amplifier in each comparison period. Besides, there is another problem of increasing the number of element circuits because the adjustment of the common-mode output voltage may require an additional circuit for adjustment.

As described above, the configurations of the combinational circuits of amplifiers as shown in FIGS. 9 and 10 will increase the number of element circuits because it requires at least two differential amplifiers, will reduce flexibility in circuit design due to the adjustment of the common-mode output voltage, and will further increase the number of element circuits because another circuit is provided for the adjustment of the common-mode output voltage.

On the other hand, since requiring only one differential amplifier to adjust its gain, the gain-variable pre-amplifier of the second preferred embodiment can reduce the number of element circuits. Further, since the common-mode output voltage is unchanged even with the change in gain, the gain-variable pre-amplifier achieves downsizing of the A/D converter as a whole and low power consumption without reducing flexibility in circuit design.

3. Third Preferred Embodiment

Figure 11:
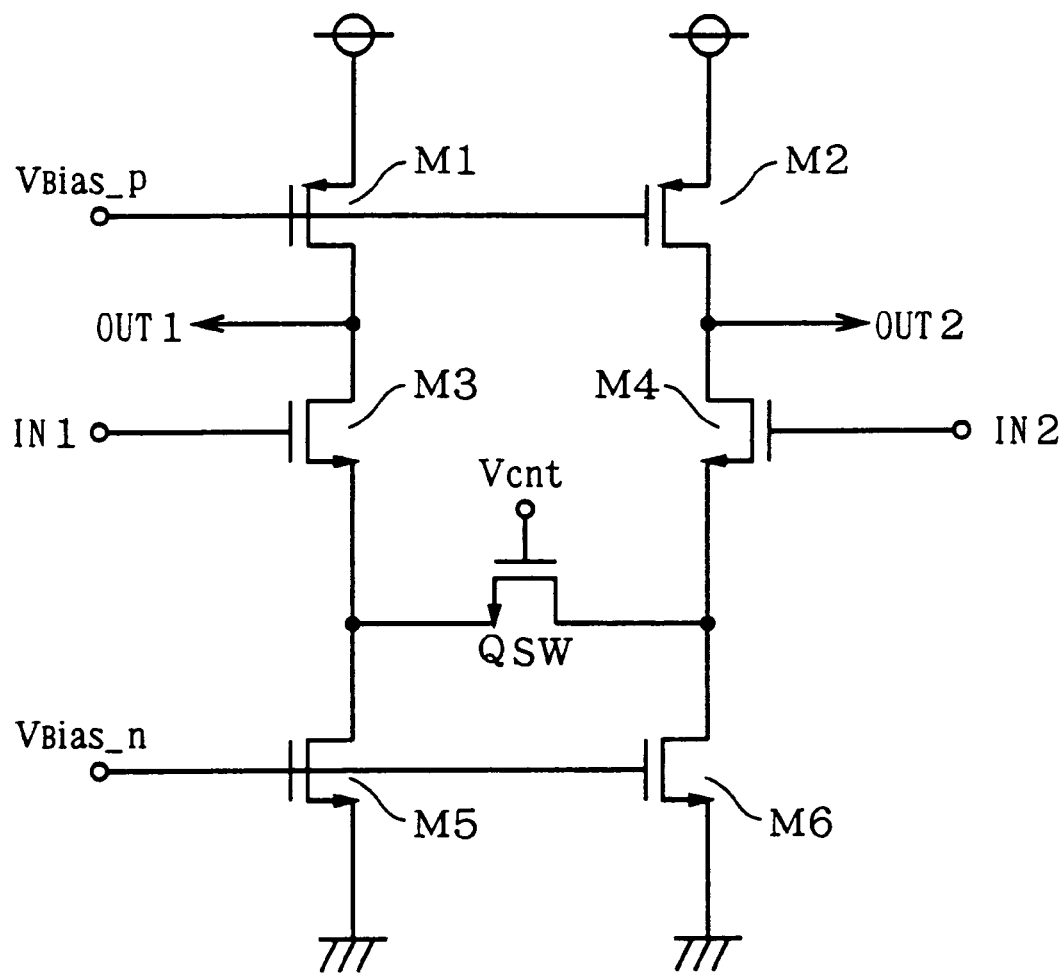
FIG. 11 is a circuit diagram of a structure of a pre-amplifier according to a third preferred embodiment.

A third preferred embodiment is directed to one gain-variable pre-amplifier used in the gain-variable pre-amplifier group 11 (or 21) in the A/D converter of the first preferred embodiment. FIG. 11 is a circuit diagram of a structure of one gain-variable pre-amplifier according to the third preferred embodiment.

As shown in FIG. 11, an NMOS transistor QSW is inserted between sources of NMOS transistors M3 and M4, and a control voltage Vcnt is applied to a gate of the NMOS transistor QSW. The other components (M1 to M6) are the same as those of the second preferred embodiment shown in FIG. 8.

The gain-variable pre-amplifier with such a structure of the third preferred embodiment adjust its gain in accordance with a ON-OFF condition of the NMOS transistor QSW. When an ON resistance value of the NMOS transistor QSW is indicated by rs, and the circuit in FIG. 11 is regarded as an AC equivalent circuit, the gain G2 of the gain-variable pre-amplifier of the third preferred embodiment is determined by Equation (6):

$$G2 = gm \cdot (r' \,//\, r) \cdot \left[1 + \frac{rs}{2} \cdot \frac{gm+r}{r'+r}\right]^{-1} \quad (6)$$

Thus, in the upper and the lower comparison periods CC and FC shown in the timing chart in FIG. 3, the gain of the gain-variable pre-amplifier is appropriately adjustable by adjusting the value of the control voltage Vcnt to change the resistance value rs of the NMOS transistor QSW.

Further, a common-mode output voltage Ccmn' of the gain-variable pre-amplifier of the third preferred embodiment, determined by Equation (7), is the same in the upper and the lower comparison periods because the amount of constant current supplied by the NMOS transistors M5 and M6 is unchanged in those periods.

$$Ccmn' = Vdd - Vdp \quad (7)$$

Since requiring only one differential amplifier to adjust its gain, the gain-variable pre-amplifier with such a structure of the third preferred embodiment can reduce the number of element circuits, like the pre-amplifier of the second preferred embodiment. Further, since the common-mode output voltage is unchanged even with the change in gain, the gain-variable pre-amplifier achieves downsizing of the A/D converter as a whole and low power consumption without reducing flexibility in circuit design.

4. Fourth Preferred Embodiment

Figure 12:
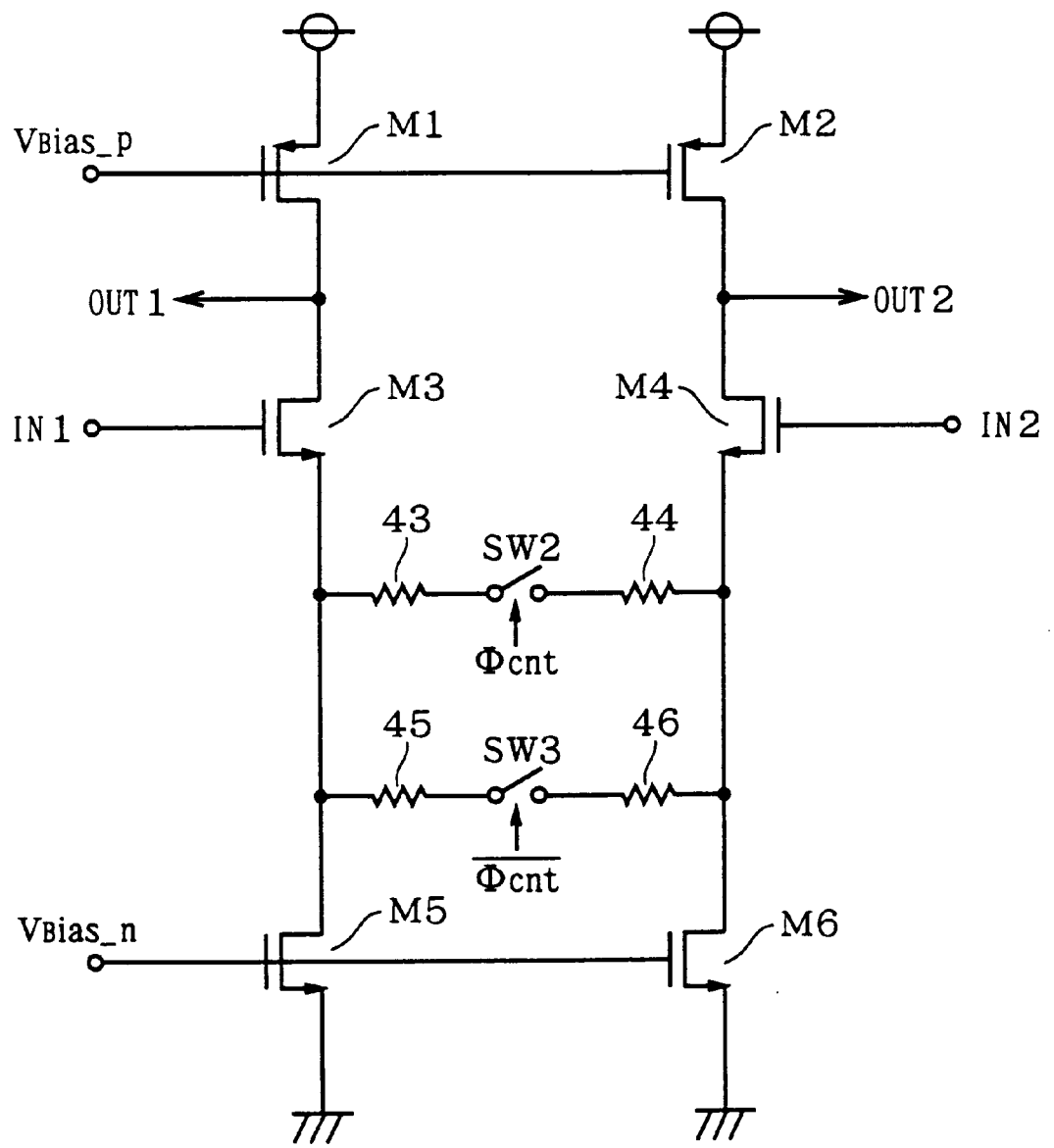
FIG. 12 is a circuit diagram of a structure of a pre-amplifier according to a fourth preferred embodiment.

A fourth preferred embodiment is directed to one gain-variable pre-amplifier used in the gain-variable pre-amplifier group 11 (or 21) in the A/D converter of the first preferred embodiment. FIG. 12 is a circuit diagram of a structure of one gain-variable pre-amplifier according to the fourth preferred embodiment.

As shown in FIG. 12, a set of a resistance 43, a switch SW2 and a resistance 44, and a set of a resistance 45, a switch SW3, and a resistance 46 are connected in parallel with each other between sources of NMOS transistors M3 and M4.

Resistance values of the resistances 43 and 44 are indicated by rs', and resistance values of the resistances 45 and 46 by rs". Further, the switch SW2 is turned on or off according to a "L"-"H" condition of the clock control signal Φcnt, while the switch SW3 is turned on or off according to a "L"-"H" condition of the reverse clock control signal $\overline{\Phi cnt}$. The other components (M1 to M6) are the same as those of the second preferred embodiment shown in FIG. 8.

The gain-variable pre-amplifier with such a structure adjusts its gain in accordance with ON-OFF conditions of the switches SW2 and SW3. In the upper comparison period CC shown in the timing chart in FIG. 3, the clock control signal Φcnt turns on the switch SW2, and the reverse control signal $\overline{\Phi cnt}$ turns off the switch SW3. Then, in the lower comparison period FC, the switch SW3 is turned on, and the switch SW2 is turned off.

Thus, in the fourth preferred embodiment, a gain G3C of the gain-variable pre-amplifier in the upper comparison period CC is determined by Equation (8):

$$G3C = gm \cdot (r' \,//\, r) \cdot \left[1 + rs' \cdot \frac{gm+r}{r'+r}\right]^{-1} \quad (8)$$

On the other hand, a gain G3F of the gain-variable pre-amplifier in the lower comparison period FC is determined by Equation (9):

$$G3F = gm \cdot (r' \,//\, r) \cdot \left[1 + rs'' \cdot \frac{gm+r}{r'+r}\right]^{-1} \quad (9)$$

Therefore, the gain of the gain-variable pre-amplifier of the fourth preferred embodiment is adjustable to its optimum value in each comparison period, by adjusting the resistance values rs' of the resistances 43 and 44 and the resistance values rs" of the resistances 45 and 46.

Further, a common-mode output voltage Ccmn' of the gain-variable pre-amplifier of the fourth preferred embodiment is also determined by Equation (7) as that of the third preferred embodiment, which is unchanged in the upper and the lower comparison periods.

Since requiring only one differential amplifier to adjust its gain, the gain-variable pre-amplifier with such a structure of the fourth preferred embodiment can reduce the number of element circuits, like the gain-variable pre-amplifier of the third preferred embodiment. Further, since the common-mode output voltage is unchanged even with the change in gain, the gain-variable pre-amplifier achieves downsizing of the A/D converter as a whole and low power consumption without reducing flexibility in circuit design.

5. Fifth Preferred Embodiment

A fifth preferred embodiment is directed to one gain-variable pre-amplifier used in the gain-variable pre-amplifier group 11 (or 21) in the A/D converter of the first preferred embodiment. FIG. 13 is a circuit diagram of a structure of one gain-variable pre-amplifier according to a fifth preferred embodiment.

As shown in FIG. 13, a source of an NMOS transistor M3 is connected via a switch SW4 to a drain of an NMOS transistor M7 which is a first constant-current supply portion, while a source of an NMOS transistor M4 is connected via a switch SW5 to a drain of an NMOS transistor M8 which is a second constant-current supply portion.

The NMOS transistor M7 receives a bias voltage VBias_c at its gate, and is grounded at its source. The NMOS transistor M8 receives a bias voltage VBias_f at its gate, and is grounded at its source.

Further, the switch SW4 is turned on or off according to a "L"-"H" condition of the clock control signal Φcnt, while the switch SW5 is turned on or off according to a "L"-"H" condition of the reverse clock control signal $\overline{\Phi cnt}$. The other components (M1 to M4) are the same as those of the second preferred embodiment shown in FIG. 8.

The gain-variable pre-amplifier with such a structure of the fifth preferred embodiment adjusts its gain in accordance with ON-OFF conditions of the switches SW4 and SW5. In the upper comparison period CC shown in the timing chart in FIG. 3, the clock control signal Φcnt turns on the switch SW4, and the reverse control signal $\overline{\Phi cnt}$ turns off the switch SW5. Then, in the lower comparison period FC, the switch SW5 is turned on, and the switch SW4 is turned off.

Thus, in the fifth preferred embodiment, a gain G4 of the gain-variable pre-amplifier is determined by Equation (10):

$$G4 = gm \cdot (r'//r) \quad (10)$$

However, mutual conductance gm of the NMOS transistors M3 and M4 vary according to a current Ic flowing through the transistor M7 or a current If flowing through the transistor M8, respectively. Namely, in the fifth preferred embodiment, mutual conductance gmc of the gain-variable pre-amplifier in the upper comparison period CC is determined by Equation (11):

$$gmc = \sqrt{\beta \cdot Ic} \quad (11)$$

where β is a parameter determined by the shape of a gate electrode of the transistor M7 or M8, or more specifically, determined by: $\beta = C_0 x \cdot \mu 0 \cdot (W/L)$ where $C_0 x$ is gate capacity; $\mu 0$ is carrier mobility; W is a gate width; and L is a gate length.

On the other hand, mutual conductance gmf of the gain-variable pre-amplifier in the lower comparison period FC is determined by Equation (12):

$$gmf = \sqrt{\beta \cdot If} \quad (12)$$

Therefore, in the upper and the lower comparison periods, the gain-variable pre-amplifier of the fifth preferred embodiment can adjust its gain to an optimum value with the currents Ic and If, by adjusting the bias voltages VBias_c and VBias_f applied to the NMOS transistors M7 and M8, respectively.

Since requiring only one differential amplifier to adjust its gain, the gain-variable pre-amplifier with such a structure of the fifth preferred embodiment can reduce the number of element circuits, thereby achieving downsizing of the A/D converter as a whole and low power consumption.

6. Sixth Preferred Embodiment

Figure 14:
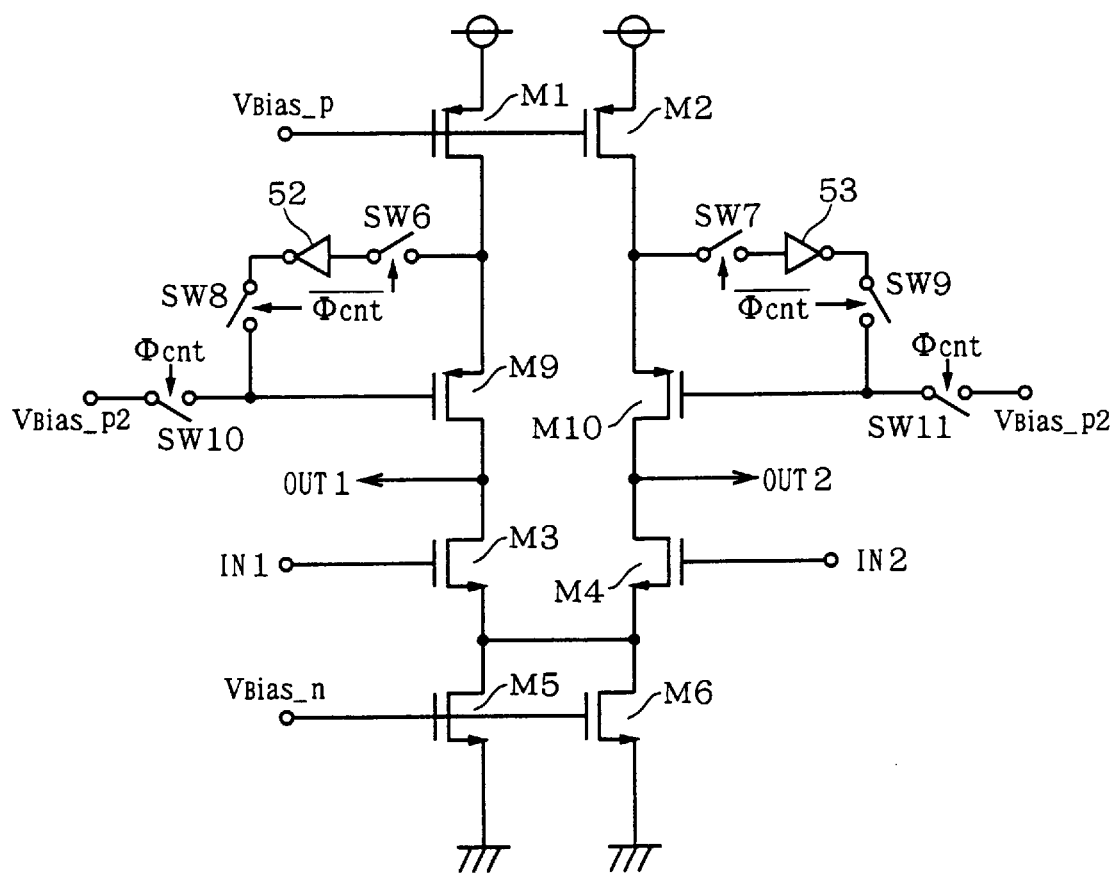
FIG. 14 is a circuit diagram of a structure of a pre-amplifier according to a sixth preferred embodiment.

A sixth preferred embodiment is directed to one gain-variable pre-amplifier used in the gain-variable pre-amplifier group 11 (or 21) in the A/D converter of the first preferred embodiment. FIG. 14 is a circuit diagram of a structure of one gain-variable pre-amplifier according to the sixth preferred embodiment.

As shown in FIG. 14, a PMOS transistor M9 is inserted between a PMOS transistor M1 and an NMOS transistor M3, and a PMOS transistor M10 is inserted between a PMOS transistor M2 and an NMOS transistor M4.

The PMOS transistor M9 is connected at its source via a switch SW6 to an input of an inverter (reverse amplifier) 52. Further, at its gate, the PMOS transistor M9 is connected via a switch SW8 to an output of the inverter 52, and receives a bias voltage VBias_p2 via a switch SW10.

On the other hand, the PMOS transistor M10 is connected at its source via a switch SW7 to an input of an inverter (reverse amplifier) 53. Further, at its gate, the PMOS transistor M10 is connected via a switch SW9 to an output of the inverter 53, and receives the bias voltage VBias_p2 via a switch SW11. In application, the bias voltage VBias_p2 is set to an enough level to turn on the PMOS transistors M9 and M10.

Mutual conductance, and a resistance value between the drain and the source, of the transistor M27 or M28 are indicated by gm' and by r", respectively, and gains of the inverters 52 and 53 are indicated by GA.

The switches SW10 and SW11 are turned on or off according to a "L"-"H" condition of the clock control signal Φcnt, while the switches SW6 to SW9 are turned on or off according to a "L"-"H" condition of the reverse clock control signal $\overline{\Phi cnt}$. The other components (M1 to M6) are the same as those of the second preferred embodiment shown in FIG. 8.

The gain-variable pre-amplifier with such a structure adjusts its gain in accordance with ON-OFF conditions of the switches SW6 to SW11. In the upper comparison period CC shown in the timing chart in FIG. 3, the clock control signal Φcnt turns on the switches SW10 and SW11, and the reverse control signal $\overline{\Phi cnt}$ turns off the switches SW6 to SW9. Then, in the lower comparison period FC, the switches SW6 to SW9 are turned on, and the switches SW10 and SW11 are turned off.

Thus, in the sixth preferred embodiment, a gain G5C of the gain-variable pre-amplifier in the upper comparison period CC is determined by Equation (13):

$$G5C = gm \cdot [(r' + r'') // r] \quad (13)$$

On the other hand, a gain G5F of the gain-variable pre-amplifier in the lower comparison period FC is determined by Equation (14) (Equation (15)):

$$G5F = gm \cdot [(r' + r'' \cdot G') // r] \quad (14)$$

$$G' = gm' \cdot r'' \cdot (GA + 1) + 1 \quad (15)$$

Therefore, in the upper and the lower comparison periods, the gain of the gain-variable pre-amplifier of the sixth preferred embodiment is adjustable to its optimum value by adjusting the bias voltage VBias_p2 and the gains GA of the inverters 52 and 53.

Further, a common-mode output voltage Ccmn' of the gain-variable pre-amplifier of the sixth preferred embodiment is expressed by Equation (7) as that of the third preferred embodiment, which is unchanged in the upper and the lower comparison periods.

Since requiring only one differential amplifier to adjust its gain, the gain-variable pre-amplifier with such a structure of the sixth preferred embodiment can reduce the number of element circuits, like the gain-variable pre-amplifier of the fourth preferred embodiment. Further, since the common-mode output voltage is unchanged even with the change in gain, the gain-variable pre-amplifier achieves downsizing of the A/D converter as a whole and low power consumption without reducing flexibility in circuit design.

7. Seventh Preferred Embodiment

Figure 15:
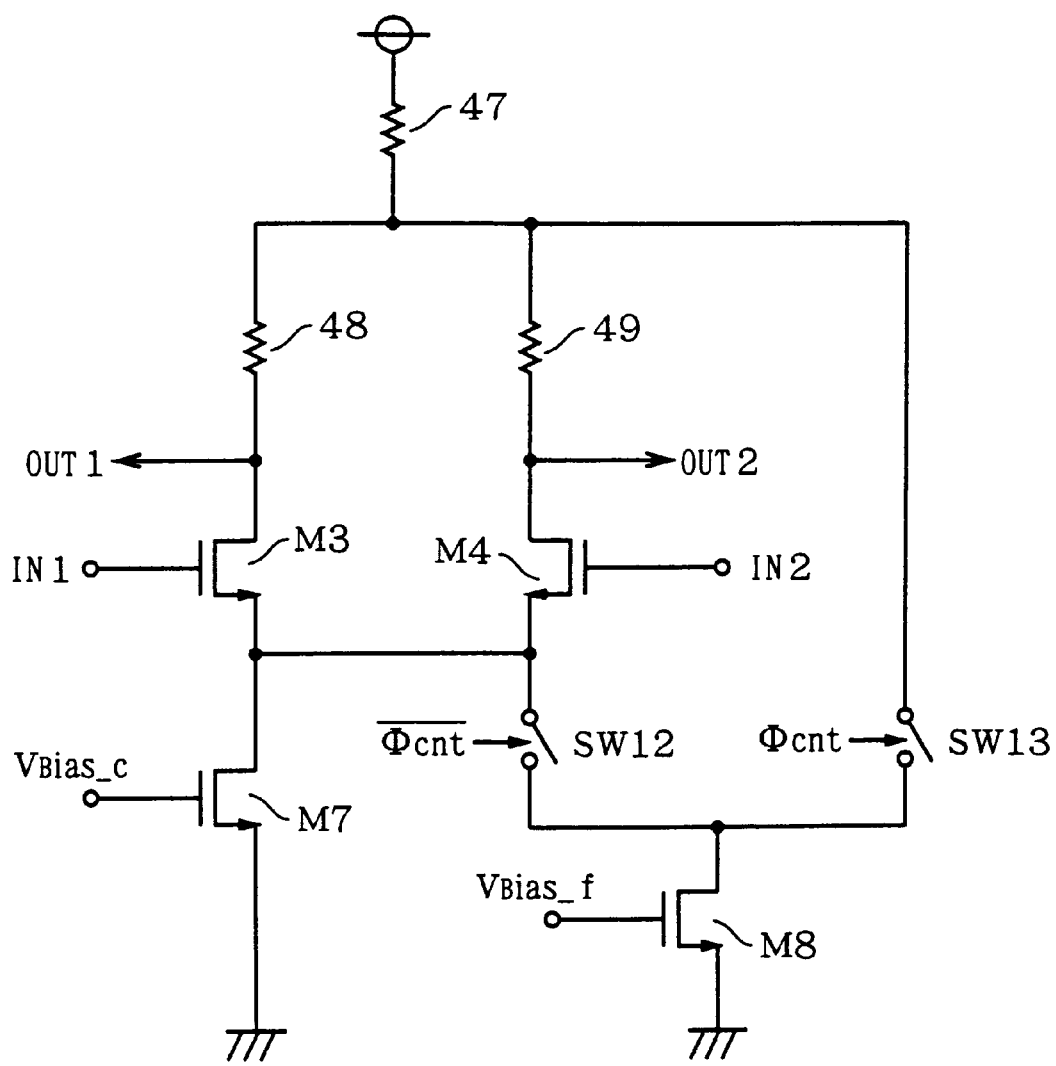
FIG. 15 is a circuit diagram of a structure of a pre-amplifier according to a seventh preferred embodiment.

A seventh preferred embodiment is directed to one gain-variable pre-amplifier used in the gain-variable pre-amplifier group 11 (or 21) in the A/D converter of the first preferred embodiment. FIG. 15 is a circuit diagram of a structure of one gain-variable pre-amplifier according to a seventh preferred embodiment.

As shown in FIG. 15, a resistance 47 (resistance value R7) is connected at its one end to a power supply VDD, and at its other end to both one ends of resistances 48 (resistance value R89) and 49 (resistance value R89). The resistance 48 is connected at its other end to a drain of an NMOS transistor M3, and the resistance 49 is connected at its other end to a drain of an NMOS transistor M4.

The NMOS transistors M3 and M4 form a differential pair. The NMOS transistor M3 receives an input voltage IN1 at its gate, and is connected at its source to a drain of an NMOS transistor M7. On the other hand, the NMOS transistor M4 receives an input voltage IN2 at is gate, and is connected at its source via a switch SW12 to a drain of an NMOS transistor M8 via a switch SW12. Further, the NMOS transistors M3 and M4 are short-circuited between their sources.

The NMOS transistor M7 receives a bias voltage VBias_c at its gate, and is grounded at its source. The NMOS transistor M8 receives a bias voltage VBias_f at its gate, and is grounded at its source. Further, the other end of the resistance 47 is connected via a switch SW13 to the drain of the NMOS transistor M8.

Further, the switch SW12 is turned on or off according to a "L"-"H" condition of the reverse clock control signal Φcnt, while the switch SW13 is turned on or off according to a "L"-"H" condition of the clock control signal Φcnt.

The gain-variable pre-amplifier with such a structure of the seventh preferred embodiment amplifies a potential difference between the input voltages IN1 and IN2, and outputs output voltages OUT1 and OUT2 from the drains of the NMOS transistors M3 and M4, respectively.

At this time, the gain-variable pre-amplifier adjusts its gain according to ON-OFF conditions of the switches SW12 and SW13. In the upper comparison period CC shown in the timing chart in FIG. 3, the clock control signal Φcnt turns on the switch SW13, and the reverse control signal $\overline{\Phi cnt}$ turns off the switch SW12. Then, in the lower comparison period FC, the switch SW12 is turned on, and the switch SW13 is turned off.

Thus, a gain G6 of the gain-variable pre-amplifier of the seventh preferred embodiment is determined by Equation (16):

$$G6 = gm \cdot (R//r) \quad (16)$$

However, mutual conductance gm of the NMOS transistors M3 and M4 vary according to a current Ic flowing through the transistor M7 and a current If flowing through the transistor M8, respectively. Namely, in the seventh preferred embodiment, mutual conductance gmc of the gain-variable pre-amplifier in the upper comparison period CC is determined by Equation (17) which is the same as Equation (11) of the fifth preferred embodiment:

$$gmc = \sqrt{\beta \cdot Ic} \quad (17)$$

On the other hand, mutual conductance gmf' of the gain-variable pre-amplifier in the lower comparison period FC is determined by Equation (18):

$$gmf' = \sqrt{\beta \cdot (Ic + If)} \quad (18)$$

Therefore, in the upper and the lower comparison periods, the gain of the gain-variable pre-amplifier of the seventh preferred embodiment is adjustable to its optimum value by adjusting the NMOS transistor 7 and the bias voltages VBias_c and VBias_f.

Further, a common-mode output voltage Ccmn2 of the gain-variable pre-amplifier of the seventh preferred embodiment is determined by Equation (19):

$$Ccmn2 = Vdd - R7 \cdot (Ic + If) - R89 \cdot I \quad (19)$$

where Vdd is a source voltage; and I equals Ic/2 in the upper comparison period CC and (Ic+If)/2 in the lower comparison period.

Therefore, the resistance value R7 of the resistance 47 larger than the resistance values 89 of the resistances 48 and 49 reduces variation of the common-mode output voltage Ccmn2 in each comparison period. Further, the reduction in variation of the common-mode output voltage Ccmn2 requires only the resistance 47 and the switch SW13.

Since requiring only one differential amplifier to adjust its gain, the gain-variable pre-amplifier with such a structure of the seventh preferred embodiment can reduce the number of element circuits. Further, since the common-mode output voltage is almost unchanged in level even with the change in gain, the gain-variable pre-amplifier achieves downsizing of the A/D converter as a whole and low power consumption without reducing flexibility in circuit design.

8. Eighth Preferred Embodiment

Figure 16:
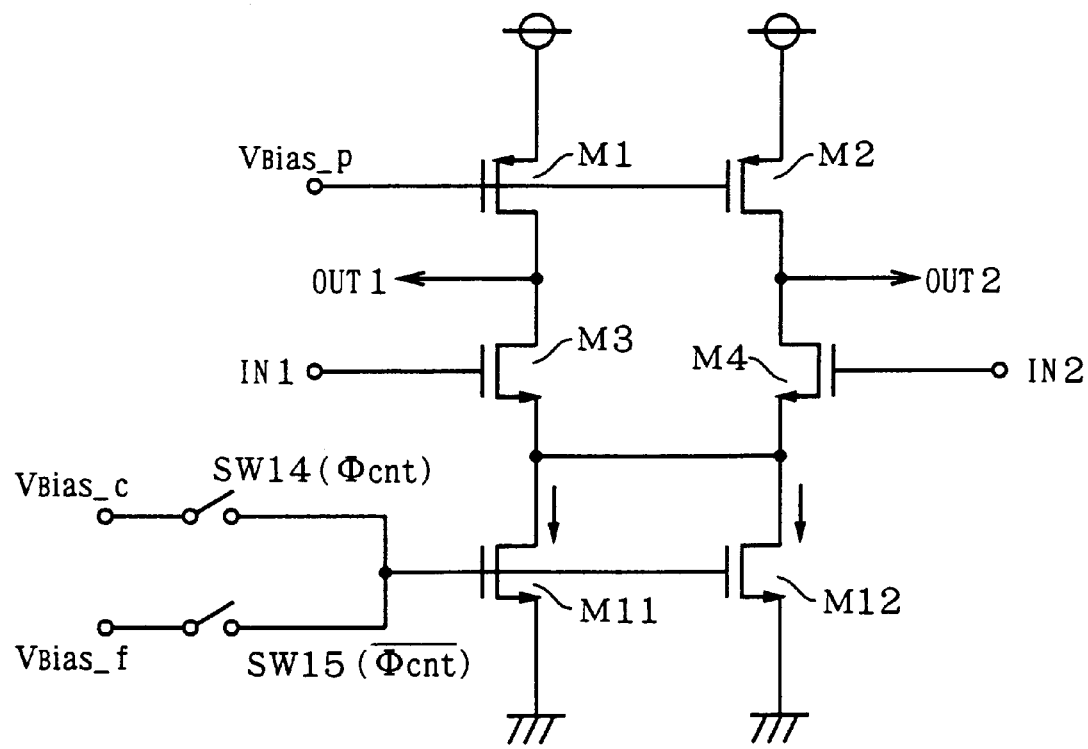
FIG. 16 is a circuit diagram of a structure of a pre-amplifier according to an eight preferred embodiment.

An eighth preferred embodiment is directed to one gain-variable pre-amplifier used in the gain-variable pre-amplifier group 11 (or 21) in the A/D converter of the first preferred embodiment. FIG. 16 is a circuit diagram of a structure of one gain-variable pre-amplifier according to the eighth preferred embodiment.

As shown in FIG. 16, an NMOS transistor M11 which is one of constant-current supply portions, is connected at is drain to a source of an NMOS transistor M3, and is grounded at its source. An NMOS transistor M12 which is the other of constant-current supply portions is connected at its drain to a source of an NMOS transistor M4, and grounded at its source.

At their gates, the NMOS transistor M11 and M12 receive a bias voltage VBias_c via a switch SW14, and receives a bias voltage VBias_f via a switch SW15. The NMOS transistors M11 and M12 are of the same size.

Further, the switch SW14 is turned on or off according to a "L"-"H" condition of the clock control signal Φcnt, while the switch SW15 is turned on or off according to a "L"-"H" condition of the reverse clock control signal $\overline{\Phi cnt}$. The other components (M1 to M4) are the same as those of the second preferred embodiment shown in FIG. 8.

The gain-variable pre-amplifier with such a structure of the eighth preferred embodiment adjusts its gain in accordance with ON-OFF conditions of the switches SW14 and SW15. In the upper comparison period CC shown in the timing chart in FIG. 3, the clock control signal Φcnt turns on the switch SW14, and the reverse control signal $\overline{\Phi cnt}$ turns off the switch SW15. Then, in the lower comparison period FC, the switch SW15 is turned on, and the switch SW14 is turned off.

Thus, a gain G7 of the gain-variable pre-amplifier of the eighth preferred embodiment is determined by Equation (20):

$$G7 = gm \cdot (r'//r) \quad (20)$$

Mutual conductance gm of the NMOS transistors M3 and M4 vary according to a current I flowing through the transistors M11 and M12, respectively. Namely, mutual conductance gm of the gain-variable pre-amplifier of the eighth preferred embodiment is determined by Equation (21):

$$gm = \sqrt{2 \cdot \beta \cdot I} \quad (21)$$

where β is a parameter determined by the shape of a gate electrode of the transistor M11 or M12 as previously described.

At this time, the current I flowing through the NMOS transistors M1 and M12 in the application of the bias voltage VBias_c is a current Ic, and the current I flowing through the NMOS transistors M11 and M12 in the application of the bias voltage VBias_f is a current If.

Therefore, in the upper and the lower comparison periods, the gain of the gain-variable pre-amplifier of the eighth preferred embodiment is adjustable to its optimum value by adjusting the bias voltages VBias_c and VBias_f of the NMOS transistors M11 and M12.

Since requiring only one differential amplifier to adjust its gain, the gain-variable pre-amplifier with such a structure of the eighth preferred embodiment can reduce the number of element circuits, thereby achieving downsizing of the A/D converter as a whole and low power consumption.

9. Ninth Preferred Embodiment

Figure 17:
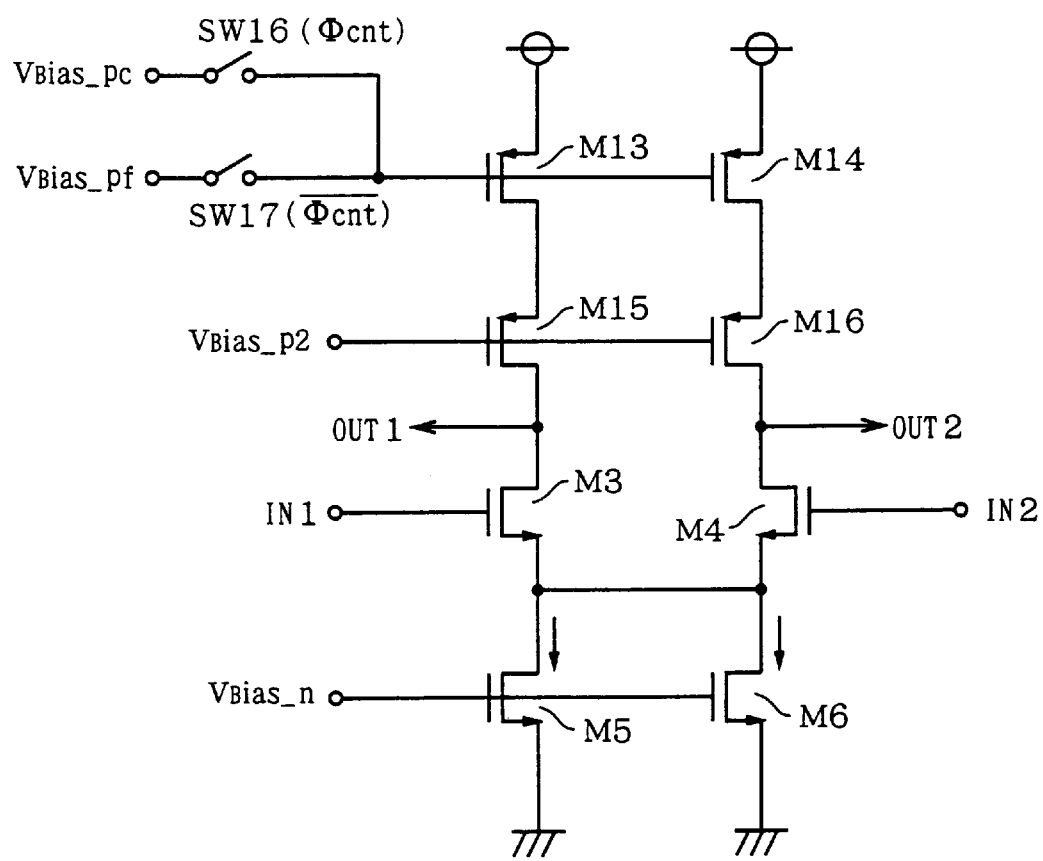
FIG. 17 is a circuit diagram of a structure of a pre-amplifier according to a ninth preferred embodiment.

A ninth preferred embodiment is directed to one gain-variable pre-amplifier used in the gain-variable pre-amplifier group 11 (or 21) in the A/D converter of the first preferred embodiment. FIG. 17 is a circuit diagram of a structure of one gain-variable pre-amplifier according to the ninth preferred embodiment.

As shown in FIG. 17, PMOS transistors M13 and M15 are connected in series between a power supply VDD and a drain of an NMOS transistor M3, while PMOS transistors M14 and M16 are connected in series between the power supply VDD and a drain of an NMOS transistor M4.

At their gates, the NMOS transistor M13 and M14 receive a bias voltage VBias_pc via a switch SW16, and receives a bias voltage VBias_pf via a switch SW17. Further, the PMOS transistors M15 and M16 receive a bias voltage VBias_p2 at their gates. The PMOS transistors M13 and M14 are of the same size, while the PMOS transistors M15 and M16 are of the same size.

Further, the switch SW16 is turned on or off according to a "L"-"H" condition of the clock control signal Φcnt, while the switch SW17 is turned on or off according to a "L"-"H" condition of the reverse clock control signal $\overline{\Phi cnt}$. The other components (M3 to M6) are the same as those of the second preferred embodiment shown in FIG. 8.

The gain-variable pre-amplifier with such a structure of the ninth preferred embodiment adjusts its gain in accordance with ON-OFF conditions of the switches SW16 and SW17. In the upper comparison period CC shown in the timing chart in FIG. 3, the clock control signal Φcnt turns on the switch SW16, and the reverse control signal $\overline{\Phi cnt}$ turns off the switch SW17. Then, in the lower comparison period FC, the switch SW17 is turned on, and the switch SW16 is turned off.

When a resistance value between source and drain of the transistor M13 or M14 is indicated by rs'; mutual conductance of the transistor M15 or M16 by gm'; a reverence value between drain and source of the transistor M15 or M16 by r"; and the circuit in FIG. 17 is regarded as an AC equivalent circuit, a gain G8 of the gain-variable pre-amplifier of the ninth preferred embodiment is determined by Equation (22):

$$G8 = gm \cdot [r'' + r' \cdot (1 + gm' \cdot r'')//r] \quad (22)$$

Therefore, in the upper and lower comparison periods CC and FC, the gain of the gain-variable pre-amplifier is adjustable to its optimum value by adjusting the resistance values r" of the NMOS transistors M13 and M14 by means of the bias voltages VBias_pc and VBias_pf.

Further, a common-mode output voltage Ccmn3 of the gain-variable pre-amplifier of the ninth preferred embodiment is determined by a current I flowing through the transistors M5 or M6 which is determined by a bias voltage VBias_n. This is expressed by Equation (23).

$$Ccmn3 = Vdd - (r' + r'') \cdot I \quad (23)$$

Therefore, the resistance value r" between the drains and the sources of the transistors M15 and M16, larger than the resistance value r' between the drains and the sources of the transistors M13 and M14, allows the influence of variations of the resistance value r' on the common-mode output voltage Ccmn3 to be reduced in the upper and the lower comparison periods. As evident from Equation (23), in each comparison period, the gain variable amplifier of the ninth preferred embodiment can sufficiently ensure its optimum gain even with small variations of the resistance value r', because the influence of the variations of the resistance value r' on the gain G8 multiplies (1+gm'·r") times.

Since requiring only one differential amplifier to adjust its gain, the gain-variable pre-amplifier with such a structure of the ninth preferred embodiment can reduce the number of element circuits. Further, since the common-mode output voltage is almost unchanged even with the change in gain, the gain-variable pre-amplifier achieves downsizing of the A/D converter as a whole and low power consumption without reducing flexibility in circuit design.

10. Tenth Preferred Embodiment

Figure 18:
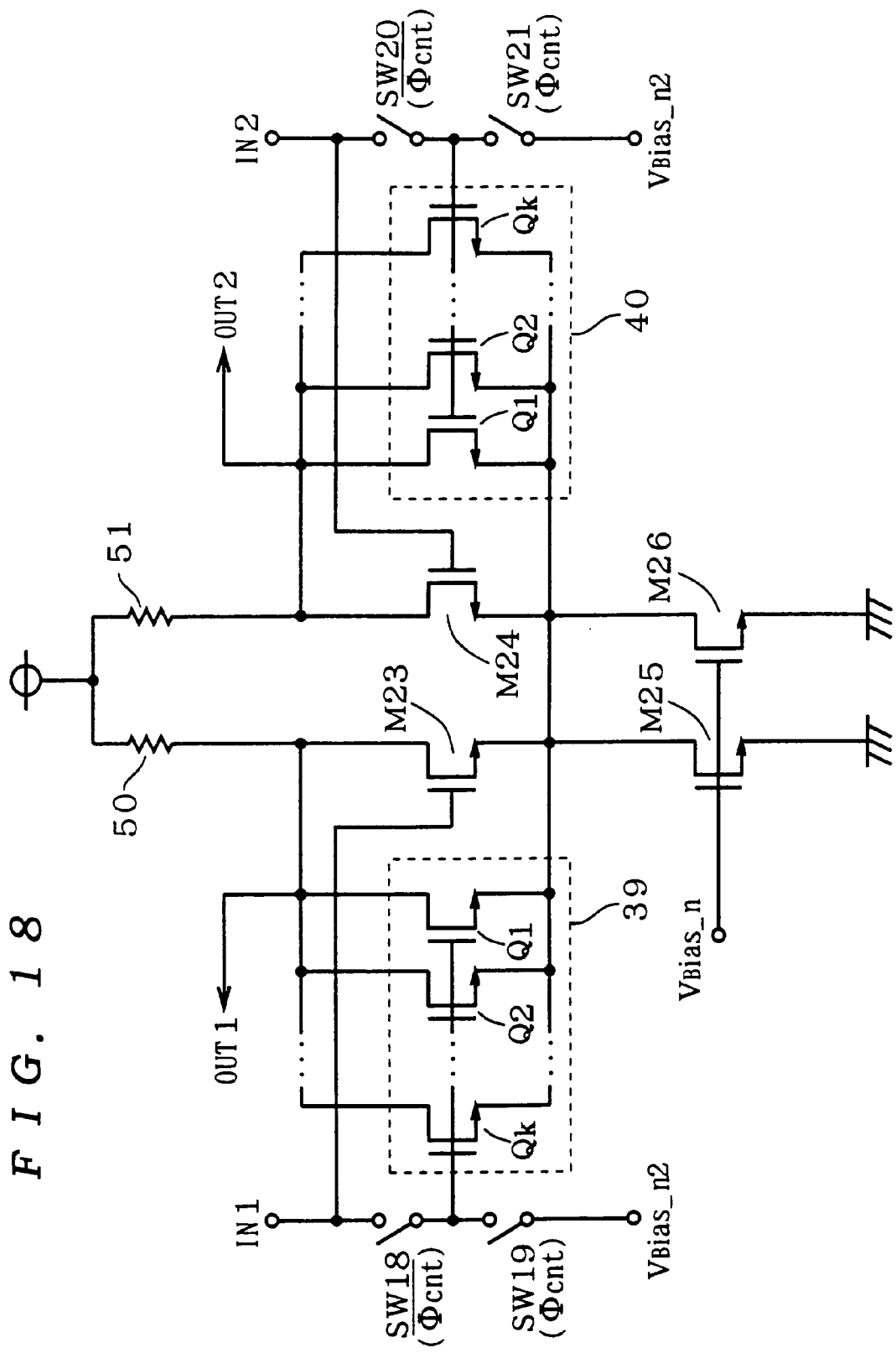
FIG. 18 is a circuit diagram of a structure of a pre-amplifier according to a tenth preferred embodiment.

A tenth preferred embodiment is directed to one gain-variable pre-amplifier used in the gain-variable pre-amplifier group 11 (or 21) in the A/D converter of the first preferred embodiment. FIG. 18 is a circuit diagram of a structure of one gain-variable pre-amplifier according to the tenth preferred embodiment.

As shown in FIG. 18, resistances 50 and 51 (both having a resistance value R) are connected at their one ends to a power supply VDD. Further, the resistance 50 is connected at its other end to a drain of an NMOS transistor M23, while the resistance 51 is connected at its other end to a drain of an NMOS transistor M24.

The NMOS transistors M23 and M24 which are output control transistors form a differential pair. The NMOS transistor M23 receives an input voltage IN1 at its gate, and is connected at its source to a drain of an NMOS transistor M25. On the other hand, the NMOS transistor M24 receives an input voltage IN2 at is gate, and is connected at its source to a drain of an NMOS transistor M26. Further, the NMOS transistors M23 and M24 are short-circuited between their sources.

In parallel with the NMOS transistor 23 connected is a transistor group 39 consisting of NMOS transistors Q1 to Qk (k≧1). At their gates, the NMOS transistors Q1 to Qk in the transistor group 39 receive the common input voltage IN1 via a switch SW18, and receive a bias voltage VBias__n2 via a switch 19.

In parallel with the NMOS transistor 24 connected is a transistor group 40 consisting of NMOS transistors Q1 to Qk (k≧1) like the transistor group 39. At their gates, the NMOS transistors Q1 to Qk in the transistor group 40 receive the input voltage IN2 commonly via a switch SW20, and receive the bias voltage VBias__n2 via a switch 21.

In application, the bias voltage VBias__n2 is set so that the respective NMOS transistors Q1 to Qk in the transistor groups 39 and 40 are to be in their OFF state.

The NMOS transistors M25 and M26 which are constant-current supply portions receive a common bias voltage VBias__n at their gates, and are grounded at their sources. The NMOS transistors M23 and M24 are of the same size. Further, the bias voltage VBias__n is set so that the NMOS transistors M25 and M26 are to be always in their ON state.

Further, the switches SW19 and SW21 are turned on or off according to a "L"-"H" condition of the clock control signal Φcnt, while the switches SW18 and SW20 are turned on or off according to a "L"-"H" condition of the reverse clock control signal $\overline{\Phi cnt}$.

In the gain-variable pre-amplifier with such a structure of the tenth preferred embodiment, in the upper comparison period CC, the switches SW19 and SW21 are turned on and the switches SW18 and 20 are turned off. Thus, a gain G9C in the upper comparison period is determined by Equation (24):

$$G9C = gm \cdot (R//r) \quad (24)$$

where gm is mutual conductance of the NMOS transistor M23 and M24 and r is a resistance value between the drains and the sources of the NMOS transistor M23 and M24.

On the other hand, in the lower comparison period FC, the switches SW18 and SW20 are turned on, and the switches SW19 and SW21 are turned off. Thus, a gain G9F in the lower comparison period is determined by Equation (25):

$$G9F = (gm + gm''') \cdot (R//r//r''') \quad (25)$$

where gm''' is a combined mutual conductance of the NMOS transistors Q1 to Qk in the transistor groups 39 and 40, and r''' is a combined resistance value between the drains and the sources of the transistors Q1 to Qk.

Therefore, in the upper and the lower comparison periods CC and FC shown in the timing chart in FIG. 3, the gain of the gain-variable pre-amplifier is adjustable to its optimum value by adjusting the mutual conductance gm of the NMOS transistors M23 and M24 and the combined mutual conductance gm''' of the transistor groups 39 and 40.

Further, a common-mode output voltage Ccmn4 of the gain-variable pre-amplifier of the tenth preferred embodiment is determined by Equation (26), which is the same in the upper and the lower comparison periods because the amount of constant current I supplied by the NMOS transistors M25 and M26 is unchanged in those periods.

$$Ccmn4 = Vdd - R \cdot I \quad (26)$$

Since requiring only one differential amplifier to adjust its gain, the gain-variable pre-amplifier with such a structure of the tenth preferred embodiment can reduce the number of element circuits. Further, since the common-mode output voltage is almost unchanged even with the change in gain, the gain-variable pre-amplifier achieves downsizing of the A/D converter as a whole and low power consumption without reducing flexibility in circuit design.

11. Eleventh Preferred Embodiment

Figure 19:
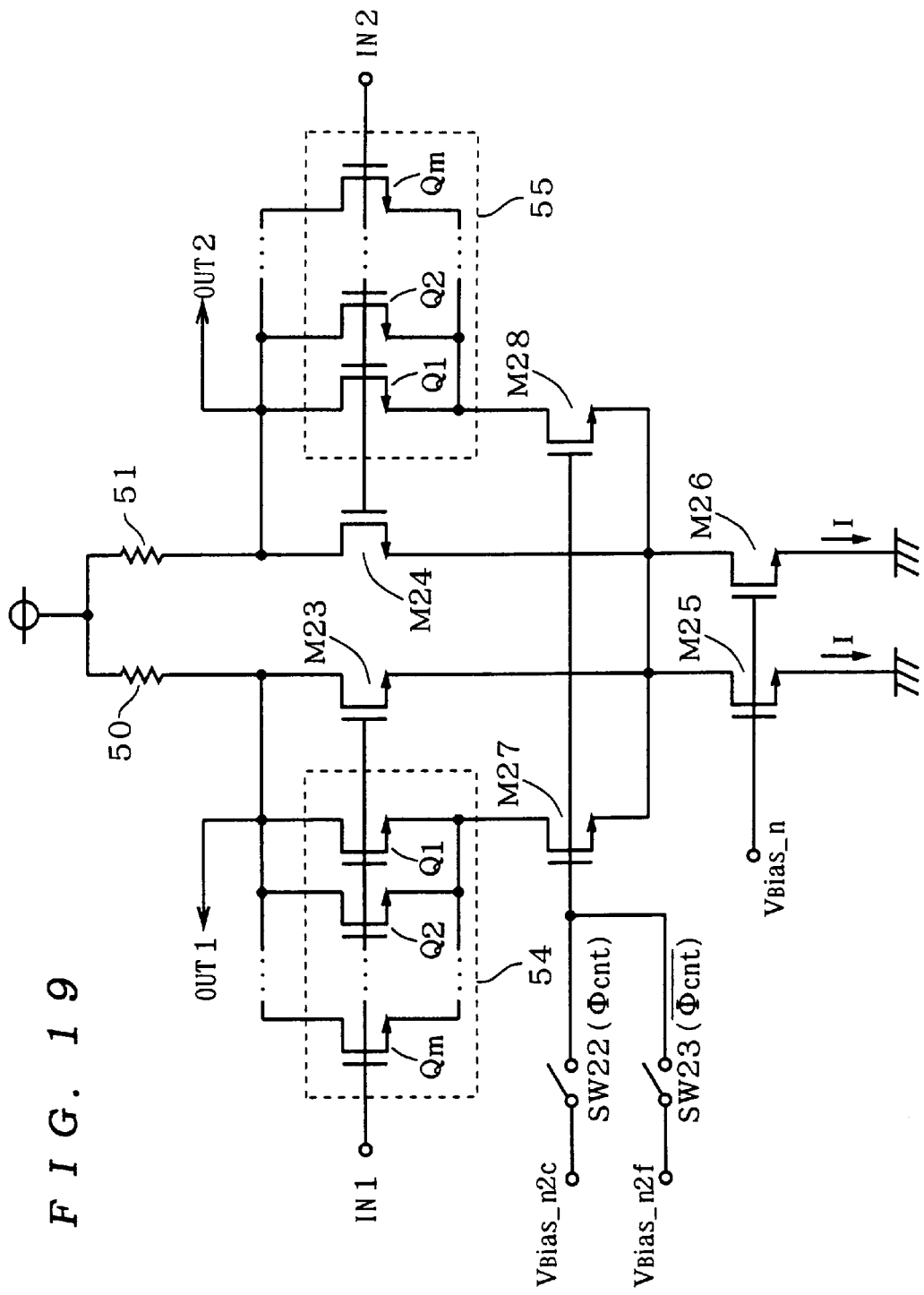
FIG. 19 is a circuit diagram of a structure of a pre-amplifier according to an eleventh preferred embodiment.

An eleventh preferred embodiment is directed to one gain-variable pre-amplifier used in the gain-variable pre-amplifier group 11 (or 21) in the A/D converter of the first preferred embodiment. FIG. 19 is a circuit diagram of a structure of one gain-variable pre-amplifier according to the eleventh preferred embodiment.

As shown in FIG. 19, a transistor group 54 consisting of NMOS transistors Q1 to Qm (m≧1) is provided corresponding to an NMOS transistor 23. The NMOS transistors Q1 to Qm constituting the transistor group 54 receive a common input voltage IN1 at their gates, and are commonly connected at their drains to a drain of the NMOS transistor M23 and at their sources to a drain of an NMOS transistor M27.

A transistor group 55 consisting of NMOS transistors Q1 to Qm (k≧1) is provided corresponding to an NMOS transistor 24, like the transistor group 54. The NMOS transistors Q1 to Qm constituting the transistor group 55 receive a common input voltage IN2 at their gates, and are commonly connected at their drains to a drain of the NMOS transistor M24 and at their sources to a drain of an NMOS transistor M28.

At their gates, the NMOS transistors M27 and M28 receive a common bias voltage VBias__n2c via a switch SW22, and a common bias voltage VBias__n2f via a switch SW23. Further, the NMOS transistors M27 and M28 are commonly connected at their sources to drains of NMOS transistors M25 and M26.

Further, the switch SW22 is turned on or off according to a "L"-"H" condition of the clock control signal Φcnt, while the switch SW23 is turned on or off according to a "L"-"H" condition of the reverse clock control signal $\overline{\Phi cnt}$. The other components are the same as those of the tenth preferred embodiment shown in FIG. 18.

In the gain-variable pre-amplifier with such a structure of the eleventh preferred embodiment, the switch SW22 is turned on and the switch SW23 is turned off, in the upper comparison period CC. Thus, a gain G11 is determined by Equation (27) (Equations (28) and (29)):

$$G11 = GM \cdot R11 \quad (27)$$

$$GM = gm + \left[ gm'''' \Big/ \left\{ r' \cdot \left( gm''' + \frac{1}{r'} + \frac{1}{r'''} \right)^{-1} \right\} \right]^{-1} \quad (28)$$

-continued $$RII = \left[\frac{1}{R} + \frac{1}{r} + \left\{r' \cdot r''' \cdot \left(gm''' + \frac{1}{r'} + \frac{1}{r'''}\right)^{-1}\right\}^{-1}\right]^{-1} \quad (29)$$

where gm is mutual conductance of the NMOS transistors M23 and M24; r is a resistance value between the drains and the sources of the NMOS transistors M23 and M24; gm''' is a combined mutual conductance of the NMOS transistors Q1 to Qm in the transistor groups 54 and 55; r''' is a combined resistance value between the drains and the sources of the transistor groups 54 and 55; r' is a resistance value between drains and sources of the NMOS transistors M27 and M28; and the circuit in FIG. 18 is regarded as an AC equivalent circuit, Therefore, in the upper and the lower comparison periods CC and FC shown in the timing chart in FIG. 3, the gain of the gain-variable pre-amplifier is appropriately adjustable with the resistance value r', by adjusting the bias voltages VBias_n2c and VBias_n2f.

Further, a common-mode output voltage Ccmn4 of the gain-variable pre-amplifier of the eleventh preferred embodiment is expressed by Equation (26) described above, which is the same in the upper and the lower comparison periods because the amount of constant current I supplied by the NMOS transistors M25 and M26 is unchanged in those periods.

Since requiring only one differential amplifier to adjust its gain, the gain-variable pre-amplifier with such a structure of the eleventh preferred embodiment can reduce the number of element circuits. Further, since the common-mode output voltage is almost unchanged even with the change in gain, the gain-variable pre-amplifier achieves downsizing of the A/D converter as a whole and low power consumption without reducing flexibility in circuit design.

While the invention has been described in detail, the foregoing description is in all aspects illustrative and not restrictive. It is understood that numerous other modifications and variations can be devised without departing from the scope of the invention.

We claim:

1. An A/D converter for converting an analog input voltage into digital form to output a digital output voltage, comprising:
    a first amplifier portion receiving and amplifying said analog input voltage and a plurality of reference voltages;
    an input-voltage conversion portion receiving said analog input voltage and said plurality of reference voltages which are amplified in said first amplifier portion, and converting said analog input voltage on the basis of said plurality of reference voltages to output a plurality of conversion voltages;
    a least-significant-bit data output portion outputting a first partial digital output voltage having a first bit count on the basis of a comparison result between each of said plurality of conversion voltages and a fixed value;
    a second amplifier portion receiving and amplifying said analog input voltage and a predetermined number of reference voltages extracted from said plurality of reference voltages; and
    a most-significant-bit data output portion outputting a second partial digital output voltage having a second bit count on the basis of a comparison result between each of said predetermined number of reference voltages and said analog input voltage which are amplified in said second amplifier portion,
    wherein said digital output voltage consists of said second partial digital output voltage as an most-significant-bit group, and said first partial digital output voltage as a least-significant-bit group; and
    wherein each of said first and said second amplifier portions has an amplification factor that varies according to a control signal.

2. The A/D converter according to claim 1,
    wherein said first amplifier portion includes a plurality of first differential amplifiers each receiving at its first input end a target voltage out of said analog input voltage and said plurality of reference voltages as a first differential input voltage, receiving at its second input end a fixed voltage, and outputting a voltage obtained by amplifying said first differential input voltage, from its first or second output end; and
    wherein said second amplifier portion includes a plurality of second differential amplifiers each receiving at its first input end a target voltage out of said analog input voltage and said predetermined number of reference voltages as a second differential input voltage, receiving at its second input end a fixed voltage, and outputting a voltage obtained by amplifying said second differential input voltage, from its first or second output end,
    each of said plurality of first and second differential amplifiers comprising:
        a first resistance component with its one end connected to a first power supply and its other end being said first output end, for supplying a first load current from said first power supply to said first output end;
        a second resistance component with its one end connected to said first power supply and its other end being said second output end, for supplying a second load current from said first power supply to said second output end,
        a first output control transistor with its first electrode connected to said first output end, and its control electrode being said first input end,
        a second output control transistor with its first electrode connected to said second output end, and its control electrode being said second input end,
        a constant-current supply portion connected at its one end to second electrodes of said first and second output control transistors and at its other end to a second power supply, for supplying a constant current to said second power supply, and
        a switch portion whose conducting state varies according to said control signal, by which various kinds of circuit configurations each having a different amplification factor are achieved.

3. The A/D converter according to claim 1, wherein said input-voltage conversion portion comprises:
    a reference-conversion-voltage output portion converting said analog input voltage on the basis of said plurality of reference voltages to output a predetermined number of reference conversion voltages; and
    an intermediate-voltage generating portion interpolating voltages between said predetermined number of reference conversion voltages, and generating intermediate voltages in predetermined multiples for each of said reference conversion voltages to output said plurality of conversion voltages.

4. The A/D converter according to claim 3, wherein said first amplifier portion includes a plurality of first differential amplifiers each receiving at its first input end a target voltage out of said analog input voltage and said plurality of reference voltages as a first differential input voltage, receiving at its second input end a fixed voltage, and outputting a voltage obtained by amplifying said first differential input voltage, from its first or second output end; and said second amplifier portion includes a plurality of second differential amplifiers each receiving at its first input end a target voltage out of said analog input voltage and said predetermined number of reference voltages as a second differential input voltage, receiving at its second input end a fixed voltage, and outputting a voltage obtained by amplifying said second differential input voltage, from its first or second output end, each of said plurality of first and second differential amplifiers comprising:
- a first resistance component with its one end connected to a first power supply and its other end being said first output end, for supplying a first load current from said first power supply to said first output end;
- a second resistance component with its one end connected to said first power supply and its other end being said second output end, for supplying a second load current from said first power supply to said second output end,
- a first output control transistor with its first electrode connected to said first output end, and its control electrode being said first input end,
- a second output control transistor with its first electrode connected to said second output end, and its control electrode being said second input end,
- a constant-current supply portion connected at its one end to second electrodes of said first and said second output control transistors and at its other end to a second power supply, for supplying a constant current to said second power supply, and
- a switch portion whose conducting state varies according to said control signal, by which various kinds of circuit configurations each having a different amplification factor are achieved.

5. The A/D converter according to claim 4, wherein said switch portion includes a resistance-value selecting switch whose conducting state is controlled by said control signal, said switch portion differently setting respective resistance values of said first and said second resistance components according to its conducting state.

6. The A/D converter according to claim 5, wherein said first resistance component includes first and second partial resistance components provided in series between said first power supply and said first output end;

said second resistance component includes third and fourth partial resistance components provided in series between said first power supply and said second output end; and said resistance-value selecting switch includes a switch inserted between a node between said first and said second partial resistance components and a node between said third and said fourth partial resistance components, said switch turned on or off according to said control signal.

7. The A/D converter according to claim 5, wherein said first resistance component includes first and second partial resistance components provided in series between said first power supply and said first output end;

said second resistance component includes third and fourth partial resistance components provided in series between said first power supply and said second output end; and said resistance-value selecting switch includes a first partial switch provided corresponding to said second partial resistance component, and a second partial switch provided corresponding to said fourth partial resistance component, said first and second partial switch being turned on or off at the same time according to said control signal and setting said second and said fourth partial resistance components at different resistance values, respectively, according to their ON-OFF state.

8. The A/D converter according to claim 5, wherein said first resistance component includes first and second partial resistance components provided in series between said first power supply and said first output end;

said second resistance component includes third and fourth partial resistance components provided in series between said first power supply and said second output end; and said resistance-value selecting switch includes first and second partial switches provided commonly for said first and said third partial resistance components, either one of said first and said second partial switches being turned on and the other being turned off on the basis of said control signal, and said first and said second partial switches setting said first and said third partial resistance components at different resistance values, respectively, according to their ON-OFF state.

9. The A/D converter according to claim 4, further comprising:
a transistor-connection resistance component inserted between said second electrodes of said first and said second output control transistors, wherein said switch portion whose conducting state is controlled by said control signal, includes a switch differently setting said transistor-connection resistance component according to its conducting state.

10. The A/D converter according to claim 9, wherein said transistor-connection resistance component and said switch portion are integrally formed; and said transistor-connection resistance component and said switch portion include a transistor for transistor-connection resistance connected at its first electrode to said second electrode of said first output control transistor and at its second electrode to said second electrode of said second output control transistor and receiving said control signal at its control electrode, the on-state resistance value of said transistor varying according to said control signal.

11. The A/D converter according to claim 9, wherein said transistor-connection resistance component includes first and second partial transistor-connection resistance components each having a different resistance value; and said switch portion includes first and second partial switches each indicating validity or invalidity of said first and said second partial transistor-connection resistance components according to its ON-OFF state, either one of said first and said second partial switches being turned on and the other being turned off on the basis of said control signal.

12. The A/D converter according to claim 4, wherein
said switch portion includes a constant-current selecting switch whose conducting state is controlled by a control signal, said constant-current selecting switch differently setting the amount of said constant current to be supplied from said constant-current supply portion according to its conducting state.

13. The A/D converter according to claim 12, wherein
said constant-current supply portion includes a first partial constant-current supply portion supplying said constant current in a first current amount when selected, and a second partial constant-current supply portion supplying said constant current in a second current amount different from said first current amount when selected; and
said switch portion includes first and second partial switches each determining selection or non-selection of said first and said second partial-constant-current supply portions according to its ON-OFF state, either one of said first and said second partial switches being turned on and the other being turned off on the basis of said control signal.

14. The A/D converter according to claim 12, wherein
said first resistance component includes a common partial resistance component and a first partial resistance component provided in series between said first power supply and said first output end;
said second resistance component includes said common resistance component and a second partial resistance component provide in series between said first power supply and said second output end, said common partial resistance component having a larger resistance value than those of said first and said second partial resistance components;
said constant-current supply portion includes a first partial constant-current supply portion supplying a current to said second power supply in a first current amount, and a second partial constant-current supply portion supplying a current to said second power supply in a second current amount, said first partial constant-current supply portion being directly connected at its one end to said second electrodes of said first and said second output control transistors; and
said switch portion includes a first partial switch provided between said second electrodes of said first and second output control transistors and one end of said second partial constant-current supply portion, a second partial switch provided between a node between said common partial resistance component and said first and said second partial resistance components, and one end of said second partial constant-current supply portion, either one of said first and said second switches being turned on and the other being turned off on the basis of said control signal.

15. The A/D converter according to claim 12, wherein
said switch portion includes first and second partial switches provided corresponding to said constant-current supply portion,
said first partial switch determining in its ON state that the amount of said constant current from said constant-current supply portion be a first current amount,
said second partial switch determining in its ON state that the amount of said constant current from said constant-current supply portion be a second current amount, and
either one of said first and said second partial switches being turned on and the other being turned off on the basis of said control signal.

16. The A/D converter according to claim 4, further comprising:
a first auxiliary transistor connected in parallel with said first output control transistor; and
a second auxiliary transistor connected in parallel with said second output control transistor,
wherein said switch portion includes a first partial switch controlling connections or non-connections between a control electrode of said first auxiliary transistor and said first input end and between a control electrode of said second auxiliary transistor and said second input end according to its ON-OFF state, and a second partial switch controlling connections or non-connections between each control electrode of said first and said second auxiliary transistors and a fixed control voltage according to its ON-OFF state, said fixed control voltage including a voltage to turn off said first and said second auxiliary transistors with its application, and either one of said first and said second partial switches being turned on and the other being turned off on the basis of said control signal.

17. The A/D converter according to claim 4, further comprising:
a first auxiliary transistor connected at its first electrode to said first output end and at its control electrode to said first input end;
a second auxiliary transistor connected at its first electrode to said second output end and at its control electrode to said second input end;
a first parallel-connection resistance component connected at its one end to a second electrode of said first auxiliary transistor and at its other end to said second electrode of said first output control transistor; and
a second parallel-connection resistance component connected at its one end to a second electrode of said second auxiliary transistor and at its other end to said second electrode of said second output control transistor,
wherein said switch portion includes first and second partial switches provided commonly for said first and said second parallel-connection resistance components,
said first partial switch determining in its ON state that each resistance value of said first and said second parallel-connection resistance component be a first resistance value,
said second partial switch determining in its ON state that each resistance value of said first and said second parallel-connection resistance component be a second resistance value, and
either one of said first and second partial switches being turned on and the other being turned off on the basis of said control signal.

18. An A/D conversion circuit for converting an external analog input signal inputted from the outside into digital form to output an external digital output voltage to the outside,
said A/D conversion circuit comprising:
a reference-voltage supply portion outputting a first number of reference voltages selected at first voltage intervals in a first period, and in a second period, supplying a second number of reference voltages selected at second voltage intervals shorter than said first voltage intervals, on the basis of an A/D-conversion control signal;
a sub-A/D converter converting said first number of reference voltages from analog to digital in said first period to output an upper partial digital output voltage as well as to output said A/D-conversion control signal related to a A/D-conversion result, and converting said second number of reference voltages from analog to digital in said second period to output a lower partial digital output voltage; and a digital-output-voltage output portion combining said upper and said lower partial digital output voltages to output said external digital output voltage, said sub-A/D converter comprising:

a first amplifier portion receiving and amplifying said analog input voltage and a plurality of reference voltages;

an input-voltage conversion portion receiving said analog input voltage and said plurality of reference voltages which are amplified in said first amplifier portion, and converting said analog input signal on the basis of said plurality of reference voltages to output a plurality of conversion voltages;

a least-significant-bit data output portion outputting a first partial digital output voltage having a first bit count on the basis of a comparison result between each of said plurality of conversion voltages and a fixed value;

a second amplifier portion receiving and amplifying said analog input voltage and a predetermined number of reference voltages extracted from said plurality of reference voltages; and a most-significant-bit data output portion outputting a second partial digital output voltage having a second bit count on the basis of a comparison result between said analog input voltage and each of said predetermined number of reference voltages which are amplified in said second amplifier portion, wherein said digital output voltage consists of said second partial digital output voltage as a most-significant-bit group and said first partial digital output voltage as a least-significant-bit group;

wherein each of said first and said second amplifier portions has an amplification factor that varies according to a control signal;

said sub-A/D converter, in said first period, receiving said external analog input voltage and said first number of reference voltages as said analog input voltage and said plurality of reference voltages, respectively, while setting each amplification factor of said first and said second amplifier portions to be a first amplification factor according to said control signal, and outputting said digital output voltage as said upper partial digital output voltage; and said sub-A/D converter, in said second period, receiving said external analog input voltage and said second number of reference voltages as said analog input voltage and said plurality of reference voltages, respectively, while setting each amplification factor of said first and said second amplifier portions to be a second amplification factor larger than said first amplification factor according to said control signal, and outputting said digital output voltage as said lower partial digital output voltage.

* * * * *